United States Patent
Welland

(10) Patent No.: US 6,483,390 B2
(45) Date of Patent: Nov. 19, 2002

(54) METHOD AND APPARATUS FOR SYNTHESIZING DUAL BAND HIGH-FREQUENCY SIGNALS FOR WIRELESS COMMUNICATIONS

(75) Inventor: David R. Welland, Austin, TX (US)

(73) Assignee: Silicon Laboratories Inc., Austin, TX (US)

( * ) Notice: Subject to any disclaimer, the term of this patent is extended or adjusted under 35 U.S.C. 154(b) by 0 days.

(21) Appl. No.: 09/935,527

(22) Filed: Aug. 23, 2001

(65) Prior Publication Data

US 2002/0008585 A1 Jan. 24, 2002

Related U.S. Application Data

(63) Continuation of application No. 09/087,649, filed on May 29, 1998, now Pat. No. 6,304,146.

(51) Int. Cl.$^7$ ................................................ H03L 7/00
(52) U.S. Cl. .................... 331/36 C; 331/2; 331/179; 331/177 V
(58) Field of Search ................ 331/2, 49, 179, 331/36 C, 177 V; 327/159; 455/260

(56) References Cited

U.S. PATENT DOCUMENTS

| | | | |
|---|---|---|---|
| 3,538,450 A | 11/1970 | Andrea et al. | 331/10 |
| 3,571,743 A | 3/1971 | Menkes | 331/11 |
| 3,899,746 A | * 8/1975 | Gammel | 331/2 |
| 3,983,485 A | 9/1976 | Stuart | 325/30 |
| 4,009,448 A | 2/1977 | Hopwood et al. | 331/4 |
| 4,057,760 A | * 11/1977 | Koch | 331/25 X |
| 4,099,137 A | 7/1978 | Alm, Jr. et al. | 331/16 |
| 4,179,670 A | 12/1979 | Kingsbury | 331/10 |
| 4,204,174 A | 5/1980 | King | 331/10 |
| 4,205,272 A | 5/1980 | Kumagai | 455/83 |
| 4,255,714 A | 3/1981 | Rosen | 329/103 |

(List continued on next page.)

FOREIGN PATENT DOCUMENTS

| | | | |
|---|---|---|---|
| JP | 357058403 A3 | 4/1982 | 331/1 R |
| JP | 359127408 A | 7/1984 | H03C/3/22 |
| JP | 302298107 A | 12/1990 | 331/107 R |
| JP | 403070202 A | 3/1991 | 331/155 |
| JP | 403258103 A | 11/1991 | 331/155 |
| JP | 04035302 A | 2/1992 | H03B/5/20 |

OTHER PUBLICATIONS

Cong, et al., "*Multigigahertz CMOS Dual–Modulus Prescalar IC*" IEEE Journal of Solid–State Circuits, vol. 23, No. 5; pp. 1189–1194; (Oct. 1988).

Duncan, et al., "*A 1 GHz Quadrature Sinusoidal Oscillator*," IEEE 1995 Custom Integrated Circuits Conference; pp. 91–94; (1995).

Primary Examiner—Arnold Kinkead
(74) Attorney, Agent, or Firm—O'Keefe, Egan & Peterman, LLP

(57) ABSTRACT

A method and apparatus for synthesizing high-frequency signals is disclosed that overcomes integration problem associated with prior implementations while meeting demanding phase noise and other impurity requirements. In one embodiment, a phase-locked loop (PLL) frequency synthesizer is disclosed having a voltage controlled oscillator (VCO) with a variable capacitance that includes a discretely variable capacitance in conjunction with a continuously variable capacitance. The discretely variable capacitance may provide coarse tuning adjustment of the variable capacitance, and the continuously variable capacitance may provide a fine tuning adjustment of the variable capacitance. In a further detail, wireless communication frequency synthesizer for generating multiple band high-frequency signals is disclosed having a first VCO selectable for a first frequency band and a second VCO selectable for a second frequency band.

20 Claims, 32 Drawing Sheets

U.S. PATENT DOCUMENTS

| | | | |
|---|---|---|---|
| 4,484,153 A | 11/1984 | Borras et al. | 331/10 |
| 4,602,220 A | 7/1986 | Kurihara | 331/19 |
| 4,623,926 A | 11/1986 | Sakamoto | 358/188 |
| 4,686,488 A | 8/1987 | Attenborough | 331/2 |
| 4,713,631 A | 12/1987 | Enderby et al. | 331/15 |
| 4,758,802 A | 7/1988 | Jackson | 331/10 |
| 4,800,432 A | 1/1989 | Barnett et al. | 358/160 |
| 4,805,198 A | 2/1989 | Stern et al. | 375/118 |
| 4,888,560 A | 12/1989 | Ogura | 330/254 |
| 4,888,564 A | 12/1989 | Ishigaki | 331/1 |
| 4,893,087 A | 1/1990 | Davis | 328/14 |
| 4,905,306 A | 2/1990 | Anderson | 455/191 |
| 4,926,140 A | 5/1990 | Schenberg | 331/1 A |
| 4,926,144 A | 5/1990 | Bell | 332/124 |
| 4,980,653 A | 12/1990 | Shepherd | 331/15 |
| 4,998,077 A | 3/1991 | Nanni et al. | 331/99 |
| 5,006,819 A | 4/1991 | Buchan | 331/1 |
| 5,034,703 A | 7/1991 | Schumacher | 331/2 |
| 5,036,295 A | 7/1991 | Kamitani | 331/10 |
| 5,038,117 A | 8/1991 | Miller | 331/16 |
| 5,055,802 A | 10/1991 | Hietala et al. | 331/16 |
| 5,079,521 A | 1/1992 | Gaskell et al. | 331/1 |
| 5,117,206 A | 5/1992 | Imamura | 331/158 |
| 5,157,358 A | 10/1992 | Benson | 332/100 |
| 5,175,884 A | 12/1992 | Suarez | 455/260 |
| 5,224,132 A | 6/1993 | Goldberg | 377/48 |
| 5,258,720 A | 11/1993 | Tanis et al. | 328/133 |
| 5,258,724 A | 11/1993 | Tanis et al. | 331/1 A |
| 5,281,927 A | 1/1994 | Parker | 331/1 A |
| 5,315,269 A | 5/1994 | Fujii | 331/1 |
| 5,351,014 A | 9/1994 | Ichiyoshi | 331/1 A |
| 5,369,376 A | 11/1994 | Leblebicioglu | 331/8 |
| 5,379,003 A | 1/1995 | Bizen | 331/117 |
| 5,418,497 A | 5/1995 | Martin | 331/48 |
| 5,446,767 A | 8/1995 | Nakagawa et al. | 375/376 |
| 5,495,205 A | 2/1996 | Parker et al. | 331/1 |
| 5,517,534 A | 5/1996 | Knierim | 375/371 |
| 5,534,825 A | 7/1996 | Goma et al. | 331/117 |
| 5,539,359 A | 7/1996 | Goma | 331/117 |
| 5,561,398 A | 10/1996 | Rasmussen | 331/36 |
| 5,576,667 A | 11/1996 | Goma | 331/117 |
| 5,581,584 A | 12/1996 | Inoue et al. | 375/376 |
| 5,619,148 A | 4/1997 | Guo | 327/3 |
| 5,625,325 A | 4/1997 | Rotzoll et al. | 331/16 |
| 5,644,270 A | 7/1997 | Moyer et al. | 331/34 |
| 5,648,744 A | 7/1997 | Prakash et al. | 331/11 |
| 5,661,269 A | 8/1997 | Fukazaki et al. | 178/18 |
| 5,686,864 A | 11/1997 | Martin et al. | 331/1 |
| 5,691,669 A | 11/1997 | Tsai et al. | 331/17 |
| 5,698,469 A | 12/1997 | Mohwinkel et al. | 437/205 |
| 5,705,955 A | 1/1998 | Freeburg et al. | 331/14 |
| 5,739,730 A | 4/1998 | Rotzoll | 331/177 |
| 5,740,524 A | 4/1998 | Pace et al. | 455/232.1 |
| 5,748,043 A | 5/1998 | Koslov | 331/1 A |
| 5,758,276 A | 5/1998 | Shirakawa et al. | 455/314 |
| 5,808,531 A | 9/1998 | Nakano | 334/15 |
| 5,831,482 A | 11/1998 | Salvi et al. | 331/1 R |
| 5,844,868 A | 12/1998 | Takahashi et al. | 369/6 |
| 5,852,384 A | 12/1998 | Sakakura et al. | 331/48 |
| 5,856,763 A | 1/1999 | Reeser et al. | 331/49 |
| 5,867,069 A | 2/1999 | Kiser | 331/96 |
| 5,898,345 A | 4/1999 | Namura et al. | 331/177 V |
| 5,909,150 A | 6/1999 | Kosteinik et al. | 331/34 |
| 5,936,474 A | 8/1999 | Rousselin | 331/34 |
| 5,949,291 A | 9/1999 | Newland | 331/18 |
| 5,963,100 A | 10/1999 | Tolson et al. | 331/17 |
| 6,016,332 A | 1/2000 | Smith et al. | 375/376 |
| 6,028,488 A | 2/2000 | Landman et al. | 331/1 |
| 6,130,577 A | 10/2000 | Tamba et al. | 329/304 |
| 6,137,372 A | 10/2000 | Welland | 331/117 |
| 6,147,567 A | 11/2000 | Welland et al. | 331/179 |
| 6,150,891 A | 11/2000 | Welland et al. | 331/25 |

OTHER PUBLICATIONS

Craninckx, et al., "A 1.8–GHz CMOS Los–Phase–Noise Voltage–Controlled Oscillator with Prescaler," IEEE Journal of Solid–State Circuits, vol. 30, No. 12; pp. 1474–1482; (Dec. 1995).

Chang, et al., "A 1.2 GHz CMOS Dual–Modulus Prescaler Using New Dynamic D–Type Flip–Flops," IEEE Journal of Solid–State Circuits, vol. 31, No. 5; pp. 749–752; (May 1996).

Rudell, et al., "Second Generation Multi–Standard Monolithic CMOS RF Transceiver," University of California, Berkeley, Slides 1 through 9 (Jun. 1996).

Cho, et al., "Multi–Standard Monolithic CMOS RF Transceiver," University of California, Berkeley, Slides 1 through 26 (Jun. 1996).

Craninckx et al., "A 1.75–GHz/3–V Dual–Modulus Divide–by–128/129 Prescaler in 0.7–μm CMOS," IEEE Journal of Solid–State Circuits, vol. 31, No. 7; pp. 890–897; (Jul. 1996).

National Semiconductor Corp,. "LMX2330L/LMX2331L/LMX2332L PLLatinum ™ Low Power Dual Frequency Synthesizer for RF Personal Communications," Datasheet (Feb. 1998).

Kral et al., "RF–CMOS Oscillators with Switched Tuning," Custom IC Conference, Santa Clara, CA, 4 sheets appearing on pp. 555–558 of the proceedings (May 1998).

* cited by examiner

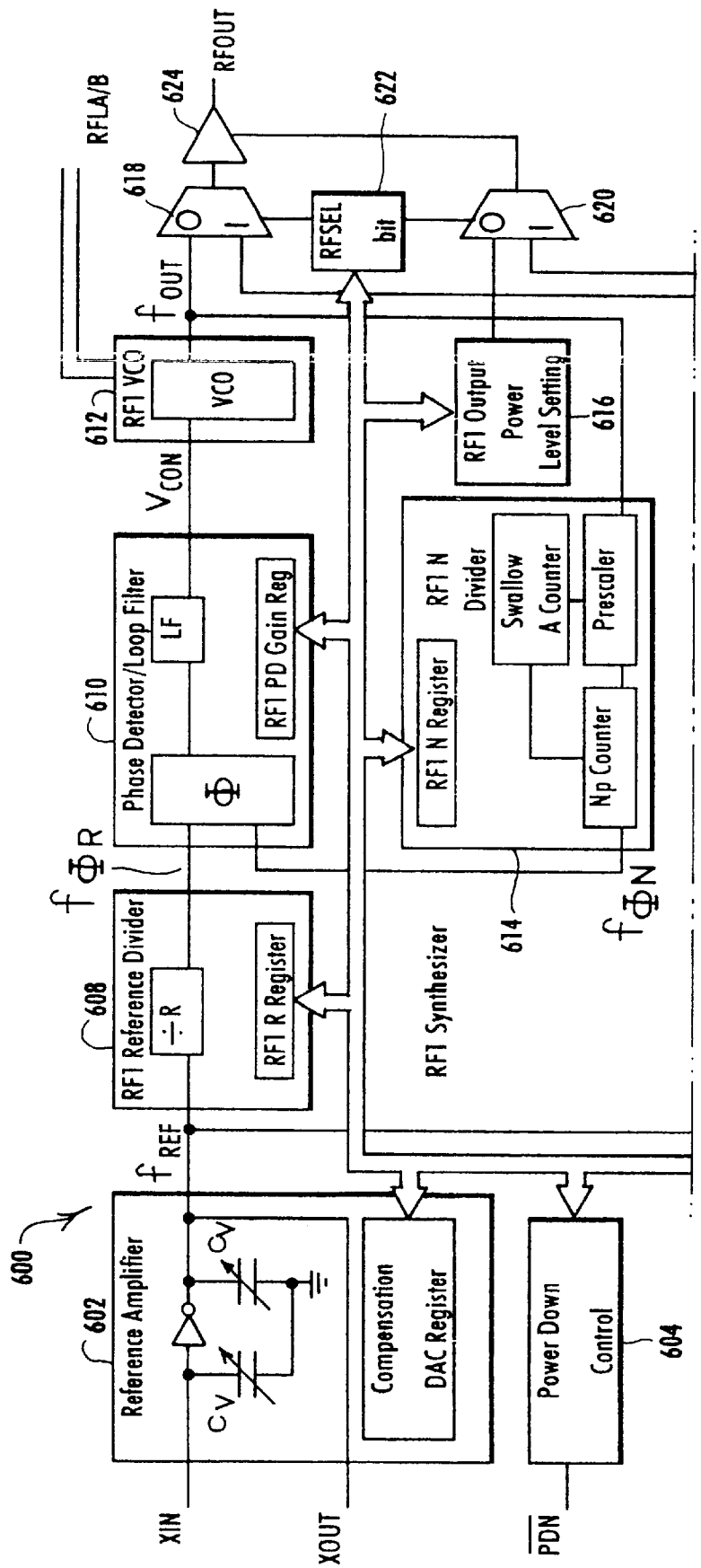
FIG. 6A-A

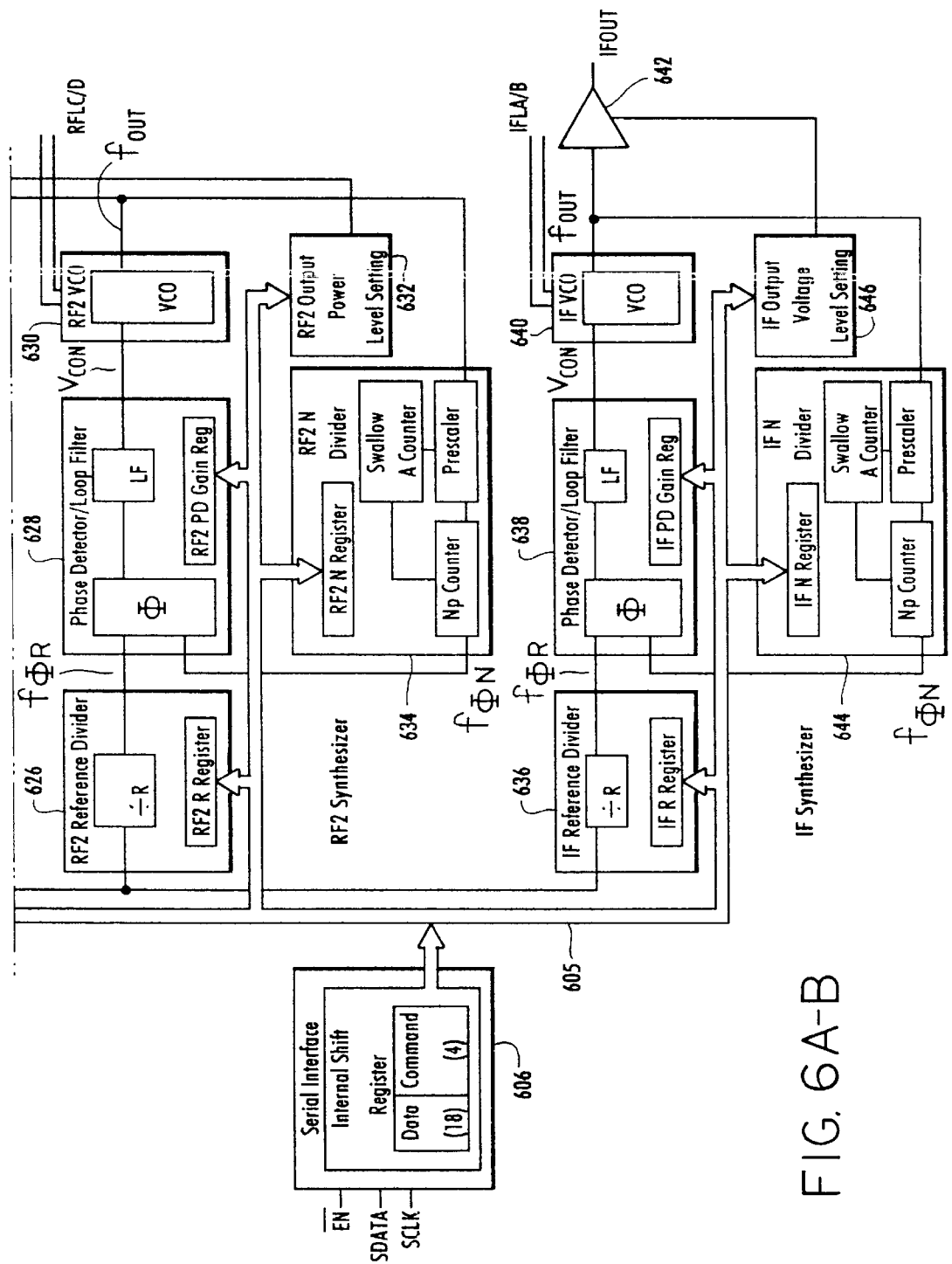
FIG. 6A-B

| FIG. 6B-A |
|---|
| FIG. 6B-B |

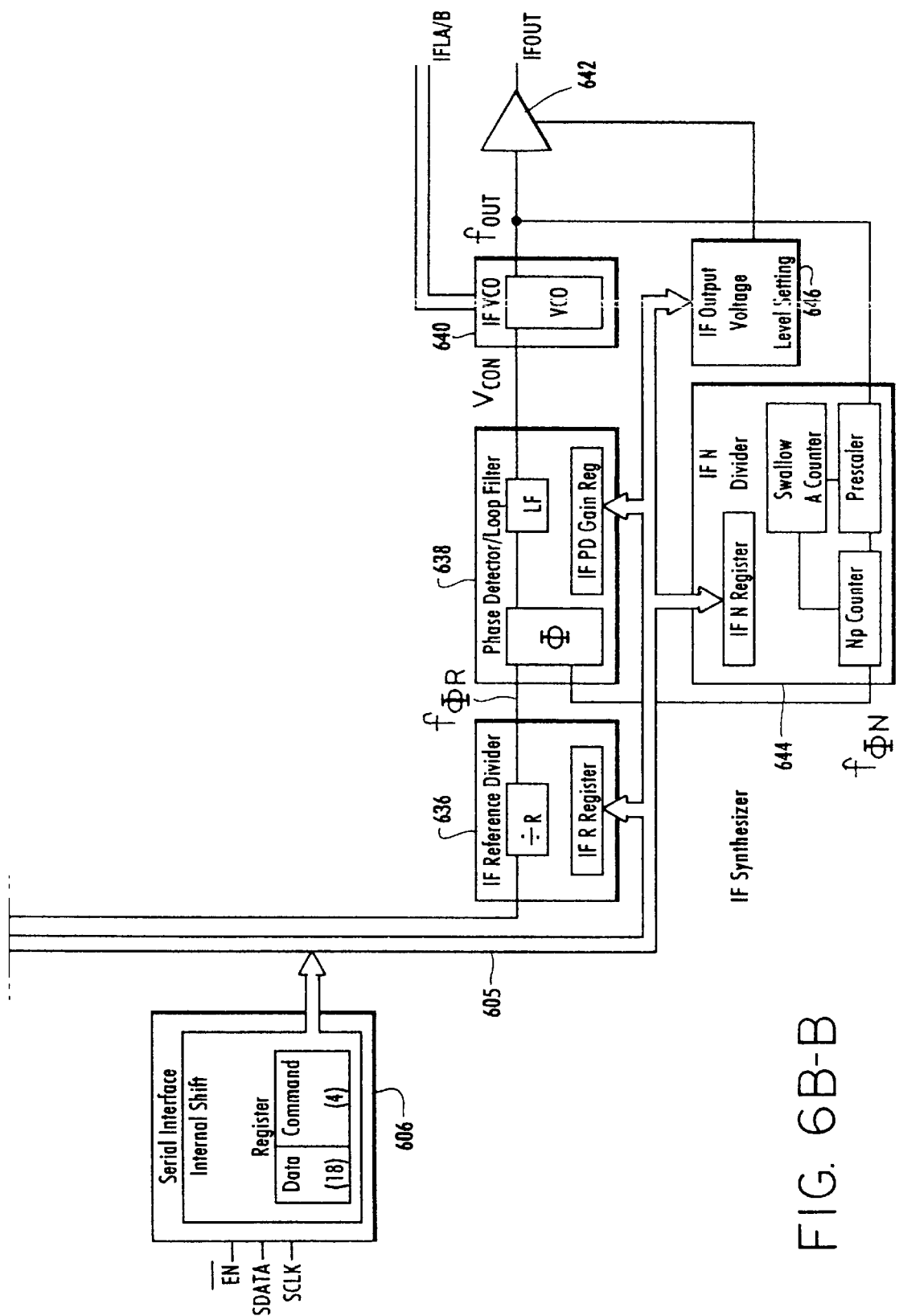
FIG. 6B-B

METHOD AND APPARATUS FOR SYNTHESIZING DUAL BAND HIGH-FREQUENCY SIGNALS FOR WIRELESS COMMUNICATIONS

This application is a continuation of application Ser. No. 09/087,649, filed May 29, 1998 now U.S. Pat. No. 6,304, 146.

TECHNICAL FIELD OF THE INVENTION

The present invention relates generally to the synthesis of high-frequency signals. More particularly, the present invention relates to the synthesis of high-frequency local oscillator signals for wireless communication applications.

BACKGROUND

Wireless communication systems typically require frequency synthesis in both the receive path circuitry and the transmit path circuitry. For example, cellular phone standards in the United States and Europe define a cellular telephone system with communication centered in two frequency bands at about 900 MHz and 1800 MHz. For example, United States cellular phone standards include (1) the AMPS 20 (analog), IS-54 (analog/digital), and IS-95 (analog/digital) standards in the 900 MHz frequency band, and (2) PCS (digital) standards in the 1800 MHz range. European cellular phone standards include (1) the TACS (analog) and GSM (digital) standards in the 900 MHz frequency band, and (2) the DCS1800 (digital) standard in the 1800 MHz range. A dual band cellular phone is capable of operating in both the 900 MHz frequency band and the 1800 MHz frequency band.

Within the frequency bands, the cellular standards define systems in which base station units and mobile units communicate through multiple channels, such as 30 kHz (IS-54) or 200 kHz (GSM) wide channels. For example, with the IS-54 standard, approximately 800 channels are used for transmitting information from the base station to the mobile unit, and another approximately 800 channels are used for transmitting information from the mobile unit to the base station. A frequency band of 869 MHz–894 MHz and a frequency band of 824 MHz–849 MHz are reserved for these channels, respectively. Because the mobile unit must be capable of transmitting and receiving on any of the channels for the standard within which it is operating, a frequency synthesizer must be provided to create accurate frequency signals in increments of the particular channel widths, such as for example 30 kHz increments in the 800–900 MHz region.

Phase-locked loop (PLL) circuits including voltage controlled oscillators (VCOs) are often used in mobile unit applications to produce the desired output frequency ($f_{OUT}$). The output frequency may be made programmable by utilizing an output frequency feedback divider ($\div N$) and a reference divider ($\div R$) for an input reference frequency ($f_{REF}$). The output frequency produced is a function of the values selected for "N" and "R" in the divider circuits, such that $f_{OUT}=N(f_{REF}/R)$. The PLL circuitry typically utilizes a phase detector to monitor phase differences ($\Delta\theta$) between the divided reference frequency ($f_{REF}/R$) and the divided output frequency ($f_{OUT}/N$) to drive a charge pump. The charge pump delivers packets of charge proportional to the phase difference ($\Delta\theta$) to a loop filter. The loop filter outputs a voltage that is connected to the VCO to control its output frequency. The action of this feedback loop attempts to drive the phase difference ($\Delta\theta$) to zero (or at least to a constant value) to provide a stable and programmable output frequency.

The values for the reference frequency and the divider circuits may be chosen depending upon the standard under which the mobile unit is operating. For example, within the United States IS-54 system, a PLL could be built such that $f_{REF}/R=30$ kHz and such that N is on the order of 30,000. The output frequency, therefore, could then be set in 30 kHz increments to frequencies in the 900 MHz frequency band. Similarly, within the European GSM system, a PLL could be built such that $f_{REF}/R=200$ kHz and such that N is on the order of 4,500. The output frequency, therefore, could then be set in 200 kHz increments to frequencies in the 900 MHz frequency band.

The performance of the communication system, however, is critically dependent on the purity of the synthesized high-frequency output signals. For signal reception, impure frequency sources result in mixing of undesired channels into the desired channel signal. For signal transmission, impure frequency sources create interference in neighboring channels. A frequency synthesizer, therefore, must typically meet very stringent requirements for spectral purity. The level of spectral purity required in cellular telephone applications makes the design of a PLL synthesizer solution and, in particular, the design of a to VCO within a PLL synthesizer solution quite demanding.

Three types of spectral impurity will typically occur in VCO circuits that are used in PLL implementations for frequency synthesis: harmonic distortion terms associated with output frequency, spurious tones near the output frequency, and phase noise centered on the output frequency. Generally, harmonic distortion terms are not too troublesome because they occur far from the desired fundamental and their effects may be eliminated in cellular phone circuitry external to the frequency synthesizer. Spurious tones, however, often fall close to the fundamental. In particular, spurious tones at frequencies of $\pm f_{REF}/R$ from the output frequency ($f_{OUT}$) are often found in the output frequency spectrum. These are called reference tones. Spurious tones, including reference tones, may be required by a cellular phone application to be less than about −70 dBc, while harmonic distortion terms may only be required to be less than about −20 dBc. It is noted that the "c" indicates the quantity as measured relative to the power of the "carrier" frequency, which is the output frequency.

Phase noise is undesired energy spread continuously in the vicinity of the output frequency, invariably possessing a higher power density at frequencies closer to the fundamental of the output frequency. Phase noise is often expressed as dBc/√Hz or dBc/Hz. Phase noise is often the most damaging of the three to the spectral purity of the output frequency. Because of the effect phase noise has on system performance, a typical cellular application might require the frequency synthesizer to produce an output frequency having phase noise of less than about −110 dBc/√Hz at 100 kHz from the output frequency.

Because the phase noise specifications are so stringent in cellular phone applications, the VCOs used in cellular phone PLL synthesizer solutions are typically based on some resonant structure. Ceramic resonators and LC tank circuits are common examples. While details in the implementation of LC tank oscillators differ, the general resonant structure includes an inductor (L) connected in parallel with a fixed capacitor (C) and a variable capacitor ($C_x$). In the absence of any losses, energy would slosh between the capacitors and the inductor at a frequency $f_{OUT}=(\frac{1}{2}\pi)[L(C+C_x)]^{-\frac{1}{2}}$. Because energy will be dissipated in any real oscillator, power in the form of a negative conductance source, such as an amplifier, is applied to maintain the oscillation. It is often the case that the series resistance of the inductor is the dominant loss mechanism in an LC tank oscillator, although other losses typically exist.

While it is highly desirable to integrate the VCO with the other components of the PLL onto a single integrated circuit for cost, size, power dissipation, and performance considerations, barriers to integration exist. One of the more significant barriers is the lack of precision in the values of the inductors and capacitors used in the LC tank of the PLL. This tolerance problem typically forces most PLL synthesizer implementations to modify the inductor or capacitor values during production, for example, by laser trimming. Further complicating integration is the difficulty in integrating an inductor with a low series resistance and a capacitor with a reasonably high value and with low loss and low parasitic characteristics. In integrating capacitance values, a significant problem is the high value of a typical loop filter (LF) capacitor component, which is often on the order of 1–10 $\mu$F. Another significant problem is the absence of a variable capacitance ($C_x$) component that possesses a highly-variable voltage-controlled capacitance that is not also a high loss component that causes phase noise. To provide this variable capacitance ($C_x$) component, a high-precision reverse-biased diode or varactor is typically utilized. However, such high-performance varactors require special processing and, therefore, have not been subject to integration with the rest of the PLL circuitry. In short, although integration onto a single integrated circuit of a PLL implementation for synthesizing high-frequency signals is desirable for a commercial cellular phone application, integration has yet to be satisfactorily achieved.

SUMMARY OF THE INVENTION

In accordance with the present invention, a method and apparatus for synthesizing high-frequency signals is disclosed that overcomes the integration problem associated with prior implementations and meets the demanding phase noise and other impurity requirements. The present invention achieves this advantageous result by implementing a phase-locked loop (PLL) frequency synthesizer with a variable capacitance voltage controlled oscillator (VCO) that includes a discretely variable capacitance in conjunction with a continuously variable capacitance. The discretely variable capacitance may provide coarse tuning adjustment of the variable capacitance to compensate for capacitor and inductor tolerances and to adjust the output frequency to be near the desired output frequency. The continuously variable capacitance may provide a fine tuning adjustment of the variable capacitance to focus the output frequency to match precisely the desired output frequency and to provide compensation for post-calibration drift of the PLL circuitry. The present invention avoids the need for a traditional varactor implementation in the VCO, for a traditional large capacitor component in the loop filter, and for component trimming during processing and thereby provides a high-frequency frequency synthesizer that may be fully integrated on a single chip except for an external inductor.

In one embodiment, the present invention is a wireless communication frequency synthesizer for generating dual band high-frequency signals, including a phase locked loop (PLL) having an output frequency dependent upon a voltage controlled oscillator (VCO), a first VCO within the PLL, and a second VCO within the PLL, wherein the first VCO may be selected for a first frequency band and the second VCO may be selected for a second frequency band.

In another embodiment, the present invention is a method of operating a wireless communication frequency synthesizer, comprising providing a phase locked loop (PLL) having an output frequency dependent upon a voltage controlled oscillator (VCO), selecting a first VCO within the PLL for a first frequency band, and selecting a second VCO within the PLL for a second frequency band.

DESCRIPTION OF THE DRAWINGS

It is noted that the appended drawings illustrate only exemplary embodiments of the invention and are, therefore, not to be considered limiting of its scope, for the invention may admit to other equally effective embodiments.

FIG. 6A is a block diagram of an integrated circuit (IC) according to the present invention that may provide frequency synthesis for a dual band mobile phone application.

DETAILED DESCRIPTION OF THE INVENTION

The present invention contemplates a method and apparatus for synthesizing high-frequency signals by implementing a phase-locked loop (PLL) frequency synthesizer with a variable capacitance voltage controlled oscillator (VCO) that includes a discretely variable capacitance in conjunction with a continuously variable capacitance. In particular, the frequencies synthesized by the present invention may be used in receive and transmit path circuitry for wireless communication devices.

Figure 1:
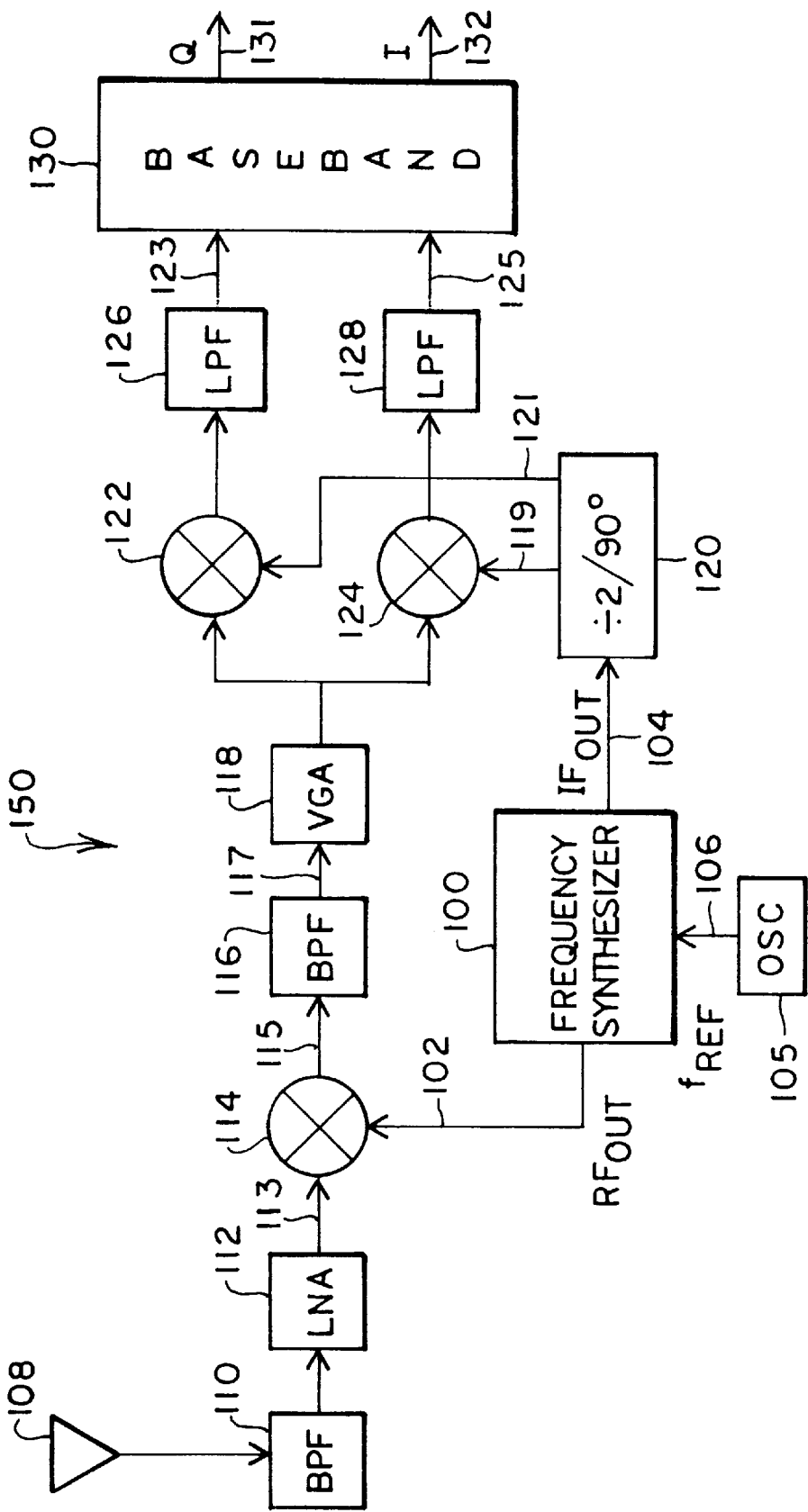
FIG. 1 is a block diagram of receive path circuitry for a wireless communication device, such as a mobile unit in a cellular phone system.

FIG. 1 is a block diagram of receive path circuitry 150 for a wireless communication device, such as a mobile unit in a cellular phone system. An incoming signal is received by the antenna 108, filtered by a band-pass filter 110, and amplified by a low noise amplifier 112. This received signal is typically a radio-frequency (RF) signal, for example a 900 MHz or 1800 MHz signal. This RF signal is usually mixed down to a desired intermediate frequency (IF) before being mixed down to baseband. Using a reference frequency ($f_{REF}$) 106 from a crystal oscillator 105, frequency synthesizer 100 provides an RF mixing signal ($RF_{OUT}$) 102 to mixer 114. Mixer 114 combines this $RF_{OUT}$ signal 102 with the filtered and amplified input signal ($RF_{IN}$) 113 to produce a signal 115 that has two frequency components represented by $|RF_{IN}+RF_{OUT}|$ and $|RF_{IN}-RF_{OUT}|$. The signal at the latter of these two is selected by band-pass filter 116 to provide an IF signal 117. This IF signal 117 is then amplified by variable gain amplifier 118 before being mixed down to baseband by mixers 122 and 124.

Signal processing in mobile phones is typically conducted at baseband using in-phase (I) and quadrature (Q) signals. The Q signal is offset from the I signal by a phase shift of 90 degrees. To provide these two signals, an IF mixing signal ($IF_{OUT}$) 104 and a dual divide-by-two and quadrature shift block ($\div 2/90°$) 120 may be utilized. Frequency synthesizer 100 generates an $IF_{OUT}$ signal 104, for example at about 500 MHz, that is divided by 2 in block 120 to provide $IF_{OUT}/2$ mixing signals 119 and 121. Block 120 delays the signal 121 to mixer 122 by 90 degrees with respect to the signal 119 to mixer 124. Block 120 may be implemented with two flip-flop circuits operating off of opposite edges of the $IF_{OUT}$ signal 104, such that the output of the flip-flops are half the frequency of the $IF_{OUT}$ signal 104, and are 90 degrees offset from each other. The resulting output signals 123 and 125 have two frequency components represented by $|IF+IF_{OUT}/2|$ and $|IF-IF_{OUT}/2|$. The latter frequency component is the desired one and is typically selected such that the baseband signal is centered at DC (f=0 Hz).

Assuming the baseband frequency is centered at DC, the $|IF-IF_{OUT}/2|$ signal is selected using low-pass filters 126 and 128. The resulting baseband signal 123 is the Q signal, and the resulting baseband signal 125 is the I signal. These signals 123 and 125 may be further processed at baseband by processing block 130 and provided to the rest of the mobile phone circuitry as I and Q signals 131 and 132.

Figure 2:
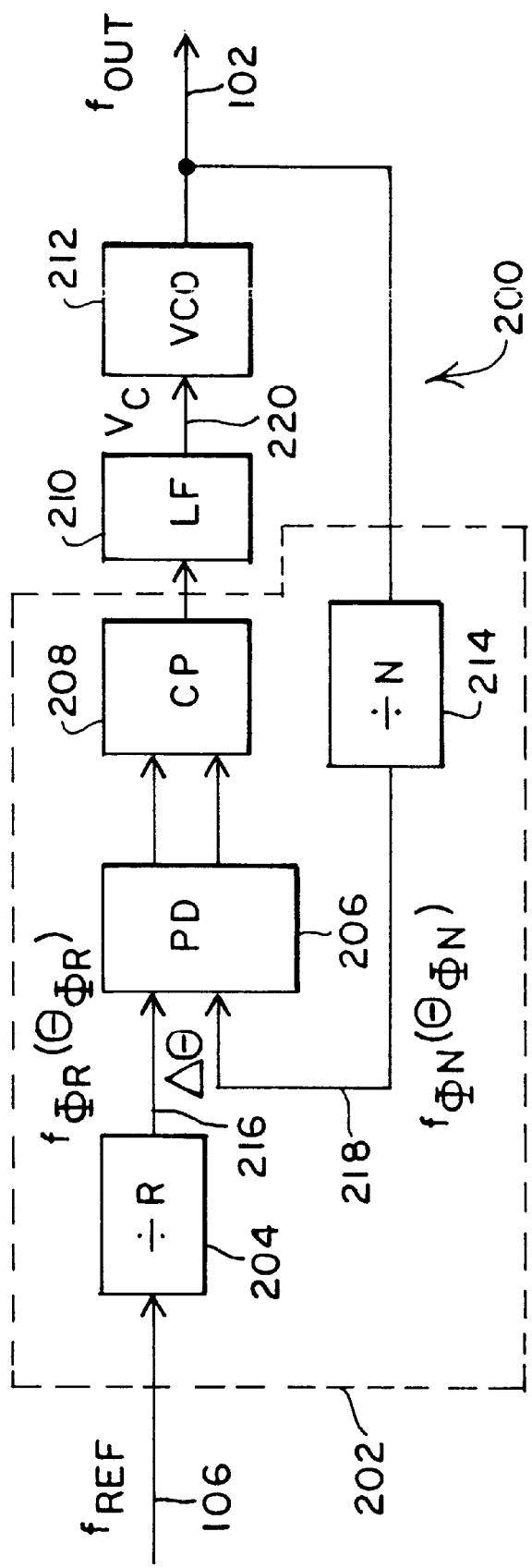
FIG. 2 is a block diagram of phase-locked loop (PLL) circuitry for synthesizing frequencies required by the frequency synthesizer in FIG. 1.

FIG. 2 is a block diagram of phase-locked loop (PLL) circuitry 200 for synthesizing one of the frequencies required by frequency synthesizer 100. A second PLL 200 may be implemented to provide the second frequency. The reference frequency ($f_{REF}$) 106 is received by a divide-by-R ($\div R$) counter 204, and the output frequency ($f_{OUT}$) 102 is received by a divide-by-N ($\div N$) counter 214. The resulting divided signals ($f_{\phi R}$) 216 and ($f_{\phi N}$) 218 are received by a phase detector (PD) 206. The PD 206 determines the phase difference ($\Delta\theta$) between the phase ($\theta_{\phi R}$) of the divided signal 216 and the phase ($\theta_{\phi N}$) of the divided signal 218. The PD 206 uses this phase difference ($\Delta\theta$) to drive a charge pump (CP) 208. The CP 208 provides a voltage output that is filtered by a loop filter 210 to provide a voltage control ($V_C$) signal 220. The $V_C$ signal 220 controls the output frequency ($f_{OUT}$) 102 of a voltage controlled oscillator (VCO) 212. The values for N and R may be selected to provide a desired output frequency such that $f_{OUT}=N(f_{REF}/R)$. For a typical mobile phone application, the $IF_{OUT}$ frequency 104 will remain constant, while the $RF_{OUT}$ frequency 102 will change depending upon the channel of the incoming signal. Thus, a first PLL may be used to provide the $IF_{OUT}$ frequency 104, and its N and R values may be programmed once and then left alone. A second PLL may be used to provide the $RF_{OUT}$ frequency 102, and its N and R values may be selectively programmed to provide the desired $RF_{OUT}$ signal 102. If desired, the R value for this second PLL may be programmed once and left alone, while the N value may be used to select the desired $RF_{OUT}$ signal 102.

The transmit path circuitry (not shown) for a wireless communication device, such as a mobile unit in a cellular phone system, may include circuitry to move the outgoing signal from baseband to an RF transmission frequency. A transmit frequency band for cellular phone systems typically includes the identical number of channels as included within the receive frequency band. The transmit channels, however, are shifted from the receive channels by a fixed frequency amount. In such a system, a cellular phone application may utilize the RF mixing signal ($RF_{OUT}$) 102 synthesized by the frequency synthesizer 100 for a given channel in both the receive path and the transmit path circuitry. For example, if the frequency synthesizer 100 has been designed as part of the receive path circuitry 150, the RF mixing signal ($RF_{OUT}$) 102 for a given channel within the receive frequency band may be shifted by the fixed frequency amount to provide a desired RF mixing signal to the transmit path circuitry. Alternatively, the frequency synthesizer 100 may be designed as part of the transmit path circuitry, or two separate frequency synthesizers 100 may be utilized.

Figure 3:
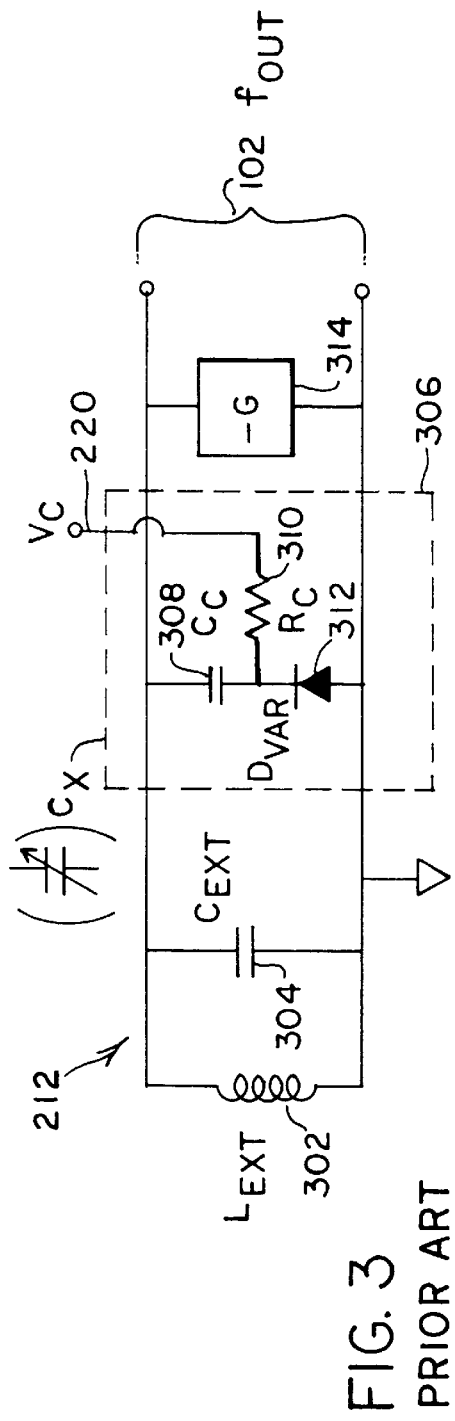
FIG. 3 (Prior Art) is a block diagram of a typical prior art implementation for a LC tank voltage controlled oscillator (VCO) within the PLL depicted in FIG. 2.

FIG. 3 (Prior Art) is a block diagram of a typical prior art implementation for VCO 212 using an LC tank oscillator and varactor 312. As also discussed above, the typical use of a varactor in cellular phone applications has been a major factor in limiting the integration of PLL circuitry 200 into a single chip. Looking to FIG. 3 (Prior Art), an external inductor ($L_{EXT}$) 302 and an external capacitor ($C_{EXT}$) 304 are connected in parallel with a variable capacitance ($C_x$) 306 and a negative conductance source (−G) 314. Because there will be some losses within the VCO, negative conductance source (−G) 314 is provided as an active device that adds back energy lost to sustain oscillation. The variable capacitance ($C_x$) 306 is implemented using a fixed coupling capacitor ($C_C$) 308 connected in series with a varactor ($D_{VAR}$) 312. Varactor ($D_{VAR}$) 312 is a reverse-biased diode that has a capacitance which is continuously variable depending upon the reverse-bias voltage applied at the voltage control node ($V_C$) 220. This node ($V_C$) 220 is connected between the coupling capacitor ($C_C$) 308 and the variable diode ($D_{VAR}$) 312 through a coupling resistor ($R_C$) 310. The value of the coupling resistor ($R_C$) 310 is chosen to be large so that it is effectively an open circuit at high frequencies (i.e., near the frequency of oscillation). The variable capacitance ($C_x$) 306 is the series combination of the coupling capacitor ($C_C$) 308 and the voltage-controlled capacitance of the varactor ($D_{VAR}$) 312. The output oscillation frequency ($f_{OUT}$) 102 is thereby made to be a function of the voltage control node ($V_C$) 220, such that $F_{OUT}=(1/2\pi)[L_{EXT}(C_{EXT}+C_X(V_C))]^{-\frac{1}{2}}$.

As discussed above, it is desirable for the PLL circuitry 200 to be integrated onto a single chip. As also discussed above, however, prior to the present invention, commercial cellular phone applications have been limited to integration of only parts of the circuit portions within the PLL circuitry 200. For example, the dotted line 202 depicted in FIG. 2 represents the portions of the PLL circuitry 200 that have been integrated into a single integrated circuit. The present invention, however, provides a frequency synthesis solution that is capable of full integration while still providing high fidelity high-frequency signals. The present invention is now described in general aspects with respect to FIGS. 4 and 5.

Figure 4:
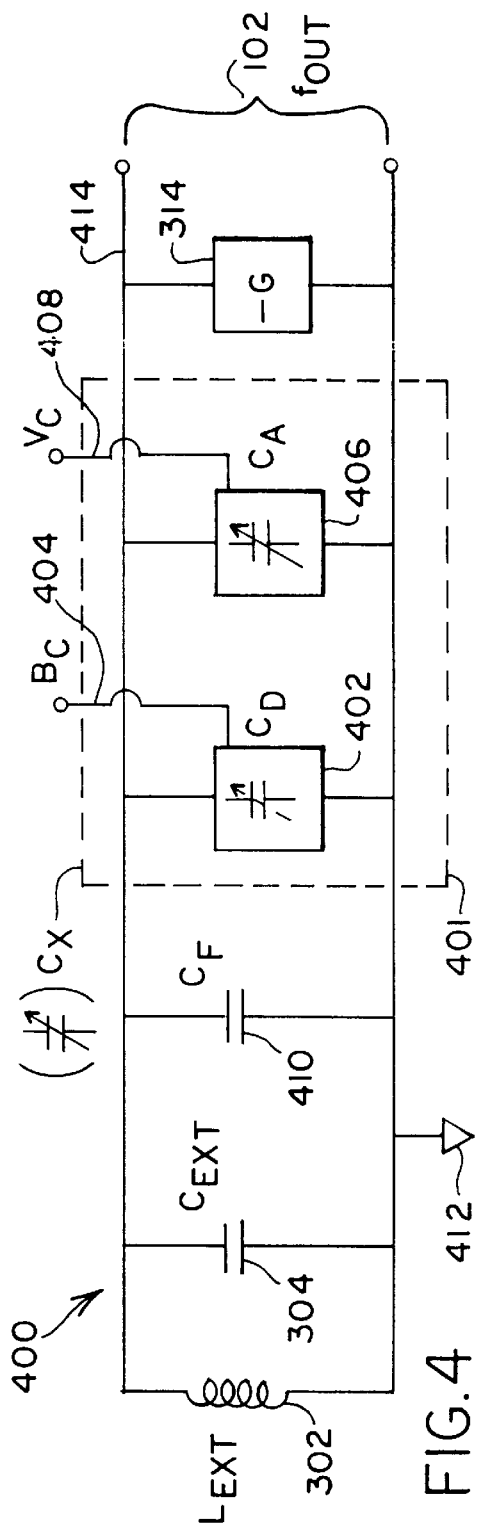
FIG. 4 depicts a general circuit diagram of a digital and analog VCO implementation according to the present invention.

FIG. 4 depicts a general circuit diagram of a VCO 400 according to the present invention that avoids problems associated with prior art designs. The VCO 400 produces an output frequency ($f_{OUT}$) 102 using an LC tank oscillator having an external inductor ($L_{EXT}$) 302. The external capacitor ($C_{EXT}$) 304 represents any desired externally connected capacitance and the parasitic capacitance of the semiconductor device leads. Unlike the prior art, the present invention achieves a variable capacitance ($C_X$) 401 with a discretely variable capacitance ($C_D$) 402 in conjunction with a continuously variable capacitance ($C_A$) 406. The discretely variable capacitance ($C_D$) 402 may be controlled by a digital control word ($B_C$) 404, and the continuously variable capacitance ($C_A$) 406 may be controlled by a voltage control signal ($V_C$) 408. It is noted that the digital control word ($B_C$) 404 and the voltage control signal ($V_C$) 408 may be a single signal or a plurality of signals, as desired, depending upon the implementation for the discretely variable capacitance ($C_D$) 402 and the continuously variable capacitance ($C_A$) 406. A fixed capacitance ($C_F$) 410 represents internal parasitic capacitance along with any desired fixed capacitance connected internally to the integrated circuit. A negative conductance source (−G) 314 is also provided to take care of losses in the VCO 400.

In operation, the discretely variable capacitance ($C_D$) 402 may be used after manufacture to dynamically compensate for any component tolerance problems including all of the internal capacitance values, any external capacitor ($C_{EXT}$) 304, and the external inductor ($L_{EXT}$) 302. In addition, the discretely variable capacitance ($C_D$) 402 may be used to provide coarse tuning of the desired output frequency, thereby reducing the frequency range that must be covered by variations in the capacitance of the continuously variable capacitance ($C_A$) 406. After coarse tuning by the discretely variable capacitance ($C_D$) 402, the continuously variable capacitance ($C_A$) 406 may be used to provide fine tuning of the desired output frequency. This coarse and fine tuning initially calibrates the output frequency ($f_{OUT}$) 102 to the desired output frequency. After the initial calibration, the continuously variable capacitance ($C_A$) 406 may be used to compensate for any post-calibration frequency drift. Such post-calibration frequency drift will typically occur due to a variety of factors, including for example temperature variations. In this way, the present invention allows for the VCO 400 to be manufactured without the trimming requirements of prior implementations and allows a high-frequency PLL frequency synthesizer to be integrated on a single integrated circuit. In particular, the high-frequency PLL frequency synthesizer of the present invention provides an output frequency having phase noise of less than about −110 dBc/√Hz at 100 kHz from the output frequency.

An example will now be provided for the coarse and fine tuning that may be provided by a VCO 400 according to the present invention. As described above, the United States IS-54 standard utilizes on the order of eight hundred 30 kHz wide channels in a frequency band of 869 MHz–894 MHz for transmitting information from a base station to a mobile unit. One receive channel may be for example at 870.03 MHz. Assuming that a cellular phone application has been designed to have an IF frequency of 250 MHz, the RF mixing frequency that must be synthesized by the frequency synthesizer for this channel would need to be 1120.03 MHz. (It is noted that for the 900 MHz frequency band, the RF mixing frequency utilized is typically above the channel frequency, although an RF mixing frequency below the channel frequency may also be used.) The discretely variable capacitance ($C_D$) 402 may be designed to coarsely tune the RF output frequency of the frequency synthesizer to about 0.1% of the desired frequency of 1120.03 MHz or to within about 1 MHz. The continuously variable capacitance ($C_A$) 406 may be designed to provide a frequency range of about 1% of the desired frequency of 1120.03 MHz or a range of about 11 MHz, which is about 10 times the coarse tuning accuracy of the discretely variable capacitance ($C_D$) 402. This frequency range allows the continuously variable capacitance ($C_A$) 406 to finely tune the RF output frequency of the frequency synthesizer to the desired frequency of 1120.03 MHz and to compensate for post-calibration frequency drift. The initial voltage input values for the continuously variable capacitance ($C_A$) 406 may be selected so that the continuously variable capacitance ($C_A$) 406 may move the RF output frequency either up or down by roughly the same amount.

Figure 5:
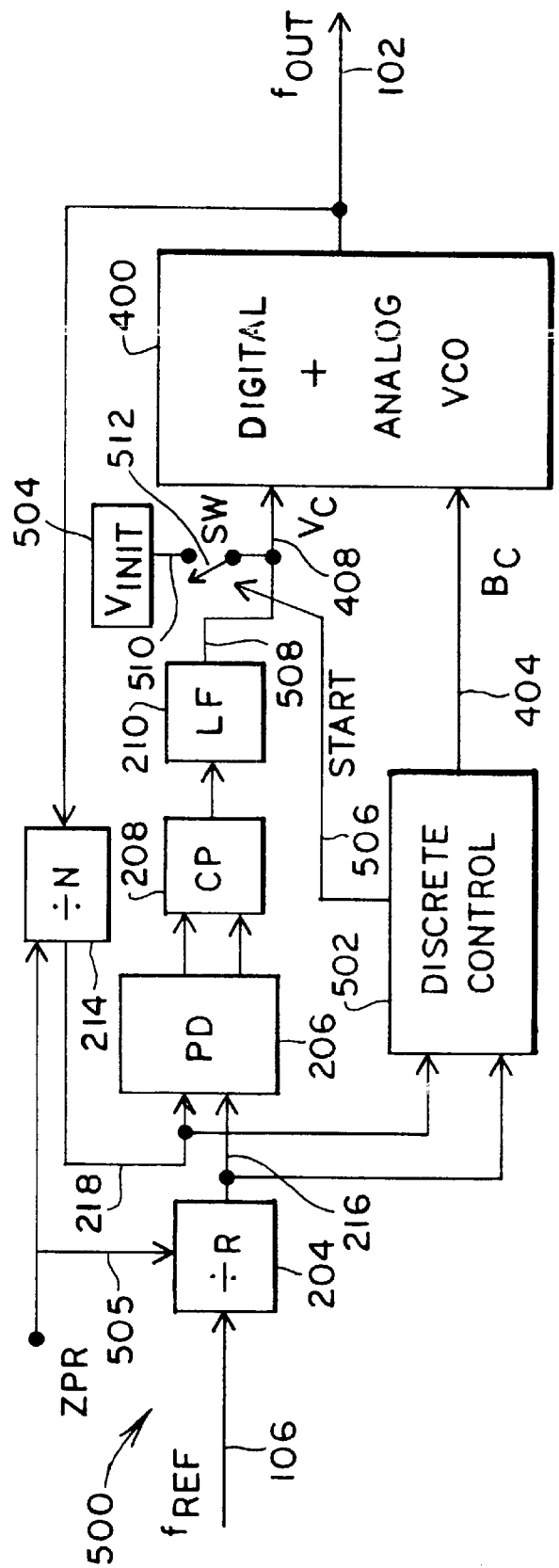
FIG. 5 is a block diagram of a frequency synthesizer that takes advantage of a digital and analog VCO implementation according to the present invention.

FIG. 5 is a block diagram of a frequency synthesizer 500 that takes advantage of a digital and analog VCO 400 according to the present invention. The input reference frequency ($f_{REF}$) 106 is received by the divide-by-R (÷R) counter 204. The output frequency ($f_{OUT}$) 102 is received by the divide-by-N (÷N) counter 214. The discrete control block 502 receives the divided output frequency ($f_{OUT}/N$) 218 and the divided reference frequency ($f_{REF}/R$) 216, and the discrete control block 502 outputs a digital control word ($B_C$) to the digital and analog VCO 400. The phase detector (PD) 206 compares the phase difference between the divided output frequency ($f_{OUT}/N$) 218 and the divided reference frequency ($f_{REF}/R$) 216 and provides signals to the charge pump (CP) 208 that depends upon this phase difference. The output of the charge pump (CP) 208 is filtered by the loop filter (LF) 210 to provide a first control voltage node 508. Initial voltage generator block ($V_{INIT}$) 504 provides a second control voltage node 510. A switch (SW) 512 allows for selection of control voltage node 510 as the voltage node to be provided to the voltage control ($V_C$) input 408 to the digital and analog controlled VCO 400.

When PLL 500 initiates, control of the output frequency ($f_{OUT}$) 102 lies with discrete control block 502. The switch 512 selects the initial voltage node 510 as the voltage control for the voltage control ($V_C$) input 408. The voltage control ($V_C$) is used as the control voltage for the continuously variable capacitance ($C_A$) 406 within the digital and analog controlled VCO 400. In addition to providing a voltage input to the voltage control ($V_C$) input 408, this connection also charges the capacitors within the loop filter (LF) 210 to an initial voltage value. The discrete control block 502 includes digital logic that will determine through a desired procedure how to adjust the discretely variable capacitance ($C_D$) 402 to coarsely tune the output frequency ($f_{OUT}$) 102. This determination may depend for example upon a comparison of the reference frequency ($f_{REF}$) 106 to the output frequency ($f_{OUT}$) 102 or a comparison of the divided reference frequency ($f_{REF}/R$) 216 to the divided output frequency ($f_{OUT}/N$) 218. Depending upon the determination made, the discrete control block 502 may adjust the digital control word ($B_C$) 404. The digital control word ($B_C$) 404 is used to provide control signals to the discretely variable capacitance ($C_D$) 402 within the digital and analog controlled VCO 400.

Once the discrete control block 502 completes its coarse tuning procedure, the discrete control block 502 may fix the digital control word ($B_C$) 404 and then assert the START signal 506 to change switch (SW) 512 so that it deselects the control node 510. At this point, the control voltage node 508 supplies the voltage to the control voltage ($V_C$) node 408. The divide-by-R ($\div$R) and divide-by-N ($\div$N) counters 204 and 214 are reset with the zero-phase restart (ZPR) signal 505. The zero-phase restart (ZPR) signal 505 presets the counters within the divide-by-R ($\div$R) and divide-by-N ($\div$N) counters 204 and 214 so that the initial phase error is as small as possible when the first analog loop becomes operable. From this point, the output frequency ($f_{OUT}$) 102 is fine tuned by the continuously variable capacitance ($C_A$) 406 through operation of phase detector (PD) 206, the charge pump (CP) 208 and the loop filter (LF) 210. If desired, the discrete control 502 may continue to monitor the output frequency ($f_{OUT}$) 102. If too great of an error is detected, discrete control 502 may move the switch (SW) 512 back to select initial control node 510 and again modify the digital control word ($B_C$) 404 based upon a desired procedure.

In the embodiment depicted, therefore, only one control loop, either digital or analog, is tuning the output frequency ($f_{OUT}$) 102 at any given moment. Initially, when the output frequency ($f_{OUT}$) 102 is likely far from the desired frequency, the digital control loop is operable and the output frequency ($f_{OUT}$) 102 is modified by the digital control word ($B_C$) 404 provided by the discrete control block 502. When the discrete control block 502 completes its coarse tuning procedure, the discrete control block 502 may assert the START signal 506, thereby starting the action of the analog loop by setting the switch (SW) 512 to deselect the initial voltage generator block ($V_{INIT}$) 504 and pass control to the voltage control node 508. At this point, the analog loop begins fine tuning the output frequency ($f_{OUT}$) 102 until a stable output frequency is reached. To allow the continuously variable capacitance ($C_A$) 406 within the analog loop to move the output frequency ($f_{OUT}$) 102 either faster or slower in roughly equal amounts, the voltage value provided by the initial voltage generator block ($V_{INIT}$) 504 may be selected to be within the middle of the voltage range that may be provided by the control voltage node 508 from the loop filter (LF) 210. It is also noted that if desired, an embodiment could be implemented in which both the digital and analog control loops are active at the same time.

Further details of the present invention as utilized in a cellular phone application will now be described. In particular, an overall block diagram for a dual band (900 MHz and 1800 MHz) cellular phone application is described with respect to FIGS. 6A and 6B.

FIG. 6A is a block diagram of an integrated circuit (IC) 600 according to the present invention that may provide frequency synthesis for a dual band (e.g., 900 MHz and 1800 MHz) cellular phone application. The IC 600 communicates with external control circuitry through serial interface circuitry 606, which may have for example an enable signal (EN_bar) pin, a serial data input (SDATA) pin, and a serial clock input (SCLK) pin. (It is noted that the suffix "_bar" is used to denote a signal that is typically asserted when at a low logic level.) Serial interface circuitry 606 may also include an internal shift register in which data and command bits may be stored. This register may be for example, a 22-bit shift register that may be serially loaded through the external pin connections. The serial interface circuitry 606 communicates with the rest of the circuitry through internal bus 605.

Other external pin connections for IC 600 may also include a power down control (PDN_bar) pin connected to power down control circuitry 604 and clock input (XIN) and output (XOUT) pins connected to reference amplifier circuitry 602. As depicted, the reference amplifier circuitry 602 may, if desired, include a compensation digital-to-analog converter (DAC) register that controls variable capacitances ($C_V$). In this embodiment, a crystal resonator may be connected between clock input (XIN) and output (XOUT) pins to complete the circuit, and the output of the reference amplifier circuitry 602 is the reference frequency ($f_{REF}$), which is used for synthesizing the desired output frequencies. Alternatively, the clock input (XIN) pin may be directly connected to receive the reference frequency ($f_{REF}$) from an oscillator circuit that has its own compensation circuitry, as depicted in FIG. 1. In this alternative embodiment, the output (XOUT) pin would not need to be used.

The IC 600 provides the RF output frequency and the IF output frequency needed to mix the incoming RF signal to an IF frequency and then to baseband. These frequencies are available through an RF output pin (RFOUT), which is connected to an output buffer 624, and an IF output pin (IFOUT), which is also connected to an output buffer 642. These output frequencies are synthesized by the RF1 synthesizer, the RF2 synthesizer, and the IF synthesizer. To provide a dual band solution, the IC 600 is able to synthesize RF output frequencies in two signal bands through RF1 synthesizer and the RF2 synthesizer. An RF select bit (RFSEL bit) 622 communicated through the serial interface circuitry 606 is used to control multiplexer 618 to select either the RF1 synthesizer output or the RF2 synthesizer output. The RF select bit (RFSEL bit) 622 is also used to control multiplexer 620 to select either the RF1 output power level setting 616 or the RF2 output power level setting 632.

The RF1 synthesizer may include reference divider circuitry 608, output divider circuitry 614, phase detector/loop filter 610, and a VCO 612. The reference divider circuitry 608 may include a register for the divide-by-R value and divide-by-R circuitry. The output divider circuitry 614 may include a register for the divide-by-N value, a pre-scaler and counter circuitry (Swallow A Counter; $N_P$ Counter), as is well known to those of skilled in the art. The phase detector/loop filter 610 may include a phase detector gain register, phase comparator circuitry (φ), and filter circuitry (LF). The registers may be loaded through the internal bus 605 with data received through the serial interface circuitry 606. The VCO 612 has connections for an external inductor (RFLA/B), which may be selected to provide an output for the RF1 synthesizer in a desired frequency band.

The RF2 synthesizer may include reference divider circuitry 626, output divider circuitry 634, phase detector/loop filter 628, and a VCO 630. The reference divider circuitry 626 may include a register for the divide-by-R value and divide-by-R circuitry. The output divider circuitry 634 may include a register for the divide-by-N value, a pre-scaler and counter circuitry (Swallow A Counter; $N_P$ Counter), as is well known to those of skilled in the art. The phase detector/loop filter 628 may include a phase detector gain register, phase comparator circuitry (φ), and filter circuitry (LF). The registers may be loaded through the internal bus 605 with data received through the serial interface circuitry 606. The VCO 630 has connections for an external inductor (RFLC/D), which may be selected to provided an output for the RF2 synthesizer in a desired frequency band that may be different from the frequency band of the RF1 synthesizer.

The IF synthesizer may include reference divider circuitry 636, output divider circuitry 644, phase detector/loop filter 638, and a VCO 640. The reference divider circuitry 636 may include a register for the divide-by-R value and divide-by-R circuitry. The output divider circuitry 644 may include a register for the divide-by-N value, a pre-scaler and counter circuitry (Swallow A Counter; $N_P$ Counter), as is well known to those of skilled in the art. The phase detector/loop filter 638 may include a phase detector gain register, phase comparator circuitry (φ), and filter circuitry (LF). The registers may be loaded through the internal bus 605 with data received through the serial interface circuitry 606. The VCO 640 has connections for an external inductor (IFLA/B), which may be selected to provide an output for the IF synthesizer in a desired frequency range. As with the RF1 and RF2 synthesizers, the IF synthesizer also has an output buffer 642 that receives an IF output voltage level setting 646.

Figure 6B:
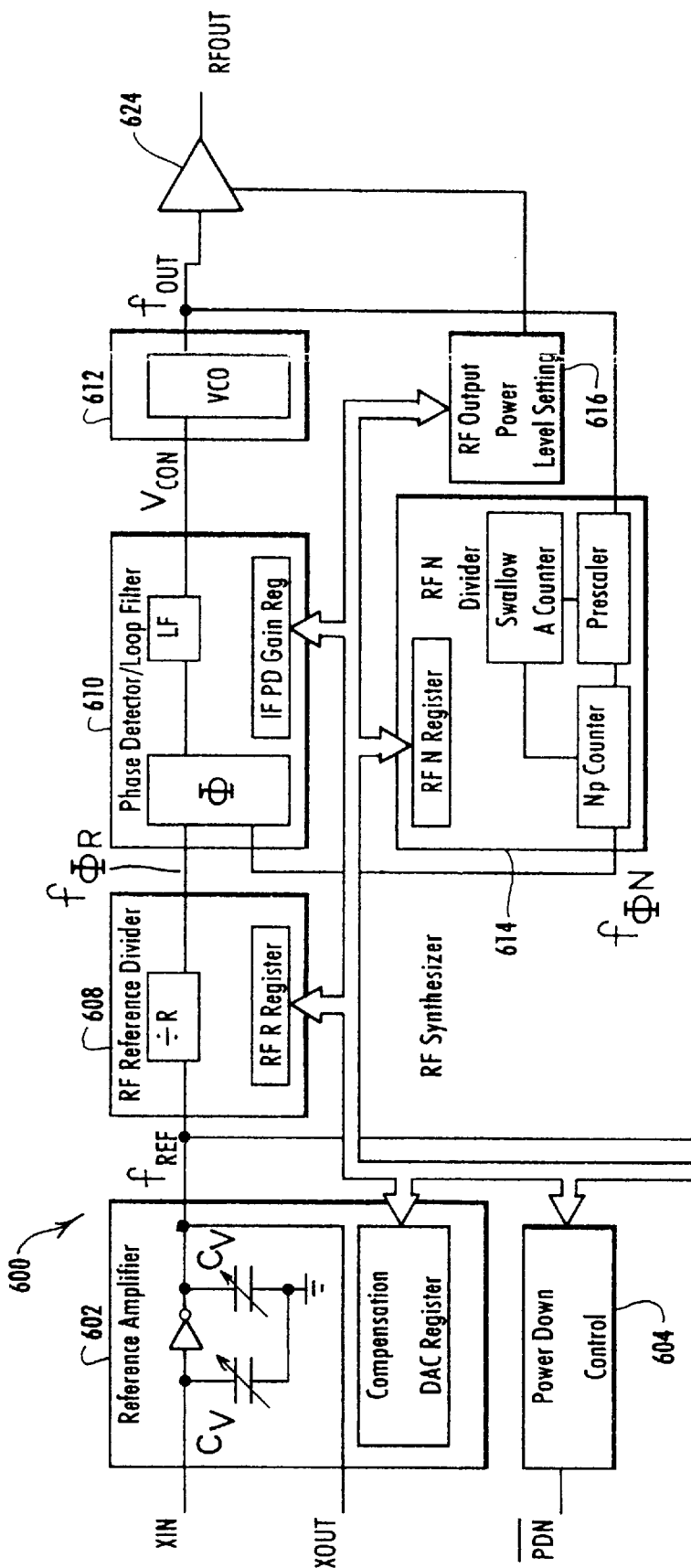
FIG. 6B is a block diagram of an alternative embodiment according to the present invention for the integrated circuit (IC) depicted in FIG. 6A that provides dual frequency bands with a single RF frequency PLL.

It is understood that the embodiment depicted in FIG. 6A is an example embodiment and that modifications could be made to the design without departing from the present invention. The RF1, RF2, and IF synthesizers may be implemented utilizing the PLL depicted in FIG. 5 and the VCO depicted in FIG. 4. Possible alternative implementations to FIG. 6A are now described with respect to FIG. 6B, FIG. 13 and FIG. 14.

FIG. 6B is a block diagram of an alternative embodiment for the integrated circuit (IC) 600 depicted in FIG. 6A. This alternative embodiment also provides frequency synthesis for a dual band mobile phone applications, but does so with a single RF synthesizer. The advantageous result is achieved by implementing the VCO 612 with the capability of switching between two output frequency bands. In so doing, the reference divider 608, the output divider 614, the phase detector/loop filter 610, and the power output level setting 616 operate to synthesize frequencies in both bands without a change in circuitry. The programmable nature of the divider circuits 608 and 614 and the phase detector/loop filter 610 allows a selection of the desired operating parameters. The dual band VCO 612 provides output oscillation frequencies in two different desired frequencies bands.

Figure 13:
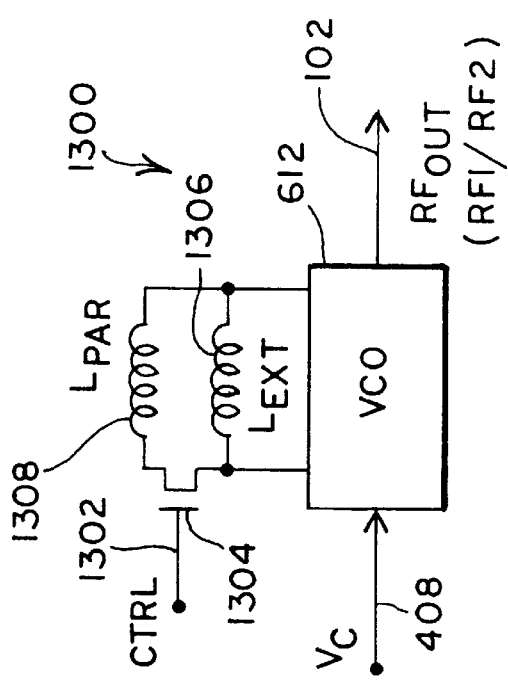
FIG. 13 is a diagram of an embodiment of a VCO for achieving dual band operation for the VCO depicted in FIG. 6B.

FIG. 13 is a diagram of an embodiment 1300 for achieving a dual band operation for VCO 612. The VCO 612 receives a voltage control ($V_C$) signal 408 and provides an RF output ($RF_{OUT}$) frequency 102. The external inductor ($L_{EXT}$) 1306 may be used to determine a first RF output frequency RF1. If a second RF output frequency RF2 is desired, NMOS transistor 1304 may be turned on through the assertion of a high logic level on control node (CTRL) 1302. When this occurs, an additional inductor ($L_{PAR}$) 1308 will be connected in parallel with the external inductor ($L_{EXT}$) 1306. In this manner, the output frequency may be selectively centered in two desired bands of frequencies. As the inductance changes, the center frequency of oscillation of the LC tank with the VCO 612 will also change. This approach may also be used to implement any desired number of frequency bands by adding additional switches and inductances. Disadvantages to this approach include the large tolerances associated with most inductors and the undesirable phase noise added to the output frequency signals by transistor switch 1304.

Figure 14:
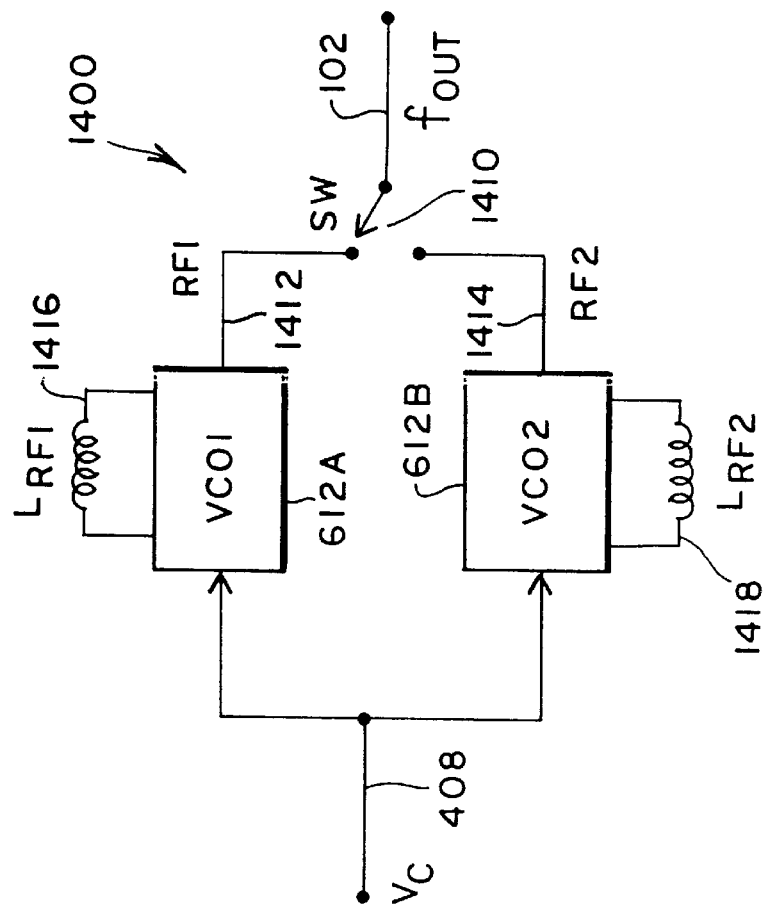
FIG. 14 is a block diagram of an alternative embodiment of a VCO for achieving dual band operation for the VCO depicted in FIG. 6B using two VCOs within a single PLL circuit.

FIG. 14 is a block diagram of an alternative embodiment 1400 for achieving dual band operation for VCO 612. A second switch (SW) 1410 is used to select either a first VCO (VCO1) 612A or a second VCO (VCO2) 612B. A first external inductor ($L_{RF1}$) 1416 may be selected so that the VCO1 612A has an RF output (RF1) 1412 centered in a first desired frequency band. Similarly, a second external inductor ($L_{RF2}$) 1418 may be selected so that the VCO2 612B has an RF output (RF2) 1414 centered in a second desired frequency band. The selected frequency is connected through switch 1410 to provide the desired output frequency ($f_{OUT}$) 102. Power to the non-used VCO 612A or 612B may be shut down, for example by starving the circuit of current from a current generator. This multiple VCO arrangement according to the present invention eliminates potential sources of phase noise by moving the switch (SW) 1410 outside of the LC tank. This approach may also be used to implement any desired number of frequency bands by adding additional VCOs, inductors, and switches (or multiplexers).

Further details of the discretely variable capacitance ($C_D$) 402 will now be described. In particular, an implementation for the discretely variable capacitance ($C_D$) 402 is described with respect to FIG. 7, and an implementation for the discrete control block 502 as described with respect to FIG. 8.

Figure 7:
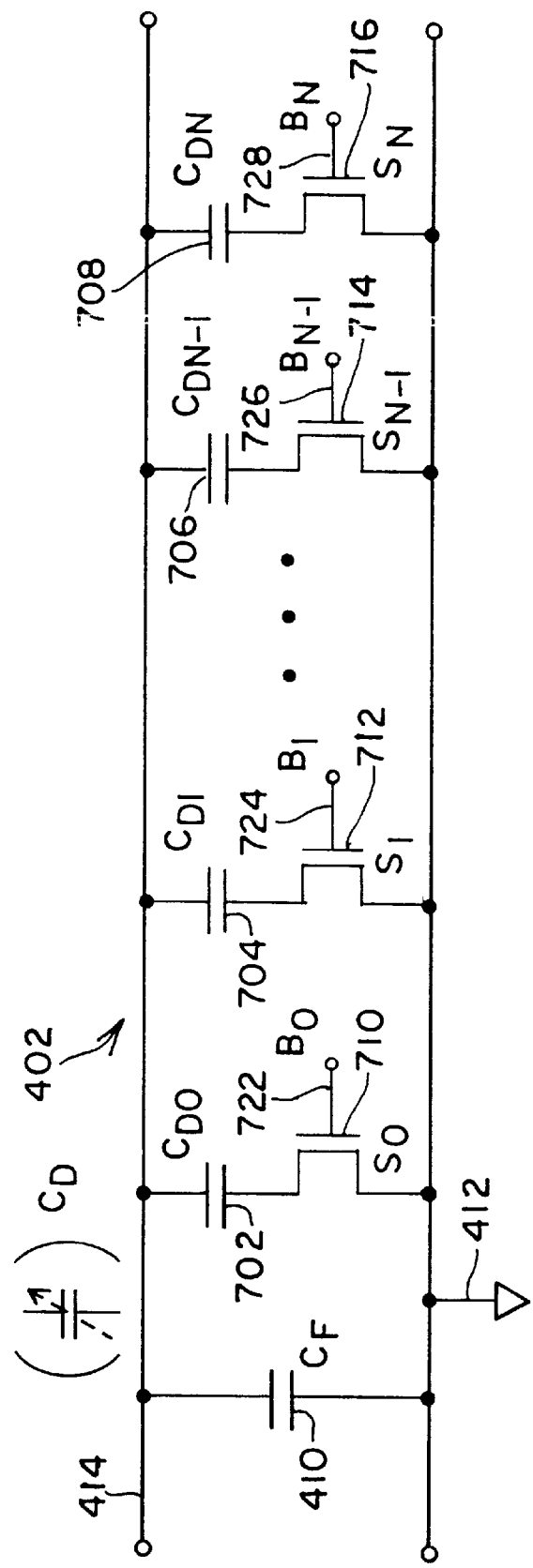
FIG. 7 is a circuit diagram of an embodiment for discretely variable capacitance circuitry according to the present invention.

FIG. 7 is a circuit diagram of an embodiment for discretely variable capacitance ($C_D$) 402 according to the present invention. A fixed capacitor ($C_F$) 410 represents parasitic capacitance plus any desired fixed capacitance. Discrete variations are achieved through a plurality of capacitor and transistor circuits connected together. Looking to the first of these connected circuits, an initial capacitor 702 ($C_{D0}$) is connected between ground 412 and the signal line 414 through the drain and source terminals of an NMOS transistor 710. NMOS transistor 710 acts as a switch ($S_0$) to add in or leave out the capacitor ($C_{D0}$) 702 in the overall capacitance of the discretely variable capacitance ($C_D$) 402. The "on" or "off" state of NMOS transistor 712 is controlled by first bit ($B_0$) 722 of a digital control word 404. Similarly, additional capacitors 704, 706 and 708 ($C_{D1}$ . . . $C_{DN-1}$, $C_{DN}$) may be connected to additional NMOS transistors 712, 714 and 716 to form a plurality of connected capacitor circuits. The NMOS transistors 712, 714 and 716 act as switches ($S_1 \ldots S_{N-1}, S_N$) and are controlled by bits 724, 726 and 728 ($B_1 \ldots B_{N-1}, B_N$) of a digital control word 404.

Although impractical to implement off-chip, this digitally controlled arrangement may be reasonably integrated onto a single chip. Advantages of this arrangement include providing a large range of possible capacitance variations and a solution to problems with poor component tolerances. Another significant advantage is that it drastically reduces the capacitance variation needed for the continuously variable capacitance ($C_A$) 406. The discretely variable capacitance ($C_D$) 402 may be used to provide a coarse tuning of the oscillation frequency near the desired output frequency. The continuously variable capacitance ($C_A$) 406 then needs only to vary enough to cover the frequency range between the steps available through the discrete nature of the digitally controlled capacitance ($C_D$) 402 and to cover any component drift after calibration, for example, due to temperature variations. This reduction in the required capacitance variation translates to eliminating the need for a large capacitance variation, which typically requires the use of a variable reverse-biased diode (or varactor) as described with respect to FIG. 3 (Prior Art) above. By eliminating the need for this varactor, the present invention provides a frequency synthesis solution that may be integrated on a single CMOS integrated circuit.

It is noted that any desired number of capacitor/switch circuits may be connected together as desired. It is also noted that numerous variations could be made to the circuit depicted in FIG. 7 and still achieve a capacitance that is discretely variable based upon a digital control word. The values of the capacitors and the control procedure implemented by the discrete control block 502 would depend upon the choices made.

For the circuit depicted in FIG. 7 with simple capacitor/switch circuits connected together in parallel, the total capacitance for the discretely variable capacitance ($C_D$) 402 is equal to the sum of all of the capacitors having respective switches in the "on" state. Thus, the total capacitance for the discretely variable capacitance ($C_D$) 402 may be represented by $C_D = (C_{D0} \cdot B_0) + (C_{D1} \cdot B_1) + \ldots + (C_{DN-1} \cdot B_{N-1}) + (C_{DN} \cdot B_N)$. If each capacitance value is considered a multiple of some unit or base capacitance value ($C_0$) times some desired capacitor weighting (W), the total capacitance may be represented by $C_D = (W_{D0} C_0 \cdot B_0) + (W_{D1} C_0 \cdot B_1) + \ldots + (W_{DN-1} C_0 \cdot B_{N-1}) + (W_{DN} C_0 \cdot B_N)$. In this embodiment, therefore, the choice of weighting coefficients defines what capacitances are available.

Numerous weighting schemes are possible, and the one implemented depends upon the particular design considerations involved. One possible choice for a weighting scheme is an equal weighting scheme, such that all of the weights are the same ($W_{D0-N}$=constant). This equal weighting scheme, however, is relatively inefficient because it requires a large number capacitor/switch circuits and a small base capacitor value to provide a large number of capacitor value choices. Another possible weighting scheme is a binary weighting scheme, such that each weight is a factor of 2 different from the previous weight ($W_{D0}=1$, $W_{D1}=2$, $W_{D2}=4 \ldots W_{DN-1}=2^{N-1}$, $W_{DN}=2^N$). Although this binary weighting scheme is relatively efficient in allowing the selection of a wide range of capacitance values with a limited number of capacitor/switch circuits, this scheme suffers from practical implementation problems due to differential non-linearities (DNL) in manufacturing the capacitance values. The equal weighting scheme has a low occurrence of problems with DNL. Possible compromise weighting schemes between the equal and binary weighting schemes include a radix less-than-two and mixed radix weighting schemes. A radix less-than-two weighting scheme, for example, may be implemented such that each weight is a factor (i.e., the radix) less than 2 (e.g., 7/4) different from the previous weight ($W_{D0}=1$, $W_{D1}=7/4$, $W_{D2}=(7/4)^2 \ldots W_{DN-1}=(7/4)^{N-1}$, $W_{DN}=(7/4)^N$). A mixed radix weighting scheme, for example, may be implemented such that each weight is some combination of factors (e.g., 2 and 7/4) different from the previous weight ($W_{D0}=1$, $W_{D1}=2$, $W_{D2}=4$, $W_{D3}=4(7/4)$, $W_{D3}=4(7/4)^2 \ldots W_{DN}=2^X(7/4)^Y$ where X and Y are integers).

In TABLE 1 below, an example for the relative capacitor weighting values are set forth for a circuit as depicted in FIG. 7 in which the number of capacitor/switch circuits has been selected as eleven. The number of bits in the digital control word ($B_C$) 404 has also been chosen to be eleven. This weighting scheme most closely resembles the mixed radix weighting scheme discussed above. It is noted that the weighting scheme chosen will depend upon the circuit utilized and the coarse tuning algorithm chosen. TABLE 1 below was selected for a dual band cellular phone application as depicted and described with respect to FIGS. 6A and 6B above.

TABLE 1

Example Relative Capacitor Weightings

| CAPACITOR (C[N]) | WEIGHTINGS (W[N]) |
|---|---|
| C[0] | 1 |
| C[1] | 2 |
| C[2] | 4 |
| C[3] | 5 |
| C[4] | 10 |
| C[5] | 15 |
| C[6] | 30 |
| C[7] | 50 |
| C[8] | 90 |
| C[9] | 160 |
| C[10] | 310 |

As discussed above, the selection of which of the capacitors in FIG. 7 are added into the total output is determined by the digital control word ($B_C$) 404.

As depicted in FIG. 5, the discrete control block 502 provides the digital control word ($B_C$) 404 as an output. The discrete control block 502 may perform any desired procedure to determine how to adjust the digital control word ($B_C$) 404 to coarsely tune the output frequency. Potential procedures include non-linear control algorithms and linear control algorithms. For example, a non-linear control algorithm could be implemented in which a simple "too fast" or "too slow" frequency comparison determination is made between the divided output frequency ($f_{OUT}/N$) 216 and the divided reference frequency ($f_{REF}/R$) 216, and the digital control block 502 may use a successive approximation algorithm to coarsely tune the output frequency ($f_{OUT}$) 102. Alternatively, a linear control algorithm could be implemented in which a quantitative frequency comparison determination is made about the approximate size of the frequency error between the divided output frequency ($f_{OUT}/N$) 218 and the divided reference frequency ($f_{REF}/R$) 216, and the control block 812 may change the digital control word ($B_C$) 404 by an appropriate amount to compensate for the size of the frequency error. It is noted that the procedure used may depend upon numerous variables including the particular application involved and the level of coarse tuning desired.

Figure 8:
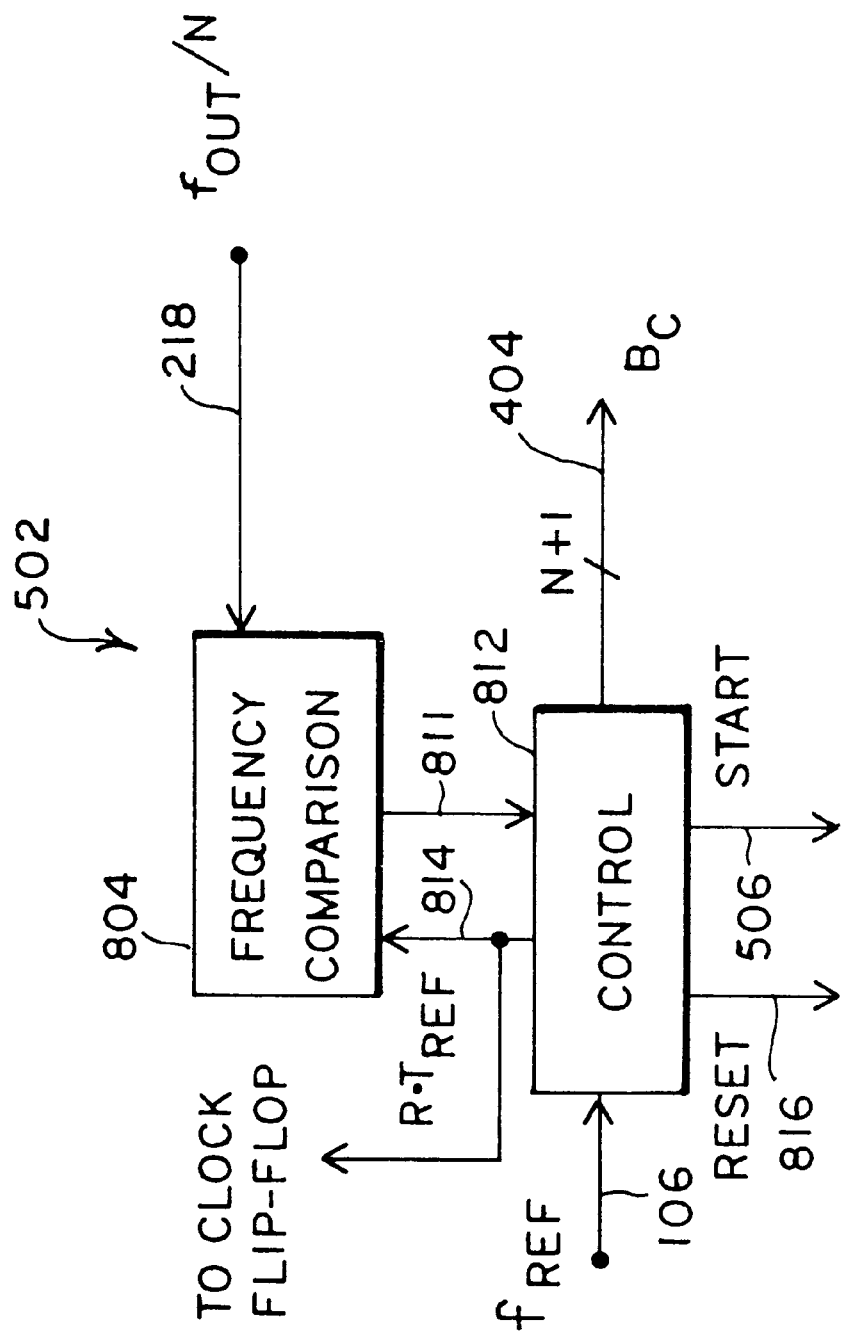
FIG. 8 is a block diagram of an embodiment for discrete control circuitry according to the present invention for providing a digital control word to the discretely variable capacitance circuitry of FIG. 7.

FIG. 8 is a block diagram of an embodiment for discrete control circuitry 502 according to the present invention for providing the digital control word ($B_C$) 404 to the discretely variable capacitance ($C_D$) 402. The embodiment of FIG. 8 may be utilized in conjunction with the procedure set forth in TABLE 2 below and the number and weightings for the capacitances as set forth in TABLE 1. As indicated in FIG. 8, the digital control word ($B_C$) 404 may be an N+1 bit signal. The number of bits selected for "N+1" depends upon the number of control signals (0:N) desired to be sent to the discretely variable capacitance ($C_D$) 402. It is also noted that the "N" used with respect to the digital control word ($B_C$) 404 is not the same as the "N" used with respect to the divide-by-N (÷N) counter 214.

For the embodiment for discrete control block 502 of FIG. 8, and unlike the embodiment depicted in FIG. 5, the divided reference frequency signal ($f_{REF}/R$) 216 is not connected to the discrete control circuitry 502. Rather, the reference frequency ($f_{REF}$) 106 is directly connected to the control block 812. The control block 812 uses the reference frequency signal ($f_{REF}$) 106 to define a reference clock ($T_{REF}$) that is equivalent to the time period ($T_{REF}=1/f_{REF}$) for each cycle of the reference frequency signal ($f_{REF}$) 106. The control block 812 sends to a frequency comparison block 804 a timing signal ($R \cdot T_{REF}$) 814 that has a cycle time of R times the unit cycle time ($T_{REF}$). The frequency comparison block 804 also receives the divided-by-N output frequency signal ($f_{OUT}/N$) 218.

It is noted that the timing signal ($R \cdot T_{REF}$) 814 may also be used to generate a divided reference frequency signal that is equivalent to the divided-by-R reference frequency signal ($f_{REF}/R$) 216 generated by the divide-by-R (÷R) counter 204 of FIG. 5. To do so, the timing signal ($R \cdot T_{REF}$) 814 may be sent, as indicated in FIG. 8, to clock a flip-flop circuit that receives the reference frequency signal ($f_{REF}$) 106. The flip-flop circuit may thereby generate a divided-by-R reference frequency signal ($f_{REF}/R$) 216 that is relatively jitter-free. This resulting divided reference frequency signal ($f_{REF}/R$) 216 may be used within the PLL circuitry depicted in FIG. 5.

To initiate a frequency comparison, the control block 812 may first synchronize the divided output frequency signal ($f_{OUT}/N$) 218 with the timing signal ($R \cdot T_{REF}$) by resetting the divide-by-N (÷N) counter 214 through the assertion of a reset signal (RESET) 816 that may be applied to the divide-by-N (÷N) counter 214. The control block 812 may then assert the timing signal ($R \cdot T_{REF}$) 814 for a single cycle. At the end of this single cycle for the timing signal ($R \cdot T_{REF}$) 814, the frequency comparison block 804 may determine whether or not the divided output frequency ($f_{OUT}/N$) 218 is "too fast" or "too slow" with respect to the timing signal ($R \cdot T_{REF}$) 814 and may provide some quantification of the amount of the frequency error, if so desired. The frequency comparison block 804 provides back to the control block 812 a signal 811 that is indicative of the frequency comparison determination made and that may be a single bit signal or a multiple bit signal, as desired. The control block 812 may then adjust the digital control word ($B_C$) 404 accordingly to coarsely tune the output frequency ($f_{OUT}$).

When the control block 812 completes its coarse tuning procedure, the control block 812 may assert the START signal 506 to change switch 512 to deselect voltage control node 510 and pass control to the voltage control node 508 (as shown in FIG. 5). At this point, the existing digital control word ($B_C$) 404 may be fixed such that the discretely variable capacitance ($C_D$) 402 will remain the same, while the continuously variable capacitance ($C_A$) 406 is varied. In this way, the integrated circuit may operate to initially calibrate the output frequency ($f_{OUT}$) 102 to a desired output frequency, such that a coarse level of tuning control is provided by the discretely variable capacitance ($C_D$) 402 and a fine level of tuning control is provided by the continuously variable capacitance ($C_A$) 406.

In TABLE 2 below, an example procedure for control block 812 is described in more detail for controlling the digital control word ($B_C$) 404. This procedure correlates to the capacitor weighting scheme set forth in TABLE 1 in which the number of capacitor/switch circuits was selected to be eleven. The number of bits in the digital control word ($B_C$) 404 has also been chosen to be eleven. It is noted that the procedure implemented will depend upon design considerations and that any desired procedure may be implemented. Like TABLE 1, TABLE 2 below was contemplated for a dual band cellular phone application as depicted and described with respect to FIGS. 6A and 6B above. As discussed above, capacitors are added by changing their respective control bit to a "1" and a dropped by changing their respective control to a "0". (If PMOS transistor switch circuits were utilized instead of NMOS transistor switch circuits, these control bits would of course change accordingly so that a "0" would add in the capacitor and a "1" would drop the capacitor.)

TABLE 2

Example Procedure for Choosing Capacitor Values with a Digital Control Word

| PROCEDURE | OPERATIONS PERFORMED |
| --- | --- |
| Cycle 13 | Set $B_C[10:0]$ = 11001000000, i.e., switch in C[10], C[9], and C[6]. VCO Warm-up. |
| Cycle 12 | Reset the N divider to start frequency comparison. |
| Cycle 11 | Do frequency comparison. If VCO too slow, drop C[9] and keep C[10] and C[6]. Otherwise, if too fast, keep C[10] and C[9], drop C[6], and switch in C[8] and C[5]. Also, directly go to Cycle 8 at the end of Cycle 11. Reset the N divider to start frequency comparison. |
| Cycle 10 | Do frequency comparison. If VCO too slow, drop C[10]. Otherwise, if too fast, keep C[10]. Add C[9]. Reset the N divider to start frequency comparison. |
| Cycle 9 | Do frequency comparison. If too slow, drop C[9] and C[6]. Otherwise, keep C[9], drop C[6]. Add C[8] and C[5]. Reset the N divider to start frequency comparison. |
| Cycle 8 | Do frequency comparison. If too slow, drop C[8] and C[5]. Otherwise, keep C[8], drop C[5]. Add C[7] and C[4]. Reset the N divider to start frequency comparison. |
| Cycle 7 | Do frequency comparison. If too slow, drop C[7] and C[4]. Otherwise, keep C[7], drop C[4]. Add C[6] and C[3]. Reset the N divider to start frequency comparison. |
| Cycle 6 | Do frequency comparison. If too slow, drop C[6] and C[3]. Otherwise, keep C[6], drop C[3]. Add C[5] and C[2]. Reset the N divider to start frequency comparison. |
| Cycle 5 | Do frequency comparison. If too slow, drop C[5] and C[2]. Otherwise, keep C[5], drop C[2]. Add C[4] and C[1]. Reset the N divider to start frequency comparison. |
| Cycle 4 | Do frequency comparison. If too slow, drop C[4] and C[1]. Otherwise, keep C[4], drop C[1]. Add C[3] and C[0]. Reset the N divider to start frequency comparison. |

TABLE 2-continued

Example Procedure for Choosing
Capacitor Values with a Digital Control Word

| PROCEDURE | OPERATIONS PERFORMED |
|---|---|
| Cycle 3 | Do frequency comparison. |
| | If too slow, drop C[3] and C[0]. |
| | Otherwise, keep C[3], drop C[0]. |
| | Add C[2]. |
| | Reset the N divider to start frequency comparison. |
| Cycle 2 | Do frequency comparison. |
| | If too slow, drop C[2]. |
| | Otherwise, keep C[2]. |
| | Add C[1]. |
| | Reset the N divider to start frequency comparison. |
| Cycle 1 | Do frequency comparison. |
| | If too slow, drop C[1]. |
| | Otherwise, keep C[1]. |
| | Add C[0]. |
| | Reset the N divider to start frequency comparison. |
| Cycle 0 | Do frequency comparison. |
| | If too slow, drop C[0]. |
| | Otherwise, keep C[0]. |
| | Reset the N divider to start the normal operation. |

It is noted that the procedure in TABLE 2 is a non-linear control algorithm that implements a type of successive approximation (SA) scheme. The procedure has been designed to take thirteen steps to complete. This scheme uses the frequency comparison block 804 in FIG. 8 to make a "too fast" or "too slow" determination for the divided output frequency ($f_{OUT}$/N) 218 with respect to the divided reference frequency ($f_{REF}$/R) 216. One method for making this frequency comparison is to first reset the N divider 214 to synchronize it for the frequency determination and then to latch the level of the divided output frequency ($f_{OUT}$/N) 218 R number of reference clocks ($T_{REF}$) later as controlled by the timing signal (R·TREF) 814 from the control block 812. A number of additional reference clocks ($T_{REF}$) may then be utilized to allow time for other actions, which may include for example time for the control block 812 to keep or drop capacitance values by updating the digital control word ($B_C$) 404 in response to the comparison signal 811 and time for the control block 812 to reset the divide-by-N (÷N) counter 214 for the next cycle in TABLE 2. For the procedure set forth in TABLE 2, it is noted for example that the value for R may be thirty-nine, that the additional reference clocks ($T_{REF}$) may be two, and that each cycle in TABLE 2 therefore lasts forty-one reference clocks ($T_{REF}$). It is further noted that the procedure of TABLE 2 may be implemented by programming the desired procedure using the VERILOG logic circuit programming language and thereafter synthesizing the desired circuitry.

For each frequency comparison, if the level is high (logic level "1"), the comparison signal 811 to control block 812 that the divided output frequency ($f_{OUT}$/N) 218 is too fast. If the level is low (logic level "0"), the comparison signal 811 indicates to control block 812 that the divided output frequency ($f_{OUT}$/N) 218 is too slow. To synchronize the frequency comparison determination, the divide-by-N (÷N) counter 214 may be reset with respect to the timing signal (R·$T_{REF}$) 814 so that the divided output frequency ($f_{OUT}$/N) 218 starts at the initiation of the timing signal (R·$T_{REF}$) 814. This reset synchronization is indicated in the cycles described in TABLE 2. It is noted that a "too fast" or "too slow" determination may also be made by directly comparing the reference frequency ($f_{REF}$) to the output frequency ($f_{OUT}$), if so desired.

As a general rule, the procedure in TABLE 2 operates by starting with a large capacitance value and in each cycle either dropping capacitance values, if the divided output frequency ($f_{OUT}$/N) 218 is too slow, or keeping capacitance values, if the divided output frequency ($f_{OUT}$/N) 218 is too high. In this manner, each successive cycle keeps or drops various capacitance values until the end of the procedure is reached. As depicted in Cycle 13 of TABLE 2, more capacitance than just the largest capacitance value (C[10]) may be initially included, if desired, to slow down the initial output frequency when the actual frequency is generally most uncertain.

Within this procedure as described in TABLE 2, a level of redundancy is also implemented that allows recovery from bad comparisons or decisions made by frequency comparison block 804 or the control block 812. For successive approximation type algorithms, it is typically easier to recover from erroneously dropping capacitance values, while it is typically very difficult to recover from erroneously keeping capacitance values. In addition, manufacturing tolerances may create significant problems because the capacitance values are not what they are desired to be. To compensate for these recovery and tolerance problems, the capacitance values may be purposefully manufactured in the radix less-than-two scheme described above. In this way, errors will tend to be "drop" errors. To further improve redundancy and error recovery, the values chosen for the capacitor weightings and the number of capacitors utilized may be chosen such that a degree of value overlap is achieved.

It is again noted that the procedure of TABLE 2 and the capacitor values may be modified as desired and that numerous alternative circuit designs may be utilized, while still achieving a discretely variable capacitance circuit as contemplated by the present invention.

Further modifications to the circuit implementation of FIG. 7 will now be discussed with respect to FIGS. 9A, 9B and 9C.

Figure 9:
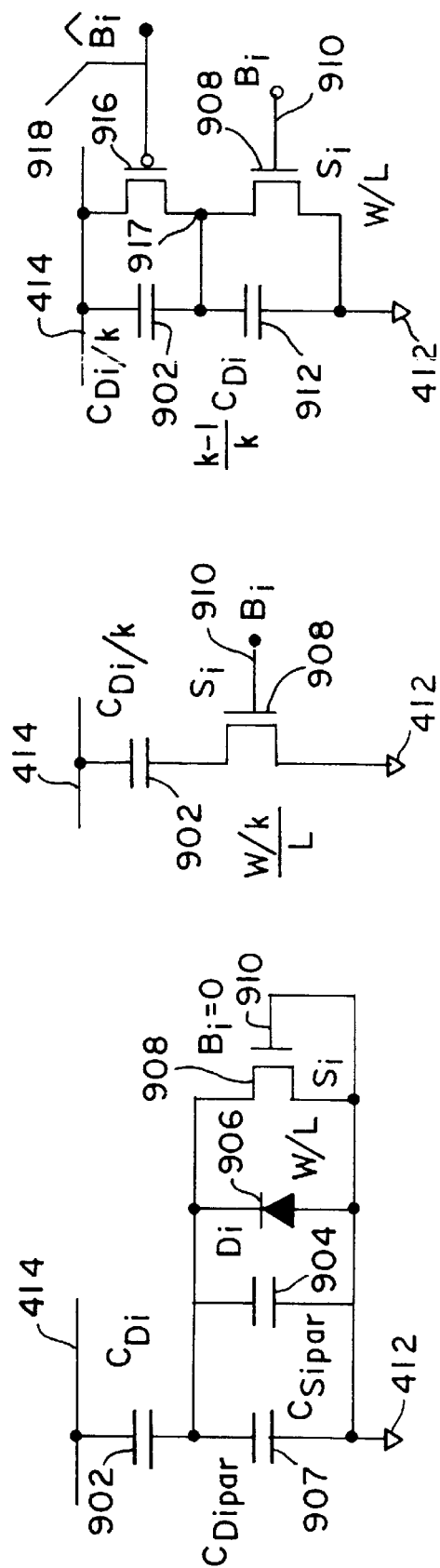
FIGS. 9A, 9B and 9C are circuit diagrams depicting parasitic capacitances associated with the components in FIG. 7 and a transistor modification for alleviating problems associated with these parasitic capacitances.

FIG. 9A depicts a circuit representation of the capacitor ($C_{Di}$) 902 and NMOS transistor switch ($S_i$) 908 circuits in FIG. 7 when the control signal (B 910 is at a low or "off" logic level. The capacitor ($C_{Di}$) 902 will have a parasitic capacitance ($C_{Dipar}$) 907 between its bottom plate and ground 412. In this "off" state, the NMOS transistor ($S_i$) 908 may be represented as a diode ($D_i$) 906, which is desirably reverse-biased, and a parasitic capacitance ($C_{Sipar}$) 904 in parallel with a switch ($S_i$) 908. The switch ($S_i$) 908 has its control node 910 set to an "off" state ($B_i$=0). The parasitic capacitance ($C_{Sipar}$) 904 will provide an undesirable non-linear capacitance value proportional to the size (width/length=W/L) of the transistor. Although not shown, the NMOS transistor ($S_i$) 908 may be represented by some resistance ($R_{DS}$) in series with the capacitor ($C_{Di}$) 902, when it is in its "on" state.

Potential problems with this capacitor/switch circuit arise. In the "off" state, problems include the capacitor parasitic capacitance ($C_{Dipar}$) 907, the transistor parasitic capacitance ($C_{Sipar}$) 904, and possible forward biasing of the diode ($D_i$) 906. In its "on" state, problems include phase noise contribution that is dependent upon the size of the series resistance ($R_{DS}$). Because the capacitor parasitic capacitance ($C_{Dipar}$) 907 will be linear, it is typically not considered much of a problem, although it limits the switchable capacitance range. In contrast, the transistor parasitic capacitance ($C_{Sipar}$) 904 will be non-linear and will convert any voltage noise on node 917 to phase noise. When the NMOS transistor ($S_i$) 908 is in its "off" state, therefore, it is desirable for the transistor parasitic capacitance ($C_{Sipar}$) 904 to be as low as possible.

This desired small capacitance translates into selecting a small size for the NMOS transistor ($S_i$) 908. When the NMOS transistor ($S_i$) 908 is in its "on" state, however, it is desirable for the series resistance ($R_{DS}$) to be as low as possible. This desired low resistance may be achieved by selecting a large size for the NMOS transistor ($S_i$) 908. The size of the NMOS transistor ($S_i$) 908, therefore, affects the transistor parasitic capacitance ($C_{Sipar}$) 904 and the series resistance ($R_{DS}$) in an inverse relationship. Thus, a balancing decision must be made in selecting the transistor size.

If all of the NMOS transistors 710, 712, 714 and 716 ($S_0$, $S_1$ ... $S_{N-1}$, $S_N$) are sized the same, the parasitic capacitances, as well as the capacitance drift, for each will be approximately the same. The selected capacitance value for each successively smaller capacitor ($C_{Di}$) 902 will become closer to the capacitance value of the parasitic capacitance ($C_{Sipar}$) 904. For smaller capacitance values, the parasitic capacitance drift begins to adversely affect capacitor matching within the array. One way to make the balancing decision mentioned above, therefore, is to decide upon a particular value for each transistor parasitic capacitance ($C_{Sipar}$) 904 as a percentage of the value for each capacitor ($C_{Di}$) 902. In this way, the transistor parasitic capacitances will be scaled in proportion to the scaling of the overall capacitances.

FIG. 9B provides an embodiment for such a solution. This embodiment contemplates reducing the size of each successive transistor ($S_i$) 908 in proportion with the reduction in value of each successive capacitor ($C_{Di}$) 902, according to the weighting scheme adopted. As depicted in FIG. 9B, the scaling factor between two adjacent capacitor values is shown as 1/k. In other words, the value of a first capacitor ($C_{D0}$) 702 would be 1/k times the value of a second capacitor ($C_{Di}$) 704. To reduce drift problems and improve capacitor matching, the size (W/k) of the each transistor ($S_i$) is made to be 1/k times the size (W) of the corresponding next larger transistor.

Because of semiconductor manufacturing process limitations, the width of the smallest transistor elements may be limited to a particular value. At some point, therefore, the size will no longer be able to be proportionally reduced with respect to the previous transistor size value. FIG. 9C provides a circuit that solves this problem by adding a fixed capacitor across the drain and source of the transistor ($S_i$) 908. Because of the size limitation mentioned above, the size (W/L) of the transistor ($S_i$) 908 is the same as the previous transistor within the array. Instead of reducing the size of the transistor ($S_i$) 908, a capacitor 912 having a value of (k−1)/k times the value of the previous capacitor value is added. The result is an overall switchable capacitance value that is equivalent to the circuit depicted in FIG. 9B without reducing the size of the transistor 908.

FIG. 9C. also depicts an embodiment for avoiding the problem with possible forward biasing of the diode ($D_i$) 906 when the NMOS transistor ($S_i$) 908 is in its "off" state. The PMOS transistor 916, which has its drain and source terminals connected between signal line 414 and node 917, avoids this "off" state diode problem by keping the voltage at node 917 from floating when transistor 908 is in its "off" state. This PMOS transistor 916 is controlled by a signal ($B_i$ _hat) 918 that is identical to the control signal ($B_i$) 910, except that the "—hat" designation represents that the signal ($B_i$ _hat) 918 has a regulated voltage when high. In other words, signal ($B_i$ _hat) 918 may only rise to a predetermined voltage level. Thus, when the bit ($B_i$) 910 goes to a high logic level, the signal ($B_i$ _hat) 918 will only go to the regulated high voltage level. The addition of PMOS transistor 916 connects what would otherwise be an uncontrolled and potentially noisy floating node to a well-determined and quiet signal line 414. In this way, PMOS transistor 916 tends to eliminate the potential problem of the diode ($D_i$) 906 being forward biased due to a floating voltage at node 917.

Still considering the embodiment depicted in FIG. 7, a differential implementation will now be discussed with respect to FIG. 10, FIG. 11 and FIG. 12.

Figure 10:
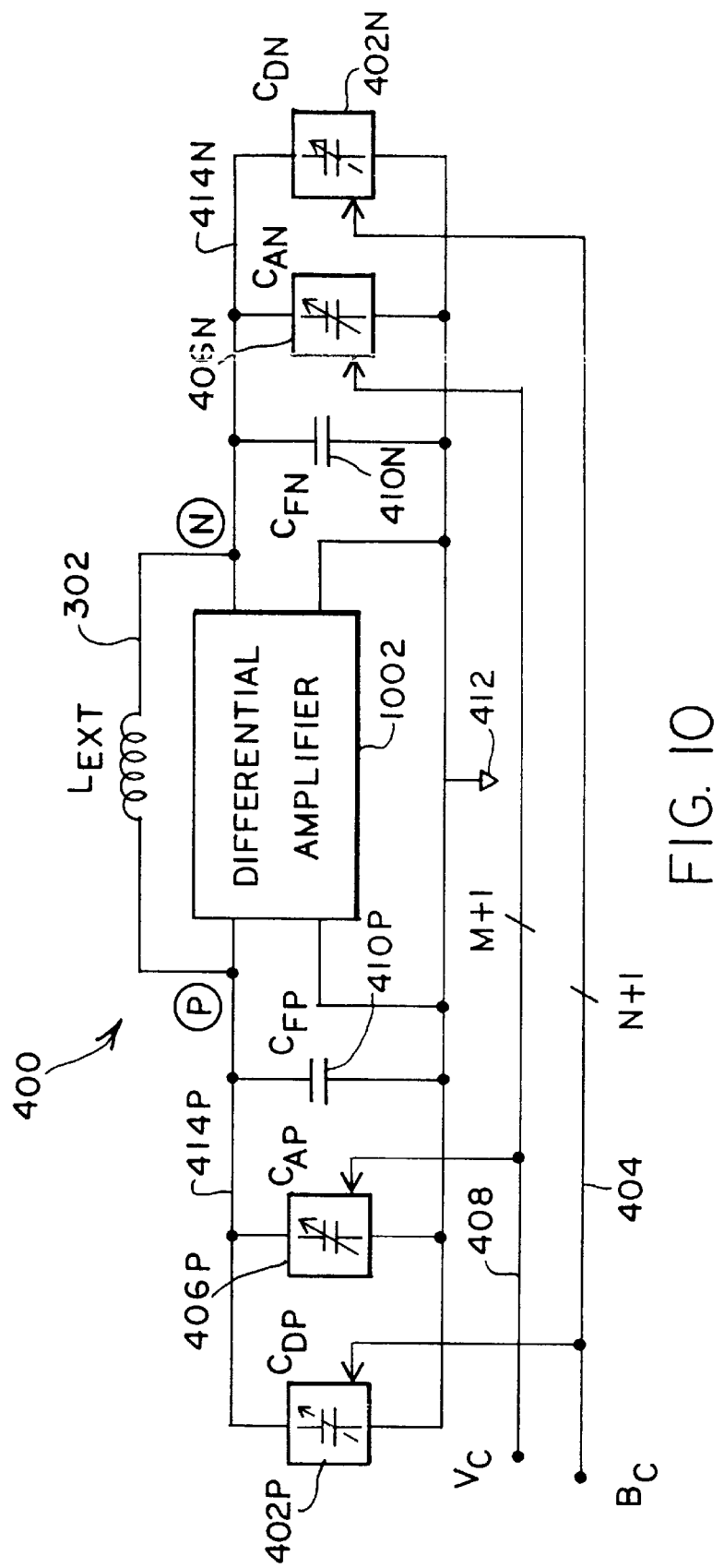
FIG. 10 is a block diagram of a differential embodiment according to the present invention for the VCO depicted in FIG. 4.

FIG. 10 is a block diagram of a differential embodiment for a VCO 400 according to the present invention. Compared to the embodiment for VCO 400 depicted in FIG. 4, the circuit elements are essentially duplicated for a positive and negative input paths. A differential amplifier 1002 is connected to a negative output node 414N and a positive output node 414P, as well as to ground 412. An external inductor ($L_{EXT}$) 302 may be connected across the output nodes 414P and 414N. A positive side fixed capacitor ($C_{FP}$) 410P, a discretely variable capacitance ($C_{DP}$) 402P, and continuously variable capacitance ($C_{AP}$) 406P may be connected between the positive output node 414P and ground 412. Similarly, a negative side fixed capacitor ($C_{FN}$) 410N, a discretely variable capacitance ($C_{DN}$) 402N, and continuously variable capacitance ($C_{AN}$) 406N may be connected between the negative output node 414N and ground 412. The voltage control signal ($V_C$) 408 may be an M+1 bit signal, as further described below, and may be applied to both the positive and negative side continuously variable capacitances ($C_{AP}$, $C_{AN}$) 406P and 406N. The digital control word ($B_C$) 404 may be an N+1 bit signal, as described above, and may be applied to both the positive and negative side discretely variable capacitances ($C_{DP}$, $C_{DN}$) 402P and 402N.

Figure 11:
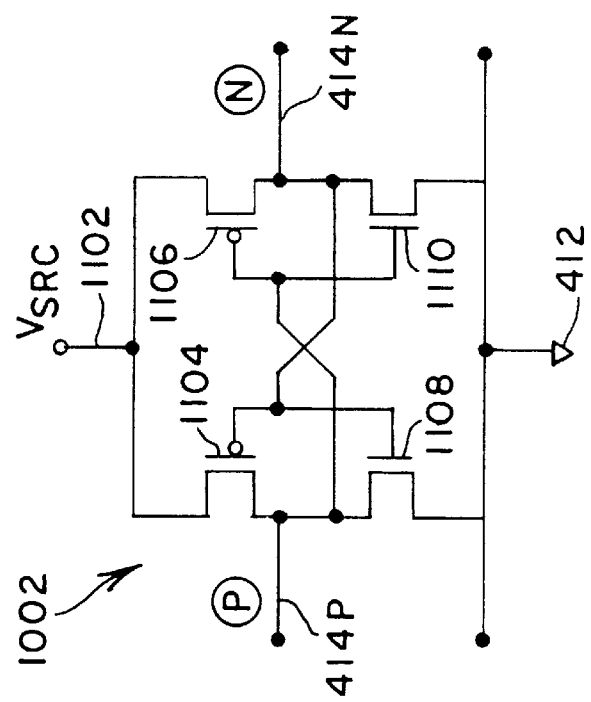
FIG. 11 is a circuit diagram of a differential amplifier according to the present invention for the differential embodiment depicted in FIG. 10.

FIG. 11 is a circuit diagram of a differential amplifier 1002 according to the present invention. A first PMOS transistor 1104 has its source connected to a voltage supply control node ($V_{SRC}$) 1102 and its drain connected to the positive output node 414P. The gate of the first PMOS transistor 1104 may be connected to the negative output node 414N. Similarly, a second PMOS transistor 1106 has its source connected to a voltage supply control node ($V_{SRC}$) 1102 and its drain connected to the negative output node 414N. The gate of the second PMOS transistor 1106 may be connected to the positive output node 414P. A first NMOS transistor 1108 has its source and drain connected between ground 412 and the positive output node 414P. The gate of the first NMOS transistor 1108 may be connected to the negative output node 414N. Similarly, a second NMOS transistor 1110 has its source and drain connected between ground 412 and the negative output node 414N. The gate of the second NMOS transistor 1110 may be connected to the positive output node 414P. The voltage supply control node ($V_{SRC}$) 1102 may be used to control the level of the output signal. The output amplitude may be monitored. If the amplitude is too high, the voltage on the voltage supply control node ($V_{SRC}$) 1102 may be lowered. Conversely, if the amplitude is too low, the voltage on the voltage supply control node ($V_{SRC}$) 1102 may be raised. It is noted that the voltage supply control node ($V_{SRC}$) 1102 may be supplied by voltage or current in open loop or closed loop to provide the desired control.

Figure 12:
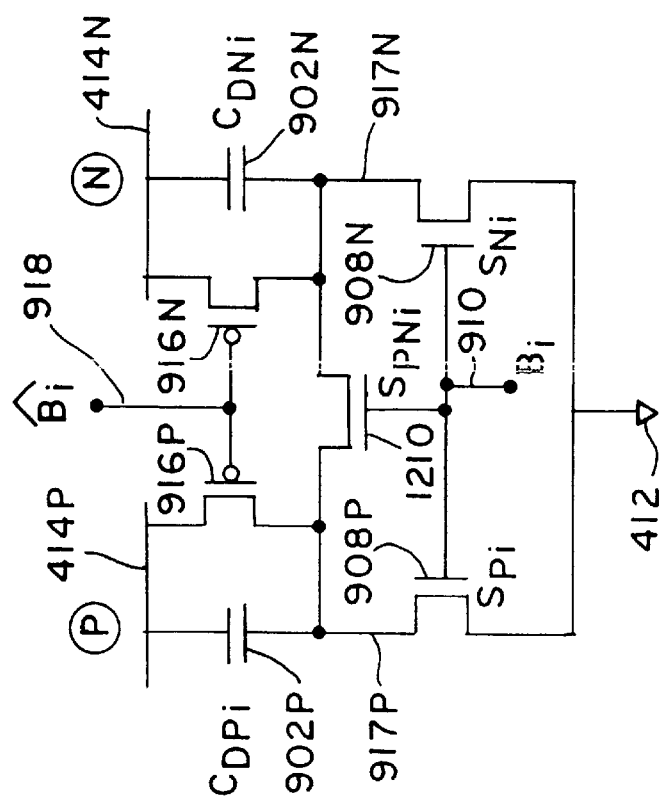
FIG. 12 is a circuit diagram depicting transistors that may be added to the differential embodiment of FIG. 10 to improve the performance of capacitor pairs within the discretely variable capacitance circuitry.

FIG. 12 is a circuit diagram depicting transistors that may be added to improve the performance of each capacitor pair within the discretely variable capacitance ($C_D$) 402. Positive side capacitor ($C_{DPi}$) 902P and transistor ($S_{Pi}$) 908P and negative side capacitor ($C_{DNi}$) 902N and transistor ($S_{Ni}$) 908N form differential capacitor/switch pairs for the discretely variable capacitance ($C_D$) 402. The transistors ($S_{Pi}$)

908P and (S$_{Ni}$) 908N are controlled by the same control signal (B$_i$) 910. As described with respect to FIG. 9C above, the PMOS transistors 916P and 916N may be added to avoid an "off" state diode problem by keeping the voltages at nodes 917P and 917N from floating when switches 908P and 908N are in an "off" state. These PMOS transistors 916P and 916N are controlled by the regulated signal (B$_i$_hat) 918.

As discussed above with respect to FIGS. 9A, 9B and 9C, the series resistance (R$_{DS}$) and the transistor parasitic capacitance (C$_{Sipar}$) are in a trade-off relationship dependent upon the size of the transistor. Without the NMOS transistor (S$_{PNi}$) 1210, the transistors (S$_{Pi}$) 908P and (S$_{Ni}$) 908N would have a total series resistance (R$_D$) of a certain amount when they are in their "on" state. This amount may be significantly reduced by the addition of NMOS transistor (S$_{PNi}$) 1210. For example, by choosing a size value for transistor (S$_{PNi}$) 1210 of about three times the size of transistors (S$_{Pi}$) 908P and (S$_{Ni}$) 908N, individually, the total effective series resistance (R$_{DS}$) of the transistors (S$_{Pi}$) 908P, (S$_{Ni}$) 908N, and transistor (S$_{PNi}$) 1210 may be effectively reduced by nearly half from the original amount. Thus, the NMOS transistor (S$_{PNi}$) 1210 allows the balancing decision to be made further in favor of reducing the size of the transistor parasitic capacitance (C$_{Sipar}$) when the transistors (S$_{Pi}$) 908P and (S$_{Ni}$) 908N are in an "off" state. The NMOS transistor (S$_{PNi}$) 1210 is controlled by the same control signal (B$_i$) 910 in the digital control word 404 that controls the transistors (S$_{Pi}$) 908P and (S$_{Ni}$) 908N.

It is noted that three separate differential VCOs 400 implemented as depicted in FIGS. 10–12 may be utilized to synthesize the RF1, RF2, and IF output frequencies, as described above with respect to FIGS. 6A, 6B, 13 and 14. Example component values will now be described for the external inductor (L$_{EXT}$) 302, the fixed capacitances (C$_{FP}$, C$_{FN}$) 410P and 410 N, the total capacitance for the discretely variable capacitances (C$_{DP}$, C$_{DN}$) 402P and 402N, and the total transistor size for transistor switches (S$_{Pi}$, S$_{Ni}$, S$_{PNi}$) 908P, 908N and 1210 within the discretely variable capacitances (C$_{DP}$, C$_{DN}$) 402P and 402N. These example values assume the number of capacitors and the weighting scheme described with respect to TABLE 1 and the coarse tuning procedure described with respect to TABLE 2 are being utilized.

For an RF1 output frequency with a maximum center frequency of about 2.0 GHz, the external inductor (L$_{EXT}$) may be about 2.0 nH. The two fixed capacitances (C$_{FP}$, C$_{FN}$) 410P and 410 N may each be about 2.0 pF. The summation of the eleven capacitance values within the positive side discretely variable capacitance (C$_{DP}$) 402P and the eleven capacitance values within the negative side discretely variable capacitance (C$_{DN}$) 402N may each be about 7.5 pF. Each of these eleven capacitance values are weighted as indicated in TABLE 1 with the unit weight (C$_0$) being equal to the total capacitanced of 7.5 pF divided by the total of the weightings, which as set forth in TABLE 1 is 677. The summation of the widths for each eleven groupings of the transistor switches (S$_{Pi}$,S$_{Ni}$,S$_{PNi}$) 908P, 908N and 1210 may be 1280 μm, and 3840 μm, respectively. Each of the eleven transistor width values are weighted according to the weights given their respective capacitors (C$_{DPi}$,C$_{DNi}$) 902P and 902N in TABLE 1 with the unit transistor width being equal to the total width of 1280 μm or 3840 μm divided by the total of the weightings of 677. (It is noted that the technique depicted in FIG. 9C is utilized for any of the smallest transistor widths that fall below the minimum width allowed by the semiconductor manufacturing process utilized.) The transistor lengths are not varied and are all 0.35 μm. The total impedance for all of the transistor switchs (S$_{Pi}$,S$_{Ni}$,S$_{PNi}$) and 1210 is about 0.56 Ω for worst case conditions.

For an RF2 output frequency with a maximum center frequency of about 1.3 GHz, the external inductor (L$_{EXT}$) may be about 3.1 nH. The two fixed capacitaces (C$_{FP}$,C$_{FN}$) 410P and 410 N may each be about 3.6 pF. The summation of the eleven capacitance values within the positive side discretely variable capacitance (C$_{DP}$) 402P and the eleven capacitance values within the negative side discretely variable capacitance (C$_{DN}$) 402N may each be about 11.1 pF. Each of these eleven capacitance values are weighted as indicated in TABLE 1 with line unit weight (C$_0$) being equal to the total capacitance of 11.1 pF divided by the total of the weightings, which as set forth in TABLE 1 is 677. The summation of the widths for each eleven groupings of the transistor switches (S$_{Pi}$,S$_{Ni}$,S$_{PNi}$) 908P, 908N and 1210 may be 1568 μm, 1568 μm, and 4704 μm, respectively. Each of the eleven transistor width values are weighted according to the weights given their respective capacitors (C$_{DPi}$,C$_{DNi}$) 902P and 902N in TABLE 1 with the unit transistor width being equal to the total width of 1568 μm or 4704 μm divided by the total of the weightings of 677. (It is noted that the technique depicted in FIG. 9C is utilized for any of the smallest transistor widths that fall below the minimum width allowed by the semiconductor manufacturing process utilized.) The transistor lengths are not varied and are all 0.35 μm. The total impedance for all of the transistor switches (S$_{Pi}$,S$_{Ni}$,S$_{PNi}$) 908P, 908N and 1210 is about 0.46 Ω for worst case conditions.

For an IF output frequency with a maximum center frequency of about 600 MHz, the external inductor (L$_{EXT}$) may be about 6.7 nH. The two fixed capacitances (C$_{FP}$,C$_{FN}$) 410P and 410N may each be about 8.0 pF. The summation of the eleven capacitance values within the positive side discretely variable capacitance (C$_{DP}$) 402P and the eleven capacitance values within the negative side discretely variable capacitance (C$_{DN}$) 402N may each be about 23.8 pF. Each of these eleven capacitance values are weighted as indicated in TABLE 1 with the unit weight (C$_0$) being equal to the total capacitance of 23.8 pF divided by the total of the weightings, which as set forth in TABLE 1 is 677. The summation of the widths for each eleven groupings of the transistor switchs (S$_{Pi}$,S$_{Ni}$,S$_{PNi}$) 908P, 908N and 1210 may be 3200 μm, and 9600 μm, respectively. Each of the eleven transistor width values are weighted according to the weight given their respective capacitor (C$_{DPi}$,C$_{DNi}$) 902P and 902N in TABLE 1 with the unit transistor width being equal to the total width of 3200 μm or 9600 μm divided by the total of the weightings of 677. (It is noted that the technique depicted in FIG. 9C is utilized for any of the smallest transistor widths that fall below the minimum width allowed by the semiconductor manufacturing process utilized.) The transistor lengths are not varied and are all 0.35 μm. The total impedance for all of the transistor switches (S$_{Pi}$,S$_{Ni}$, S$_{PNi}$) 908P, 908N and 1210 is about 0.22 Ω for worst case conditions.

Figure 15:
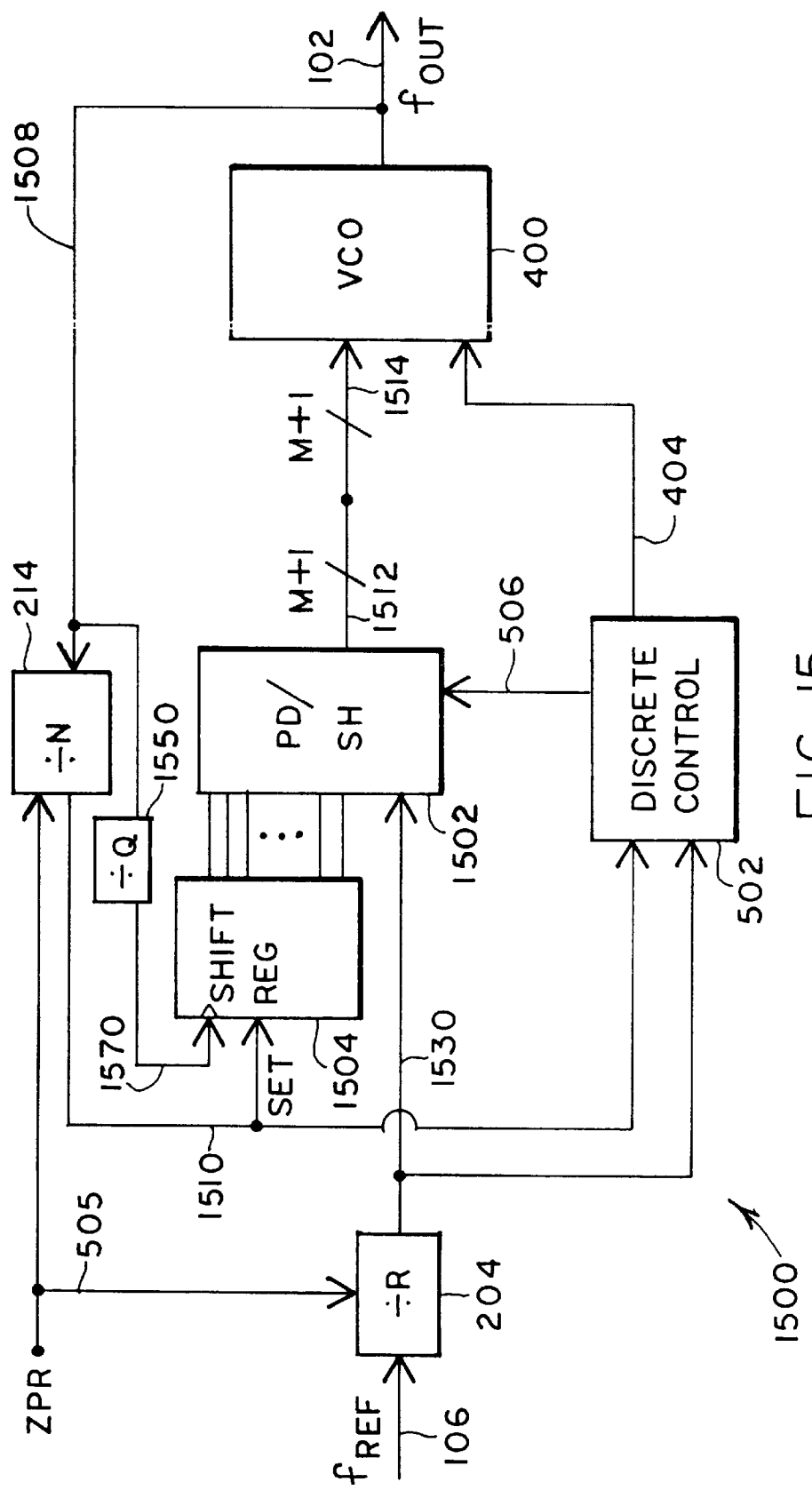
FIG. 15 is a block diagram of a frequency synthesizer utilizing a digital and analog VCO implementation according to the present invention.

The techniques discussed above have been shown with reference to a frequency synthesizer in which the fine tuning analog control is accomplished with standard PLL components. For example with reference to FIG. 5, a phase detector 206, a charge pump 208, and a loop filter 210 may be used to provide the voltage control for a voltage controlled oscillator. However, in order to more easily integrate the PLL within a single integrated circuit, an alternative PLL design may be utilized. For example, as shown in FIG. 15, a PLL 1500 may be formed in which the phase detector 206, charge pump 208, and loop filter 210 are replaced with a shift register 1504 and a phase detector/sample hold circuit 1502 which has M+1 outputs 1512 which may be switched to the M+1 control inputs 1514 of the VCO 400. The PLL 1500 provides the digital course tuning under control of the discrete control circuit 502 as described above. The fine tuning analog control is provided through the use of the divide-by-R block 204, divide-by-N block 214, divide-by-Q block 1550, the shift register 1504 and the phase detector/sample hold circuit 1502.

Figure 16:
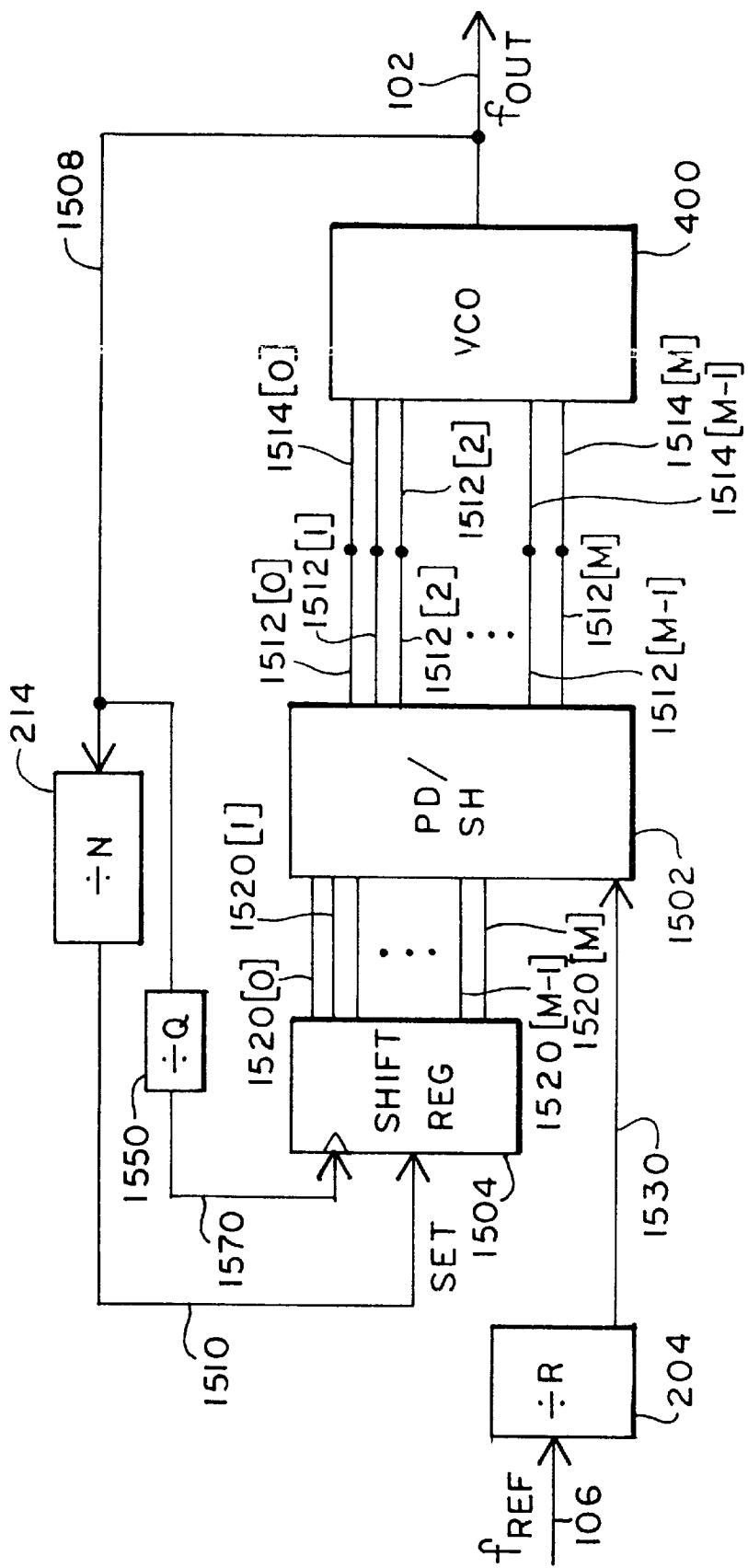
FIG. 16 is a block diagram of the analog control loop of the frequency synthesizer of FIG. 15.

FIG. 16 illustrates the PLL 1500 of FIG. 15 during the fine tuning mode of operation (i.e after coarse tuning is completed). In FIG. 16, only the analog control portions of the PLL are shown. As shown in FIG. 16, a VCO 400 (such as, for example, VCO 400 of FIG. 4) provides an output frequency ($f_{out}$) 102. As shown in FIG. 16, the VCO input control signals 408 of FIG. 4 have been replaced by a M+1 voltage control inputs 1514. The output 102 is provided through control line 1508 to the divide-by-N circuit 214. An output 1510 of the divide-by-N circuit 214 is provided to a shift register 1504. The shift register 1504 is clocked by the output 1570 of the divide-by-Q block 1550 as shown. Parallel outputs 1520 [0, 1, 2, . . . M-1,M] of the shift register 1504 are provided to the phase detector/sample hold circuit 1502. The output 1530 of the divide-by-R circuit 204 is also provided to the phase detector. As will be described in more detail below, each of the outputs 1520 of the shift register 1504 has the same frequency ($f_{OUT}/N$), i.e. the update rate of the PLL, but is incrementally shifted in phase from each other. The phase detector/sample hold circuit 1502 detects the phase differences between the output 1530 of the divide-by-R circuit 204 and each of the outputs 1520[0, 1, 2, . . . M] of the shift register 1504. Outputs 1512[0, 1, 2, . . . M] of the phase detector/sample hold circuit 1502 provide control voltages indicative of the detected phase differences. These control voltages are in turn coupled to the inputs 1514[0, 1, 2, . . . M-1,M] of the VCO 400 through which fine tuning control of the VCO may be achieved (as described below). Thus, rather than VCO 400 being provided a single analog control voltage, a plurality of control voltages may be provided. As discussed below, in one embodiment twenty outputs may be provided from the shift register to generate twenty outputs of the phase detector/sample hold circuit 1502 and twenty inputs to the VCO. Because the shift register 1504 produces a series of outputs, each shifted in phase, the control voltages provided to the VCO will be a series of voltages offset from each other.

The use of multiple analog inputs to perform the fine control of the VCO may be seen with reference to FIGS. 4 and 15–18. As discussed above with reference to FIG. 4, the fine analog control of the VCO 400 may be achieved through the use of the continuously variable capacitance ($C_A$) 406. As shown in FIG. 4, the continuously variable capacitance ($C_A$) 406 is controlled by the voltage control signal ($V_C$) 408. It will be recognized that the circuitry of FIG. 4 may be implemented with the PLL 1500 of FIGS. 15 and 16 by using the plurality of voltage control inputs 1514[0, 1, 2, 3, . . . M-1, M] to replace the voltage control signal ($V_C$) 408.

Figure 17B:
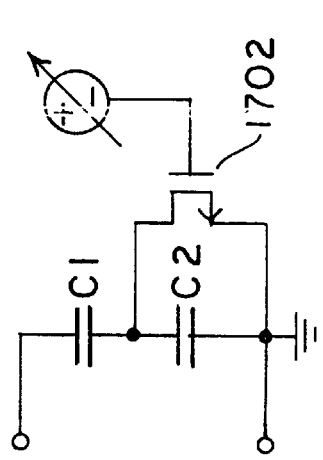
FIGS. 17A, 17B, 17C and 17D are circuit diagrams of embodiments of a continuously variable capacitor circuit.
Figure 17A:
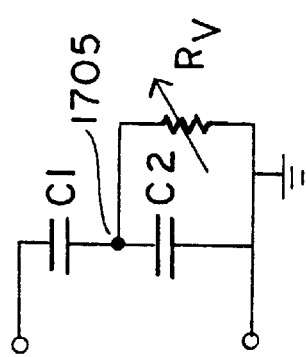
Figure 17C:
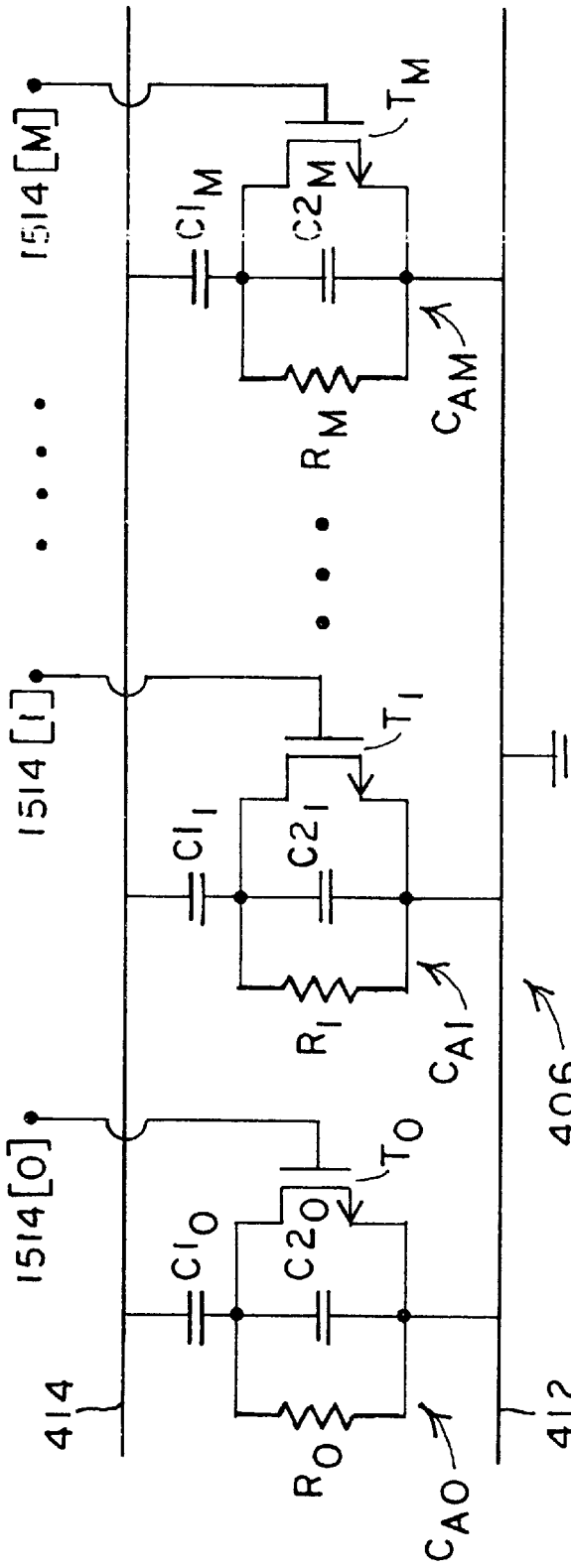

FIG. 17A illustrates one exemplary embodiment of a variable capacitance circuit 1700 which includes capacitors C1 and C2 and a variable impedance device $R_v$. The equivalent capacitance seen at the inputs to the circuit 1700 will change depending upon the value of the variable impedance device $R_v$ that is coupled to a control node 1705. FIG. 17B illustrates the variable capacitance circuit 1700 wherein the variable impedance device is a transistor 1702 having a gate controlled by an analog voltage source. A plurality of the devices of FIG. 17B may be utilized to provide the variable capacitance ($C_A$) 406 of FIG. 4 under control of the plurality of voltage control inputs 1514[0, 1, 2, 3, . . . M-1, M] of FIG. 16. For example, FIG. 17C illustrates how the variable capacitance ($C_A$) 406 may be comprised of a plurality of variable capacitance circuits $C_{A0}$, $C_{A1}$, . . . $C_{AM}$ such that $C_A=C_{A0}+C_{A1}+ . . . +C_{AM}$. Each capacitance circuit has a variable equivalent capacitance respectively controlled by the control voltage 1514[0], 1514[1], . . . or 1514[M]. The transistors $T_0$, $T_1$, . . . $T_M$ act as variable control elements having a variable resistance in response to the analog control voltages. Each variable capacitance circuits $C_{A0}$, $C_{A1}$, . . . $C_{AM}$ includes a resistor ($R_0$, $R_1$, . . . or $R_M$ respectively) not shown in the circuit 1700 of FIGS. 17A and 17B. Each resistor $R_0$, $R_1$, . . . $R_M$ is provided to prevent the node between the capacitors C1 and C2 from floating when the respective transistor $T_0$, $T_1$, or $T_M$ is fully turned off. The resistors $R_0$, $R_1$, . . . $R_M$ may be formed from transistors sized to provide a resistance that is approximately 40 times the impedance of the sum of the capacitors C1 and C2 at oscillation frequencies.

Figure 17D:
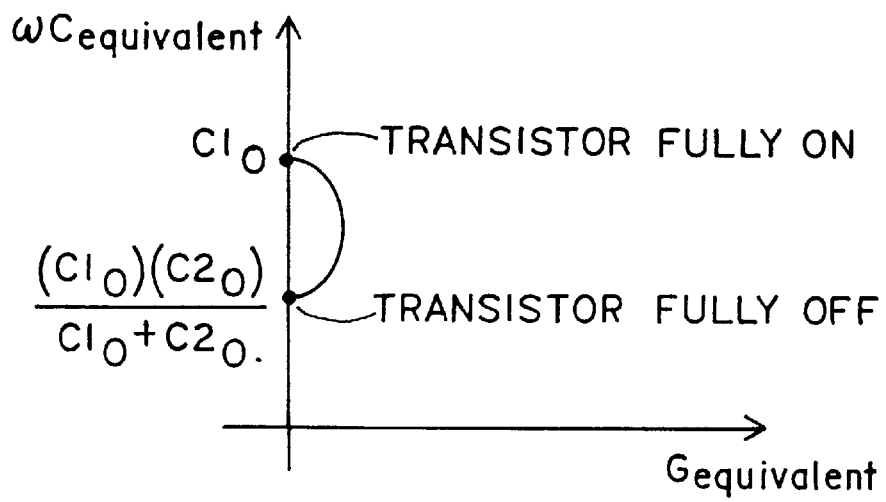

The operation of an individual variable capacitance circuit will be described with reference to capacitance circuit $C_{A0}$. As shown in FIG. 17C, capacitance circuit $C_{A0}$ includes capacitors $C1_0$ and $C2_0$, resistor $R_0$ and the n-channel transistor $T_0$. The complex admittance seen across the capacitance circuit $C_{A0}$ may be characterized as $Y_{A0}(j\omega)= j\omega C_{equivalent}+G_{equivalent}$. Further, assuming the resistance value $R_0$ is large compared to the impedance of the capacitors, as the control voltage 1514[0] rises, the transistor will turn on more fully and the capacitance $C_{equivalent}$ will approach $C1_0$. Similarly, as the control voltage 1514[0] approaches zero, the transistor will turn off and the capacitance for $C_{equivalent}$ will approach the value of $(C1_0)(C2_0)/(C1_0+C2_0)$. As analog control voltages between the two extremes are generated, the capacitance $C_{equivalent}$ will pass through all the capacitance points between the two values given above. The conductance $G_{equivalent}$ of the circuit $C_{A0}$ will also vary depending upon the control voltages. At both extremes of the analog control voltages, $G_{equivalent}$ will approach zero. FIG. 17D illustrates $\omega C_{equivalent}$ vs. $G_{equivalent}$ as the control voltage on transistor $T_0$ goes from a level to fully turn on the transistor to a level to fully turn off the transistor. As can be seen, the locus of points forms a semi-circle.

Thus, as the voltage level of an individual control voltage 1514[0] increases the capacitance $C_{A0}$ will increase which thus increases the capacitance $C_A$. An increase in the capacitance $C_A$ in turn lowers the output frequency of the VCO 400. In this manner, higher control voltages result in lower VCO output frequencies.

Figure 18:
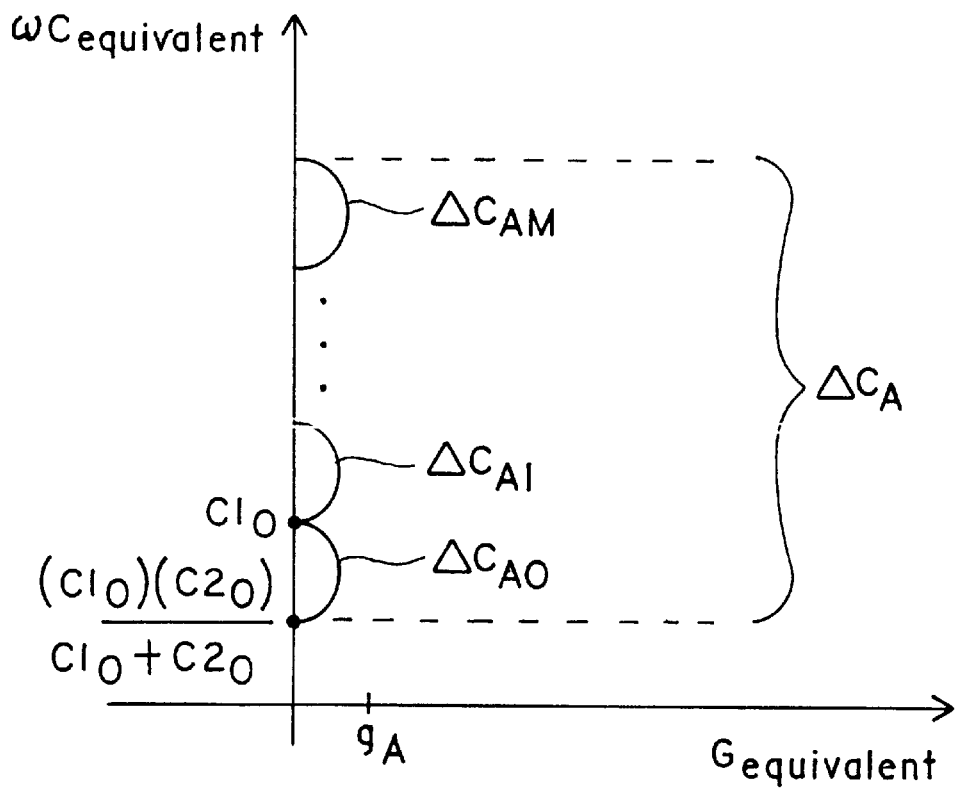
FIG. 18 is a capacitance verses conductance graph of the circuit of FIG. 17C.

As noted above with reference to FIG. 17C, a plurality of the capacitance circuits ($C_{A0}$, $C_{A1}$, . . . $C_{AM}$) may be utilized and the continuously variable capacitance $C_A$ 406 is a result of the summation of the individual capacitance circuits. The overall conductance ($G_{equivalent}$ for $C_A$) of all of the capacitance circuits operating together, however, does not increase beyond the $G_{equivalent}$. FIG. 18 demonstrates this concept. FIG. 18 demonstrates $\omega C_{equivalent}$ vs. $G_{equivalent}$ over for the continuously variable capacitance $C_A$ 406. As shown in FIG. 18 for illustrative purposes, the additive effect of incrementally fully turning on each transistor $T_0$, $T_1$, . . . $T_M$ is displayed. As can be seen, the total capacitance range for $C_A$ ($\Delta C_A$)(the sum of the ranges of the individual capacitance circuits) may be relatively large, without a corresponding large change in conductance. This characteristic of the circuit of FIG. 17C helps minimize phase noise since the phase noise for the circuit is proportional to $G_{equivalent}$. Thus, a wide capacitance range for the continuously variable capacitance $C_A$ 406 is provided without causing excessive phase noise. It may also be noted that as the control voltage on each control line 1514[0, 1, . . . or M] changes from rail to rail, only a fraction of the total capacitance range is changed (i.e. where M+1=20 only $\frac{1}{20}^{th}$ of the total capacitance range). Thus, noise on any one particular control line will only have a minimal impact on the total capacitance $C_A$.

As seen in FIG. 18, the capacitance for each individual capacitance circuit is shown not to overlap an adjacent circuit for illustrative purposes. However, in operation the values chosen for C1 and C2, the nominal frequency of oscillation, and the size of the transistor for each circuit and the time at which each circuit is activated may be such that the individual portions of the graph of FIG. 18 may overlap.

Figure 19:
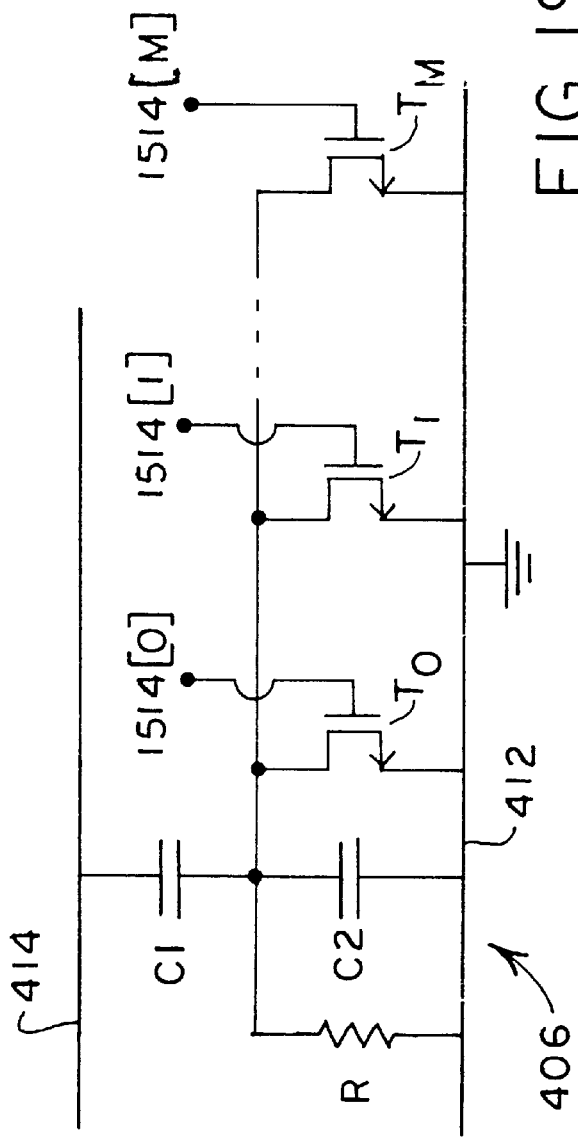
FIG. 19 is an alternative embodiment of a continuously variable capacitor circuit.

The use of multiple control voltages to provide the continuous analog fine control of the VCO may be accomplished in a wide range of manners, and the embodiment shown herein is just one example. FIG. 19 illustrates yet another embodiment for implementing the continuously variable capacitance $C_A$ 406. As shown in FIG. 19, the continuously variable capacitance $C_A$ 406 may be comprised of two capacitors C1 and C2, resistor R, and a plurality of transistors $T_0$, $T_1$, . . . $T_M$ controlled by the control voltages 1514[0], 1514[1] . . . 1514[M] respectively.

The capacitance value of the continuously variable capacitance $C_A$ 406 (and the associated output frequency of the VCO) of FIG. 16 will be dependent upon the voltages present upon the control voltage lines 1514. Further by utilizing the control techniques discussed below, a relatively linear continuously variable capacitance $C_A$ 406 may be obtained even though each individual capacitance circuit $C_{A0}$, $C_{A1}$, . . . $C_{AM}$ may exhibit non-linear behavior.

The generation of the control voltages is described below with reference to FIGS. 16 and 20–25. As shown in FIG. 16 the output frequency signal 102 is provided through feedback line 1508 to a divide-by-N circuit 214. The divide-by-N circuit 214 may be programmable based upon user provided data stored in an N register as described above. The divide-by-N circuit divides the frequency provided on line 1508 to a lower frequency signal provided on line 1510. Any of a wide number of circuits may be utilized to perform the division function. Because of the high frequencies encountered at the frequency output 102, it may be advantageous to utilize standard prescaler techniques when implementing the divide-by-N circuit. Such techniques for high frequency signals are well known such as shown, for example, in J. Craninckx and M. S. Steyaert, "A 1.75-GHz/3-V Dual-Modulus Divide-by-128/129 Prescaler in 0.7-$\mu$m CMOS," IEEE J. Solid-State Circuits, vol. 31, pp. 890–897, July 1996; B. Chang, J. Park, and W. Kim, "A 1.2 GHz CMOS Dual-Modulus Prescaler Using New Dynamic D-Type Flip-Flops," IEEE J. Solid-State Circuits, vol. 31, pp. 749–752, May 1996; and H.-I H Cong, J. M. Andrews, D. M. Boulin, S.-C. Fang, S. J. Hillenius, and J. A. Michejda, "Mutigigahertz CMOS Dual-Modulus Prescaler IC," IEEE J. Solid-State Circuits, vol. 23, pp. 1189–1194, October 1988.

The output line 1510 of the divide-by-N circuit 214 is provided to a shift register 1504. The output 1510 is utilized to SET the multi-output shift register 1504. In operation, when the SET signal is low on line 1510, clocking of the shift register outputs is allowed and when the SET signal is high the shift register outputs are set high. Thus, the shift register is set based upon the PLL update rate ($f_{OUT}/N$). The shift register 1504, however, is clocked at a higher frequency, such as $f_{OUT}/Q$ as shown. Alternatively, the shift register 1504 may be clocked by $f_{OUT}$ directly, however, the high frequencies of $f_{OUT}$ may exceed the clocking speed limits of the shift register and thus the divide-by-Q block 1550 may be desireable. Typical values for Q may be programmable, for instance to values of 8, 16, 32, and 64 (for RF1), 4, 8, 16, or 32 (for RF2), and 2, 4, 8, or 16 (for IF). Thus, a signal propagates through the shift register 1504 (and is provided at the shift register outputs) at the high $f_{OUT}/Q$ frequency to provide a plurality of signals, each at a frequency of $f_{OUT}/N$ (the PLL update rate) but each with falling edges out of phase with the others by increments of the $Q/f_{OUT}$ period. Though the input of the divide-by-Q block 1550 is shown as being the four signal for illustrative purposes, the divide-by-Q input may be a sub-signal within the divide-by-N block 214 utilized to obtain the desired $f_{OUT}/Q$ result.

Figure 20:
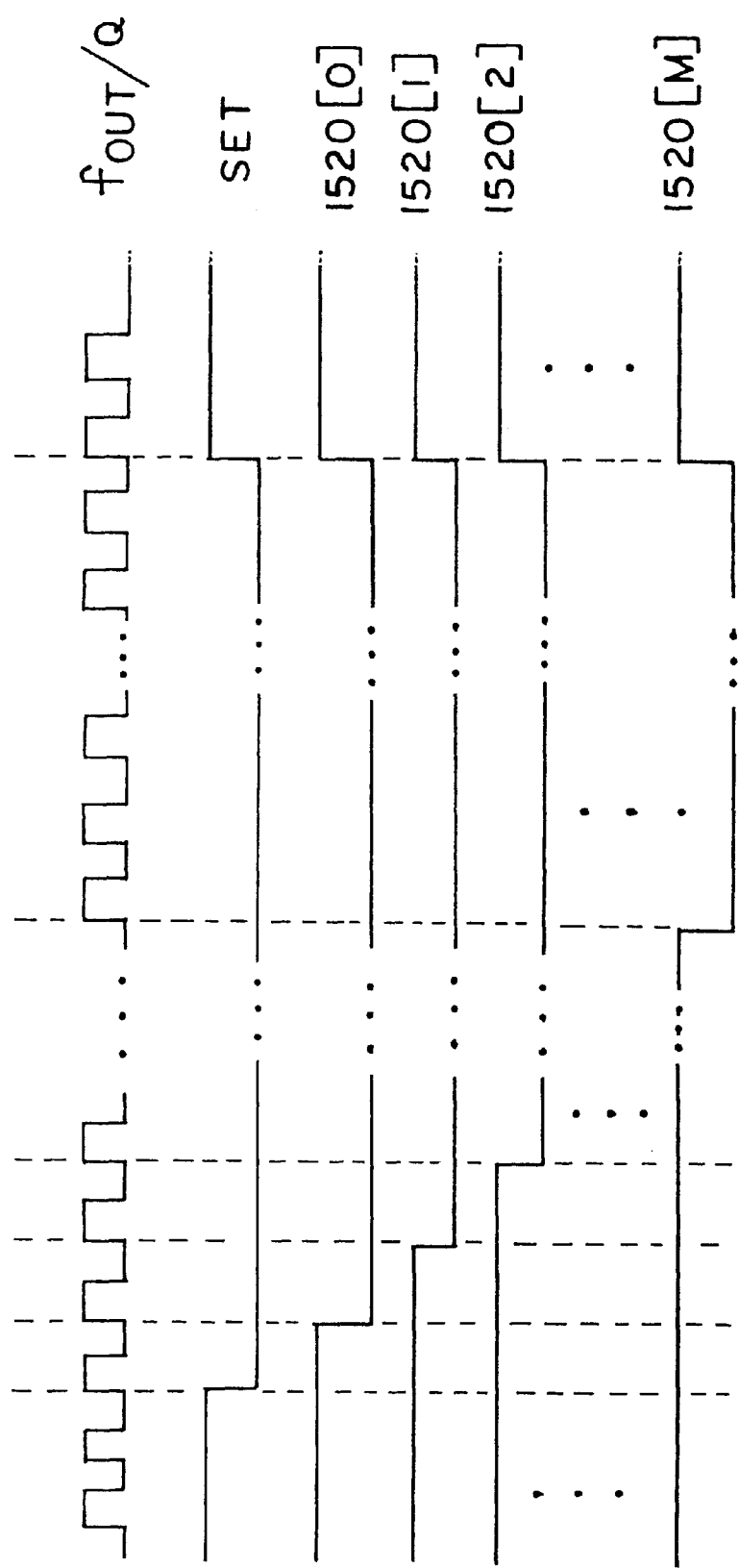
FIG. 20 is a shift register timing diagram.

The generation of the shift register outputs may be seen with more detail with reference to the shift register timing diagram shown in FIG. 20. As shown in FIG. 20, the $f_{OUT}/Q$ signal is provided to clock the shift register at a higher frequency than the frequency of the SET signal ($f_{OUT}/N$). When the SET signal goes low, the shift register is clocked. Based upon edges of the $f_{OUT}/Q$ signal, a low signal propagates through the shift register outputs 1520[0], 1520[1], 1520[2], . . . 1520[M] as shown. When the SET signal returns high, the shift register outputs are set to their original high state. In this manner a series of signals (the shift register outputs) are generated that have falling edges each slightly out of phase from the adjacent signal, each having a frequency at the PLL update rate $f_{OUT}/N$. This series of signals may then be provided to the phase detector/sample hold circuit 1502. Though the $f_{OUT}/Q$ signal is shown in FIG. 20 as continuously clocking the shift register, power usage may be decreased by only turning on the clock input for times between the falling edge of the SET signal 1510 and the last falling edge of the shift register output (1520[M]).

Figure 21:
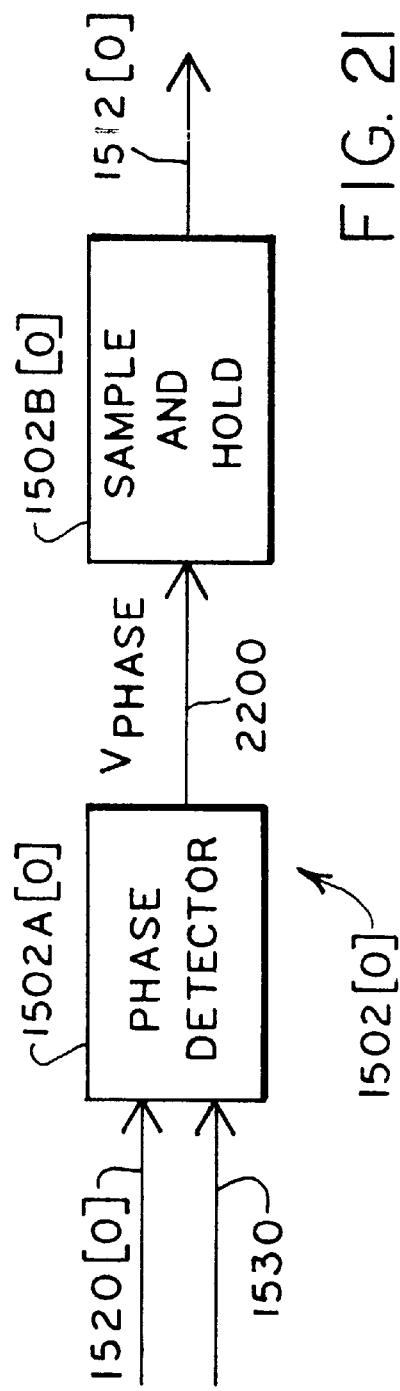
FIG. 21 is a function block diagram of a phase detector/sample hold circuit.

The technique described herein to provide a plurality of signals for the phase detector/sample hold circuit 1502 is useful over a wide range of applications, including the generation of high frequency signals for wireless telephones. For example, in a typical PLL embodiment for use with the GSM standard having 200 kHz channels, four may be 900 MHz, Q may be 4, N may be 4500 to provide a SET signal at 200 kHz (i.e. the update period is 5000 nsec.). In this case, one output of the shift register changes approximately every 4.44 nsec., and if M+1=20, all the outputs of the shift register will have changed states during the first 88.8 nsec. after the SET signal goes low. Typically the value of Q may be programmed so that $(M+1)(Q/f_{OUT})$, i.e. the maximum time required for all outputs of the shift register to change, is approximately 2% of the entire update period ($N/f_{OUT}$). The phase detector/sample hold circuit 1502 operates to compare the phases of the shift register outputs 1520[0], 1520[1], 1520[2], . . . 1520[M] to the output 1530 ($f_{REF}/R$) of the divide-by-R circuit 204. Voltage outputs 1512[0], 1512[1], 1512[2], . . . 1512[M] of the phase detector/sample hold circuit 1502 are provided at voltage levels dependent upon the phase differences detected. A functional block diagram of a portion of the phase detector/sample hold circuit 1502 is shown in FIG. 21. FIG. 21 illustrates the function of a portion 1502[0] of the phase detector/sample hold circuit 1502 with reference to one shift register output, for example, output 1520[0]. Thus, the phase difference between shift register output 1520[0] and the divide-by-R output 1530 is obtained in a phase detector 1502A[0]. The phase detector 1502A[0] provides an output 2200 which is at a voltage $V_{PHASE}$. The voltage level of $V_{PHASE}$ is dependent upon the detected phase difference. More particularly, $V_{PHASE}=(k_P)(\Delta\theta)$ where $k_P$ is a gain factor of the phase detector 1502A[0] and $\Delta\theta$ is the detected phase difference. The output 2200 ($V_{PHASE}$) is then provided to a sample and hold circuit 1502B[0] which generates the output 1512[0]. The output 1512[0] may then be provided as a control voltage input to the VCO 400 as shown in FIG. 16.

Figure 22:
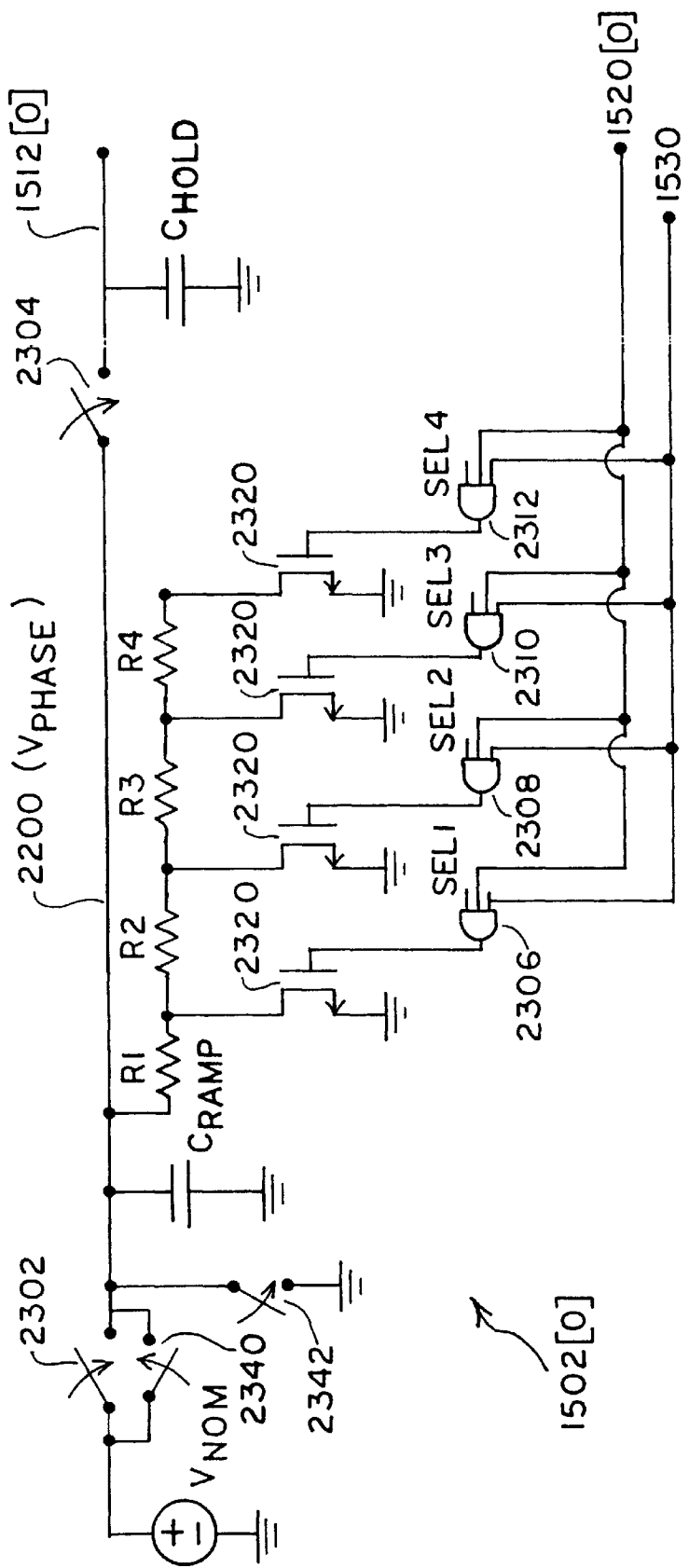
FIG. 22 is a diagram of a phase detector/sample hold circuit.
Figure 24A:
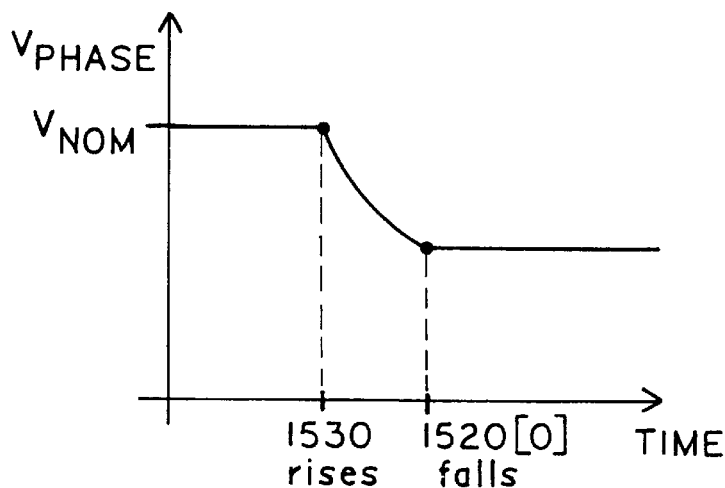
FIG. 24A and 24B are timing diagrams of a voltage node of the circuit of FIG. 22.
Figure 24B:
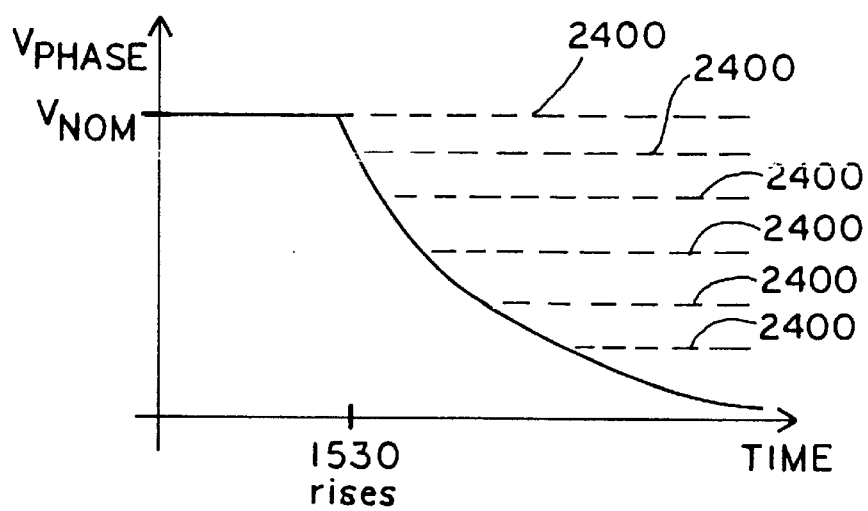

A circuit 1502[0] for implementing the phase detector 1502A[0] and sample and hold circuit 1502B[0] of FIG. 21 is shown in FIG. 22. As shown in FIG. 22, a voltage $V_{NOM}$ is coupled to a capacitor $C_{RAMP}$ by closing a charge switch 2302 (at this point calibration switches 2340 and 2342 will be opened as discussed below with reference to calibration techniques). In operation, before a phase difference is to be detected, charge switch 2302 is closed to allow capacitor $C_{RAMP}$ and the $V_{PHASE}$ line 2200 to charge up to $V_{NOM}$ (at this point sample/hold switch 2304 is open). Then the charge switch 2302 is opened. Subsequently, charge begins to be removed from the capacitor $C_{RAMP}$ by turning on one of the transistors 2320. However, the one transistor 2320 that is turned on is only turned on for a time period indicative of the phase difference between the divide-by-R output signal 1530 and the shift register output 1520[0]. In this manner the voltage on the $V_{PHASE}$ line 2200 will be related to the phase difference. FIG. 24A illustrates the voltage levels for $V_{PHASE}$. As seen in FIG. 24A, after the charge switch 2302 is opened $V_{PHASE}$ is initially at $V_{NOM}$. Then when the divide-by-R output signal 1530 rises, $V_{PHASE}$ begins to fall. When the shift register output 1520[0] also falls, the transistor 2320 is turned off and $V_{PHASE}$ is held constant. As shown in FIG. 24B, the final value of $V_{PHASE}$ will vary as indicated by the dotted lines 2400 depending on the phase difference between the divide-by-R output signal 1530 and the shift register output 1520[0] (each dotted line indicative of a different phase difference). In situations where the edge of the $f_{OUT}/N$ clock leads the edge of the $f_{REF}/R$ edge, the $V_{PHASE}$ signal will not drop, and thus, $V_{PHASE}$ will remain at $V_{NOM}$.

Figure 23:
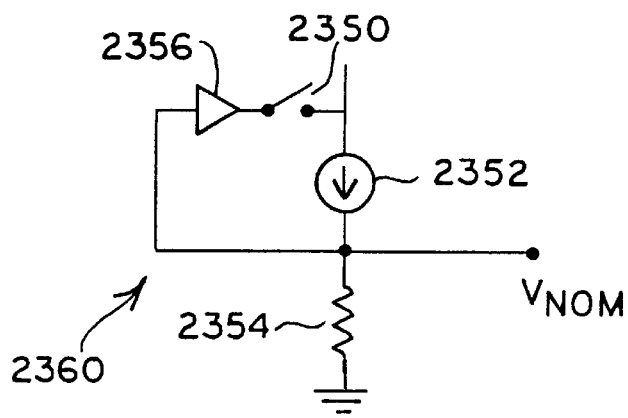
FIG. 23 is a voltage generator for use with the circuit of FIG. 22.

One embodiment of a circuit for generating $V_{NOM}$ is shown in FIG. 23. The voltage circuit 2360 includes a current source 2352, a resistor 2354 and an amplifier 2356. The feedback loop through amplifier 2356 helps improve the noise characteristics of the amplifier. In operation, the switch 2350 may be open to allow charge to be delivered in open loop conditions and then closed to also allow charge to be delivered in closed loop conditions. Typically, a majority of the charge may be delivered in open loop conditions so as to keep power supply current constant. In one embodiment, $V_{NOM}$ may be a 1.9 V voltage source.

As mentioned above with reference to FIG. 22, only one transistor 2320 is turned on at any given time. Multiple transistors 2320 are provided so that a selectable resistance between the $V_{PHASE}$ 2200 and ground may be provided. In this manner the rate of decay of $V_{PHASE}$. The rate of decay will impact the number of individual capacitance circuits $C_{A0}, C_{A1} \ldots C_{AM}$ which are operating in their active range at any given time. The desired gain is controlled by selectively providing a high signal on one of the SEL1, SEL2, SEL3, or SEL4. In this manner, only one of the AND gates 2306, 2308, 2310, and 2312 will provide a high output, and thus, only one of the transistors 2320 will on and off in response to the rising and falling edges of the signals on lines 1530 and 1520[1].

The sample/hold function of the circuit 1502[0] is implemented through use of the sample/hold switch 2304 and the $C_{HOLD}$ capacitor. After the phase difference has been detected as described above, the sample/hold switch 2304 is closed. Thus, charge is now shared between the capacitors $C_{RAMP}$ and $C_{HOLD}$ and the voltage level on output line 1512[0] will change in response to the detected phase difference and on the voltage on $C_{HOLD}$ before the switch is closed. After the voltage on output 1512[0] provided to the VCO 400 has settled, sample/hold switch 2304 is opened again and the phase detection cycle may start again. Because of the charge sharing between the capacitors $C_{RAMP}$ and $C_{HOLD}$, the voltage level on output 1512[0] after a current phase detection cycle will depend on the charge on $C_{HOLD}$ during the previous phase detection cycle and the currently detected phase difference. Typically the capacitance ratio of $C_{RAMP}$ to $C_{HOLD}$ may be 2:1. The charge sharing operates to perform sample data filtering in which the filtering characteristics improve phase noise at the expense of transient response since the voltage change at each update will be lessened but the time to reach a desired voltage will increase. In this manner a control voltage indicative of the phase difference between one of the signals 1520 and the divide-by-R output 1530 may be provided to one of the inputs 1514 of the VCO 400.

Figure 24C:
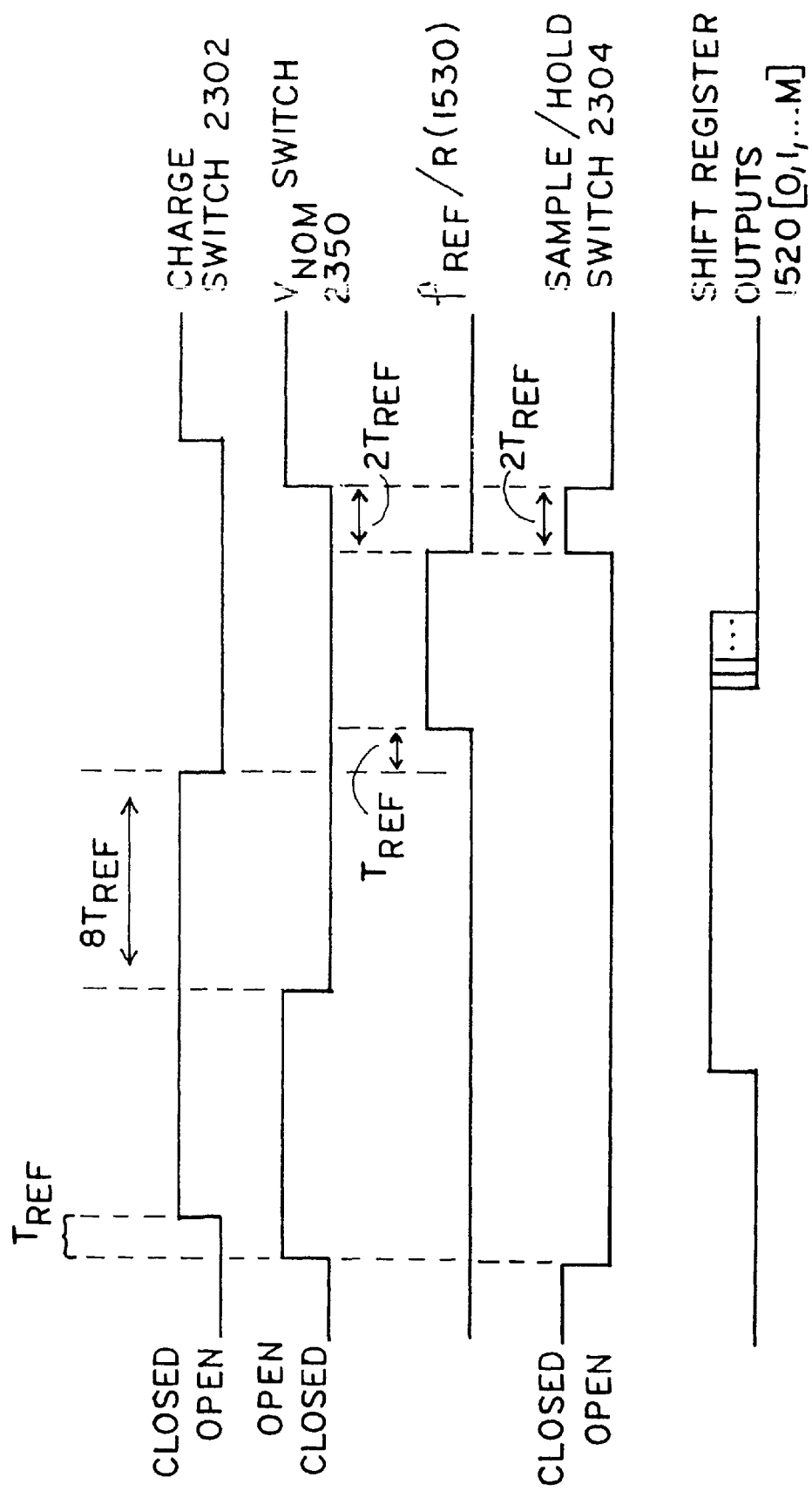
FIG. 24C is a timing diagram for the circuit of FIG. 22.

FIG. 24C illustrates a timing diagram for the phase detector/sample hold circuit 1502. In FIG. 24C the operation of the charge switch 2302, $V_{NOM}$ switch 2350 and sample/hold switch 2304 are shown in relation to the $f_{REF}/R$ output 1530 and the shift register outputs 1520[0, 1, . . . M]. As shown in FIG. 24C, the falling edges of the M+1 outputs of the shift register are each incrementally out of phase of the adjacent output. All of the signals in FIG. 24C except the shift register outputs are clocked by the reference clock 106 ($f_{REF}$). The period of the reference clock is shown in the figure as $T_{REF}$.

Figure 25:
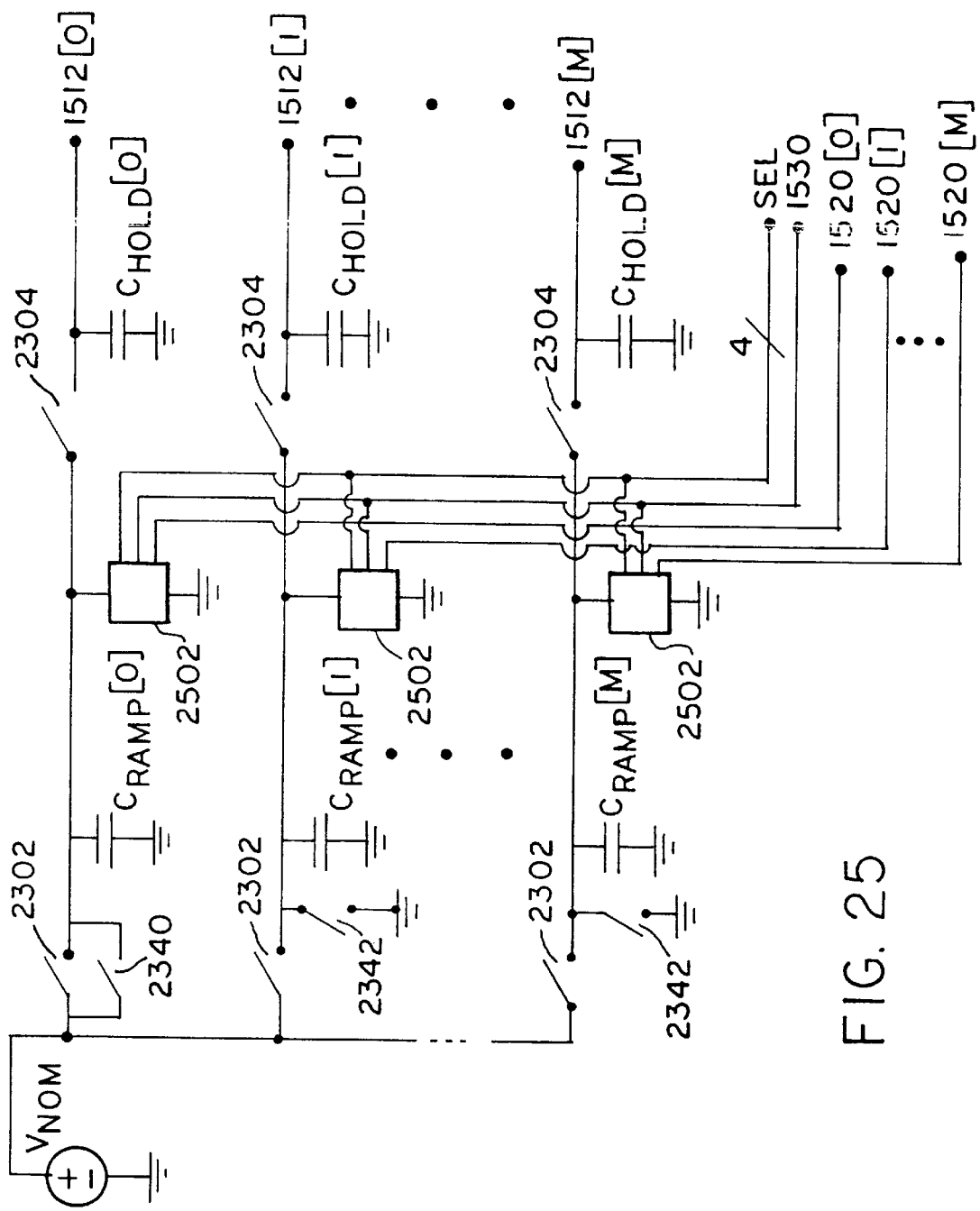
FIG. 25 is a block diagram of an implementation of a plurality of the circuits of FIG. 22.

As discussed above, FIG. 22 shows a portion of the phase detector/sample hold circuit 1502 for performing the phase detection for one of the outputs of the phase detector/sample hold circuit 1502. To perform the mult-line phase detection of FIG. 16, a plurality of the circuits 1502[0] of FIG. 22 may be used as shown in FIG. 25. In the circuit of FIG. 25, the resistors R1, R2, R3, and R4, transistors 2320, and gates 2306, 2308, 2310, and 2312 shown in FIG. 22 have been combined in control blocks 2502 for ease of illustration. In operation, each of the charge switches 2302 operates in unison and each of the sample/hold switches 2304 operates in unison. Likewise all the SEL signals are applied together. Thus, during one phase detection cycle, the phase difference between the divide-by-R output signal 1530 and each of the falling edges of the M+1 shift register outputs 1520 is detected and applied to the phase detector/sample hold outputs 1512. Because falling edges of each of the shift register output 1520[0, 1, ... M] are incrementally out of phase with the adjacent output, each of the phase detector/sample hold outputs 1512[0, 1, ... M] will be at different voltage level.

As mentioned above, each portion of the phase detector/sample hold circuit 1502 may include a calibration switch, such as calibration switch 2340 or 2342 of FIG. 22. As shown in FIG. 25, half of the outputs 1512 will connect to circuitry containing switch 2340 and half to circuitry containing switch 2342. During digital or coarse tuning, the switches 2340 will be closed to provide $V_{NOM}$ to half of the outputs and the switches 2342 will be closed to provide ground to the other half of the outputs. Thus, for example, during coarse tuning output 1512[0] may be provided $V_{NOM}$ and output 1512[1] may be provided ground. In operation this allows the digital control to be performed at approximately the center of the range of the analog variable capacitance $C_A$.

The generation of a plurality of control voltages for control of the VCO 400 in the manner described above in which each voltage is offset from the adjacent control voltage is particularly advantageous when combined with the VCO circuit of FIGS. 4 and 17C. As shown in FIG. 17C, the continuously variable capacitance ($C_A$ 406 is formed from the sum of the individual capacitance circuits $C_{A0}$, $C_{A1}$, ... $C_{AM}$. Each individual capacitance circuit has a nonlinear relationship between the phase of $f_{OUT}$ and the resulting capacitance of the one capacitance circuit. However, utilizing a plurality of capacitance circuits controlled with voltages generated according to the techniques described above yields a relatively linear relationship between the phase and the total capacitance $C_A$. The ability to obtain a relatively linear relationship between the phase and the total capacitance $C_A$ may be seen with reference to FIGS. 26–32.

Figure 26:
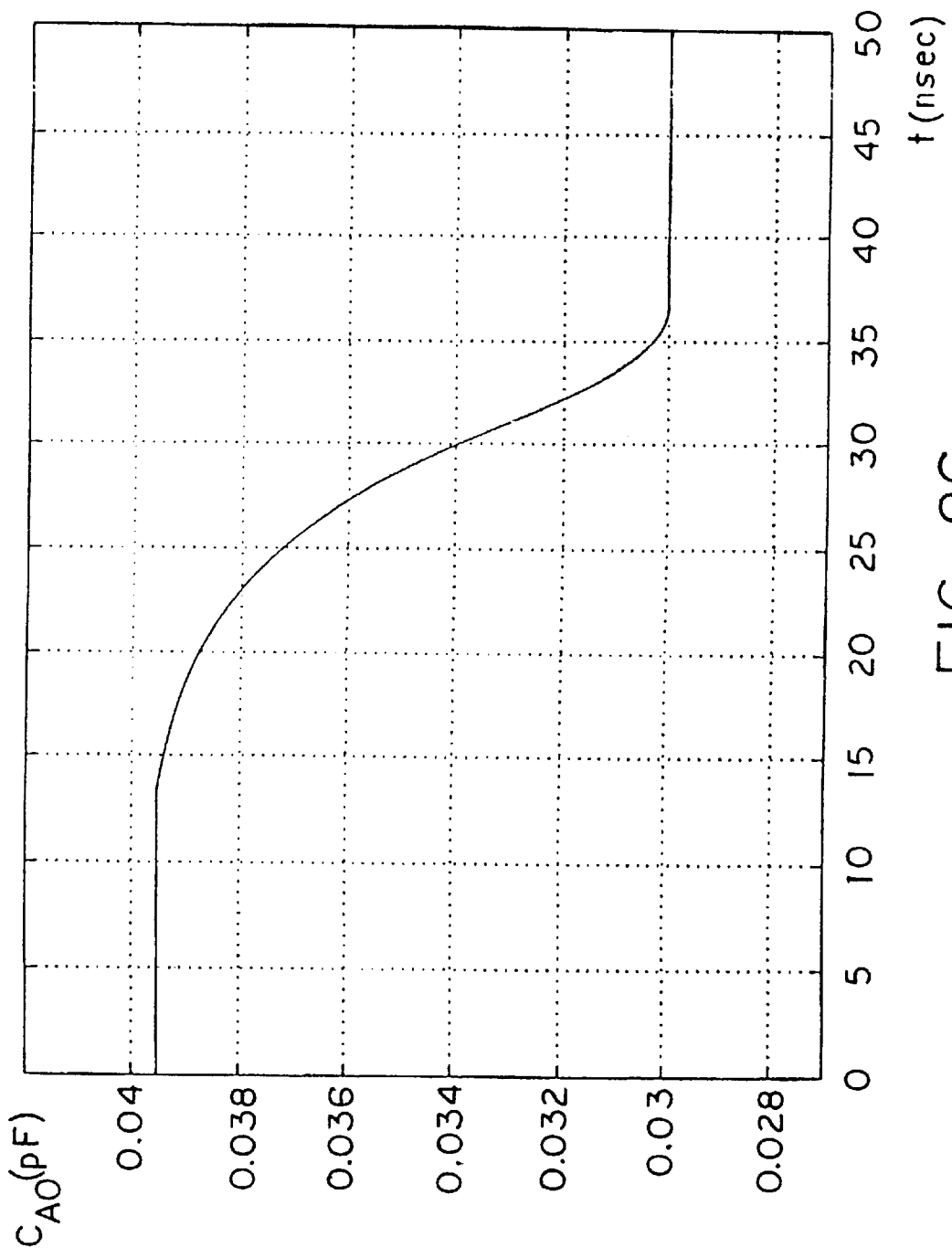
FIGS. 26–31 are diagrams of the transfer function characteristics of the analog control techniques.
Figure 27:
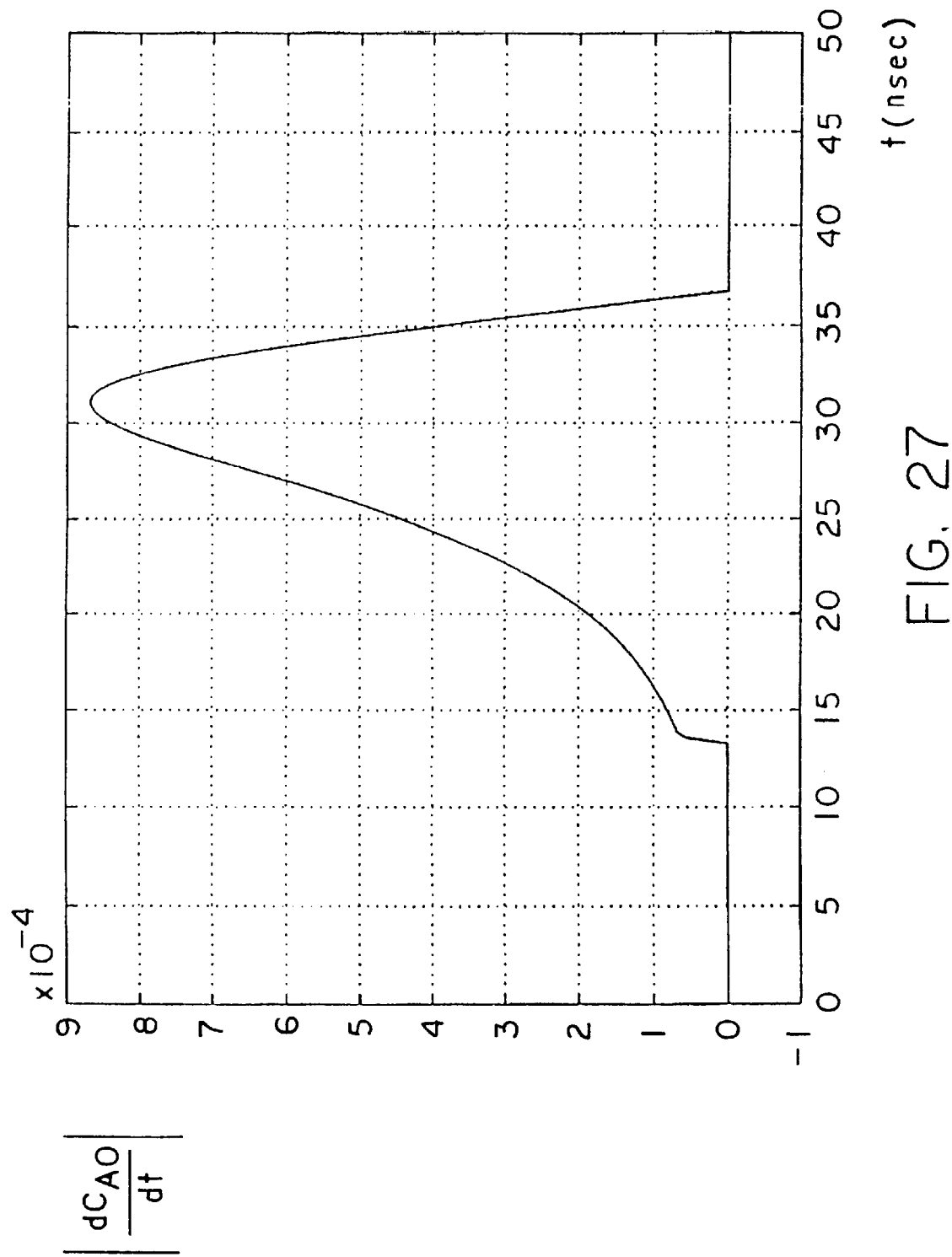
Figure 28:
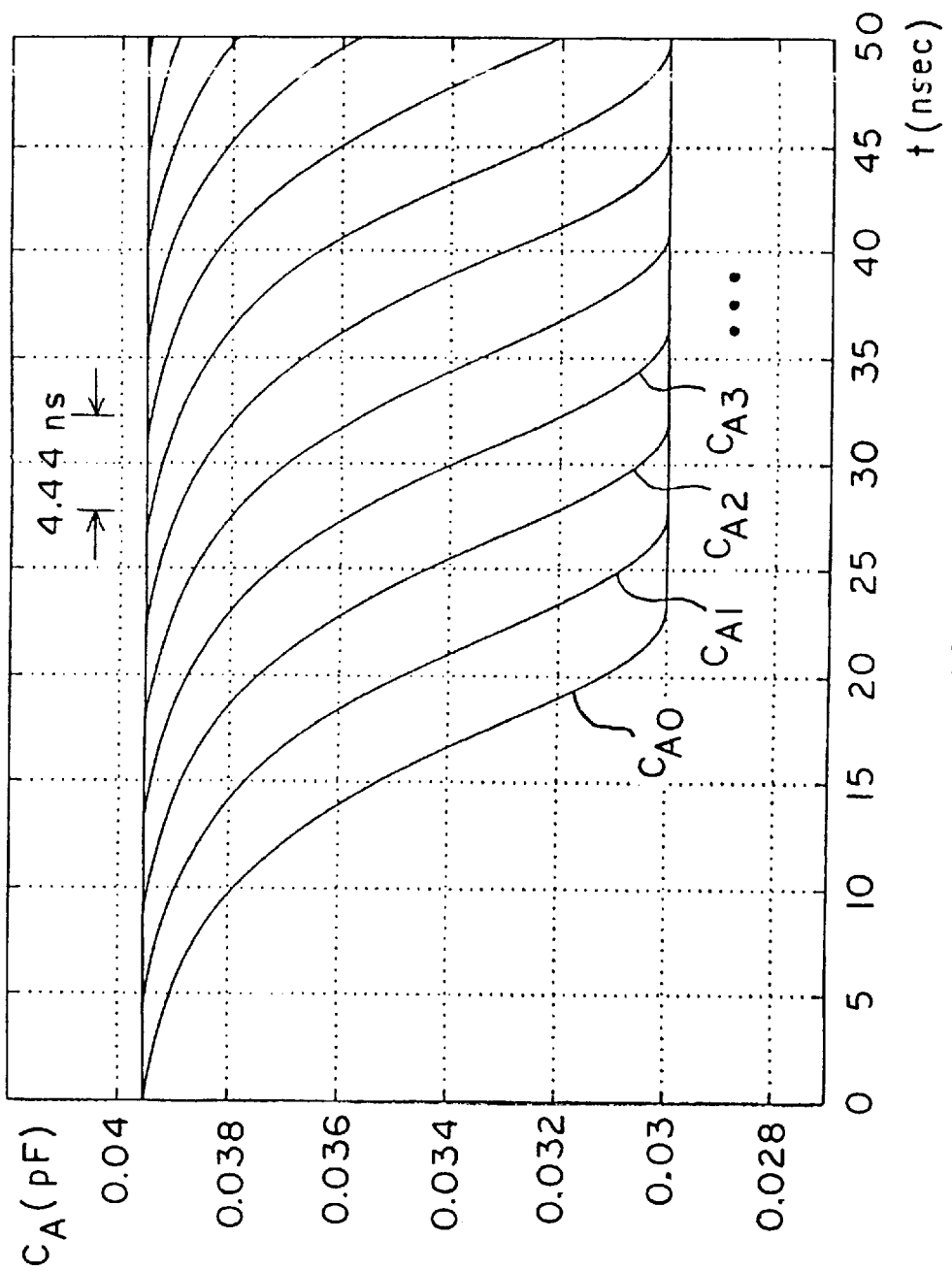
Figure 28A:
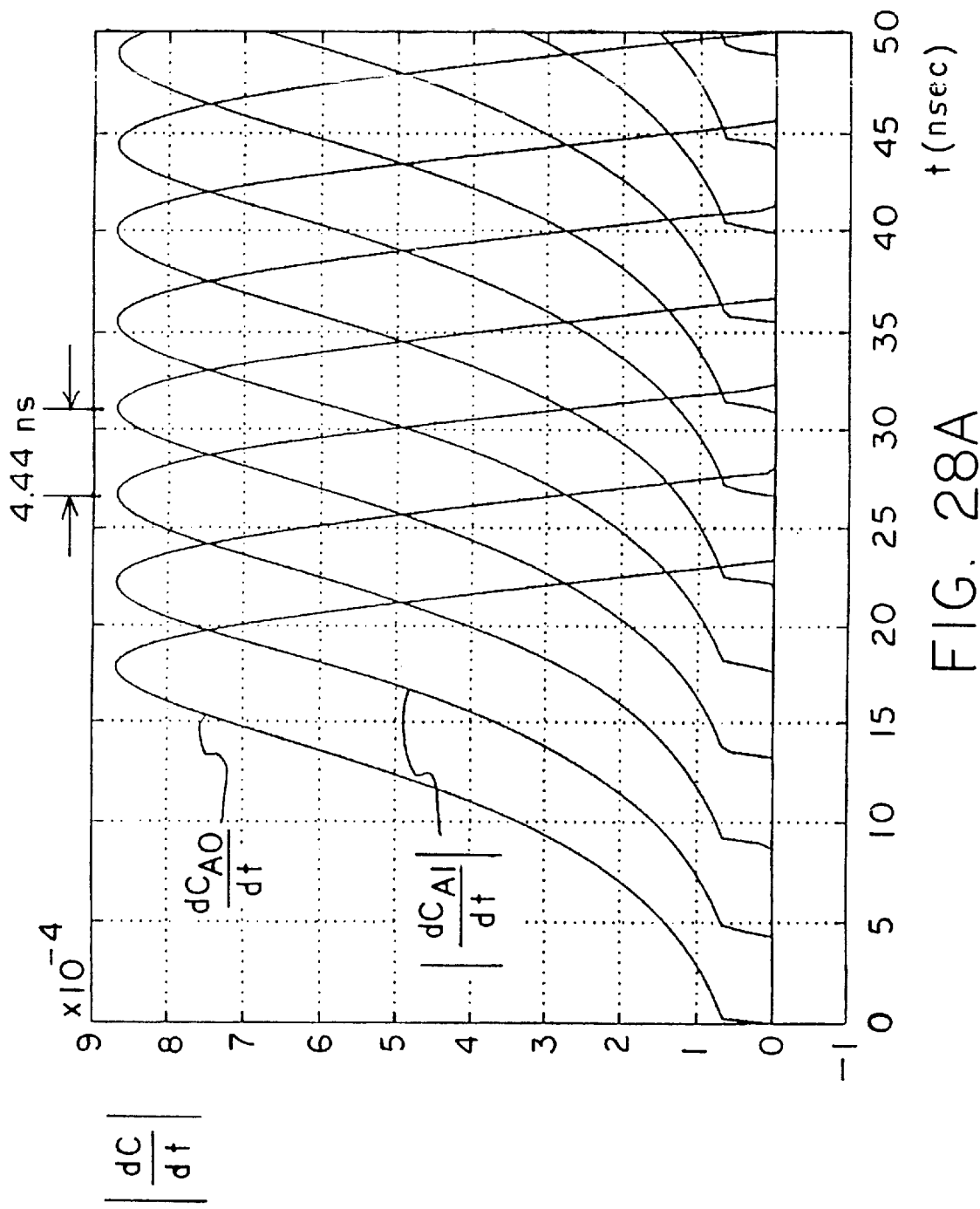
Figure 29:
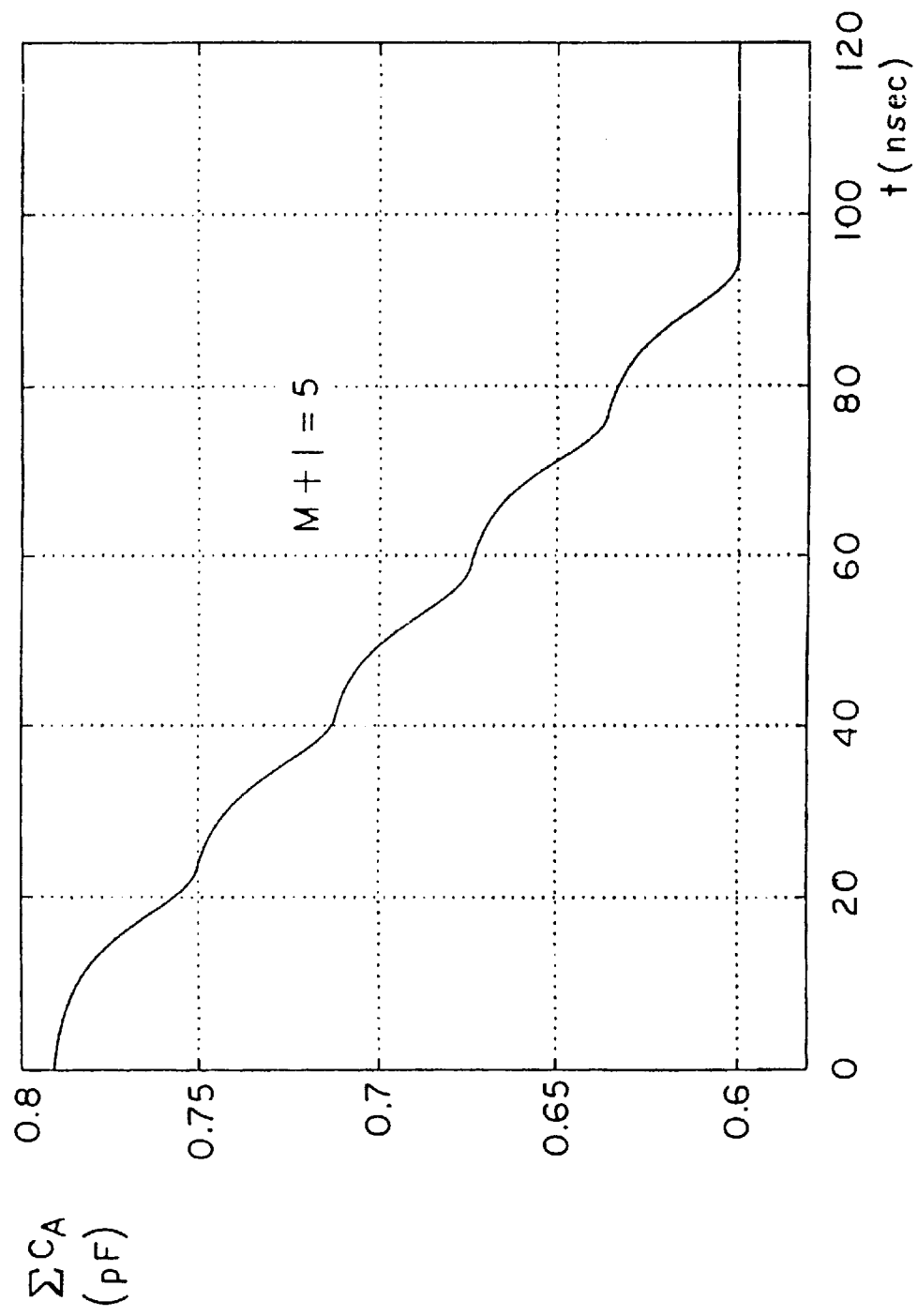
Figure 30:
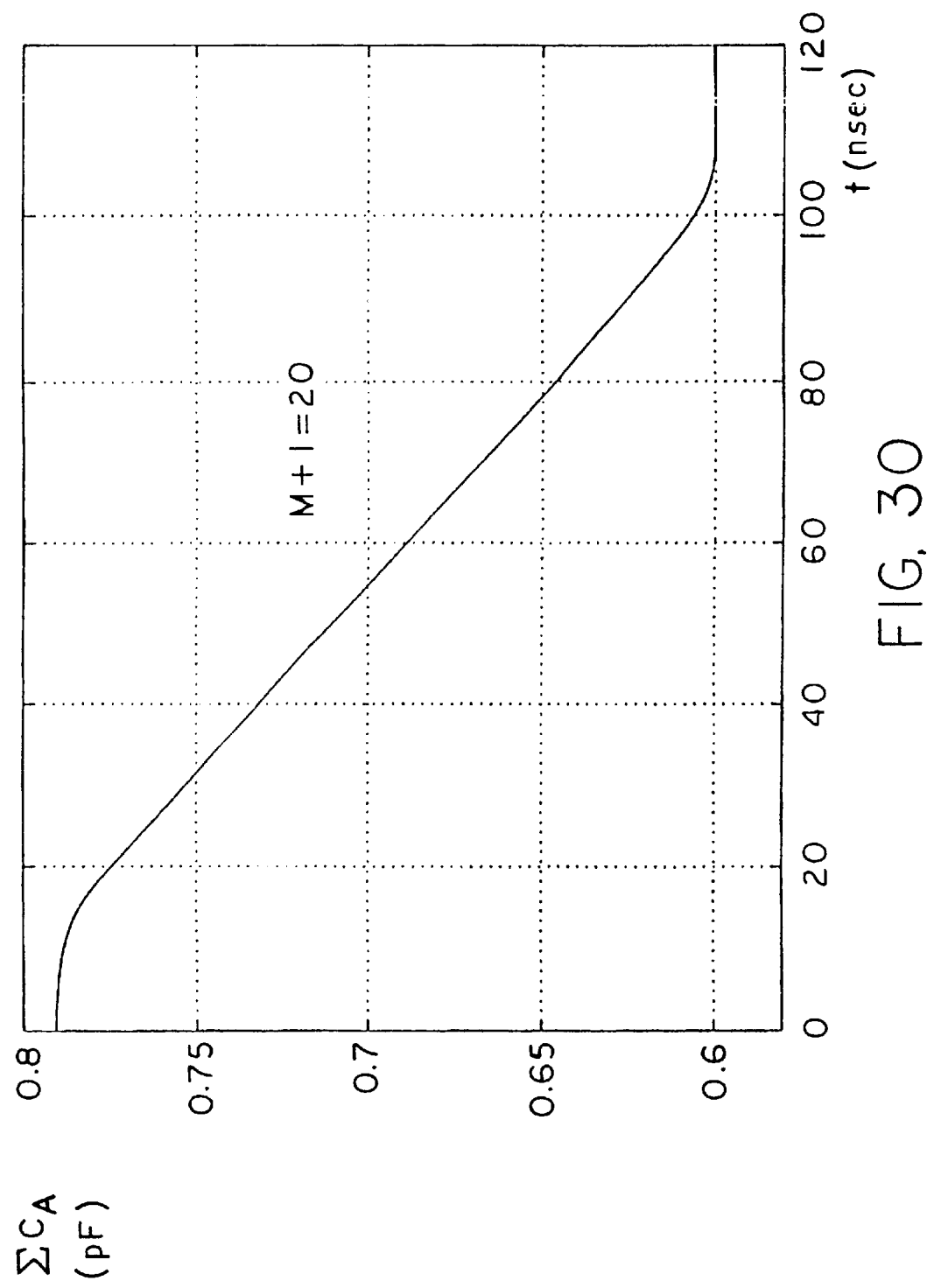
Figure 31:
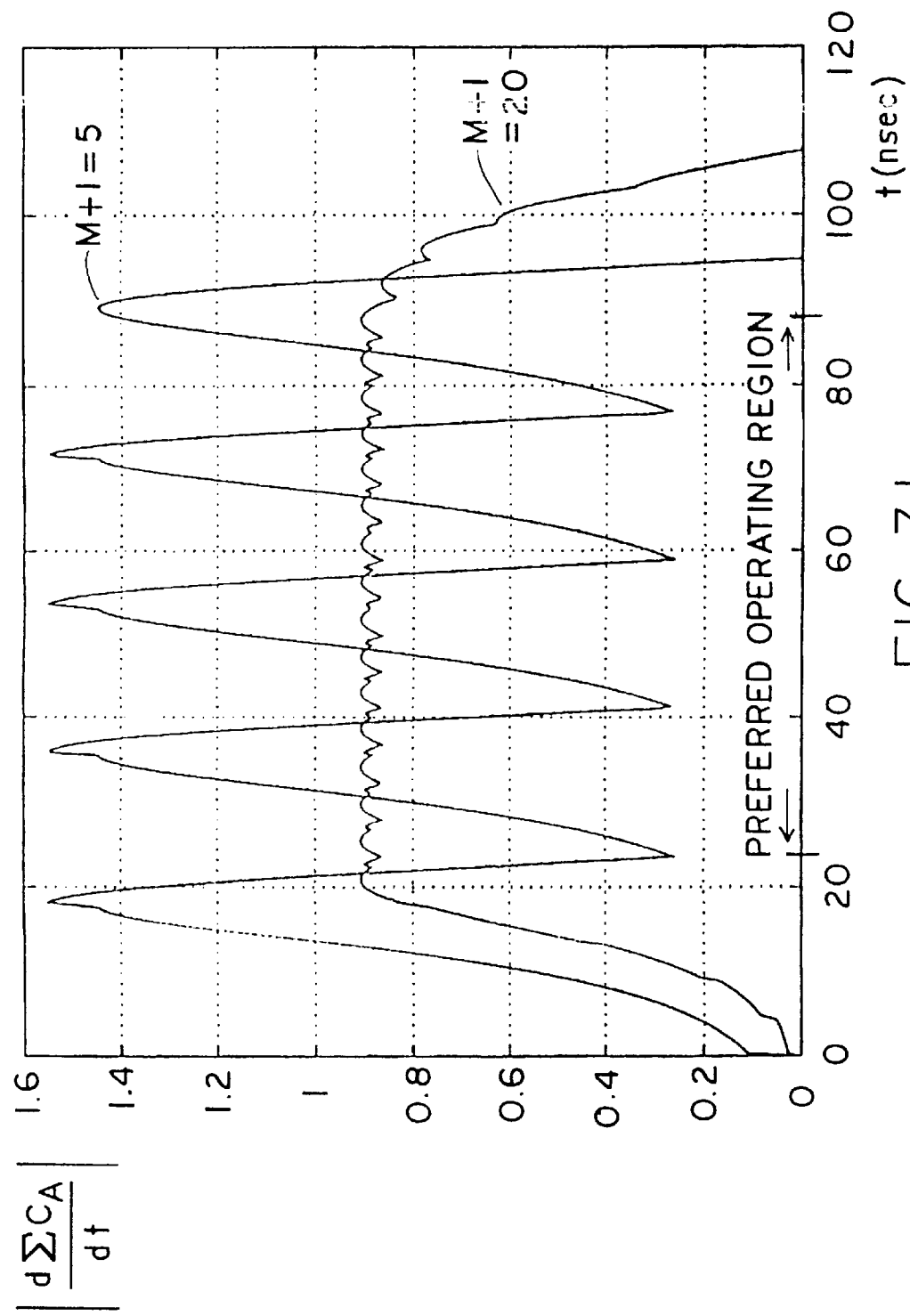

FIG. 26 illustrates the capacitance vs. phase (phase of $f_{OUT}$) curve for a single capacitance circuit, for example $C_{A0}$. FIG. 27 illustrates the nonlinear nature of the curve of FIG. 26 by plotting the time derivative of the capacitance of $C_{A0}$ (i.e. the slope). This is the quantity that directly determines loop performance. FIG. 28 illustrates the individual capacitance vs. phase curves for a plurality of capacitance circuits $C_{A0}$, $C_{A1}$, $C_{A2}$ ... while FIG. 28A illustrates the time derivative of the individual curves of FIG. 28. As can be seen from the figure, each successive capacitance curve is time shifted from its adjacent curve. However, the total capacitance $C_A$ 406 is the summation of the individual capacitances. FIGS. 29 and 30 illustrate the capacitance vs. phase curves resulting from the summation of the individual capacitances. For example, FIG. 29 illustrates the total capacitance $C_A$ for M+1=5. Similar, FIG. 30 illustrates the total capacitance $C_A$ for M+1=20. The substantial improvements in linearity of the total capacitance $C_A$ can be seen more clearly with reference to the time derivative graphs shown in FIG. 31 for each case M+1=20 and M+1=5. By comparing the curve of FIG. 27 with the curves of FIG. 31, it can be seen that the use of multiple individual capacitance circuits $C_{A0}$, $C_{A1}$, $C_{A2}$, ... $C_{AM}$ provides a substantially linear circuit, with linearity improving as more circuits are utilized. In one embodiment 5 or more capacitance circuits may be utilized, more preferrable 10 or more and most preferrable 20 or more. Thus, by utilizing multiple capacitance circuits a more linear relationship between phase and capacitance may be obtained. Moreover because the capacitance range of the analog fine tuning control is relatively limited, e.g. 2% of the total capacitance, the amount of nonlinearities in the $C_A$ to $f_{OUT}$ relationship are not critical. Thus, the circuits described herein provide a relatively linear relationship between the detected phase differences in the PLL and $f_{OUT}$.

As noted above, in one embodiment twenty control voltages 1514 may be utilized to provide the fine analog control for the VCO 400 for wireless communications. Though the analog control has been described herein for illustrative purposes with references to single ended figures, it will be recognized that the fully differential system such as shown in FIG. 10 may be utilized. In such a system the twenty control voltages may be applied to both $C_{AN}$ and $C_{AP}$ each formed from a plurality of capacitance circuits $C_{AN0}$, $C_{AN1}$, ... $C_{AN20}$ and $C_{AP0}$, $C_{AP1}$, ... $C_{AP20}$ respectively. In one wireless embodiment, the component values for the individual capacitors C1 and C2 in each of the capacitance circuits may be for each synthesizer RF1, RF2, and IF:

RF1: C1=0.04 pF and C2=0.12 pF
RF2: C1=0.06 pF and C2=0.18 pF
IF: C1=0.13 pF and C2=0.39 pF.

The resulting ranges for $C_{AN}$ and $C_{AP}$ are thus:
RF1: $C_{AN}=C_{AP}$=0.6 to 0.8 pf
RF2: $C_{AN}=C_{AP}$=0.9 to 1.2 pf
IF: $C_{AN}=C_{AP}$=1.95 to 2.6 pf.

Further, the transistors $T_0$, $T_1$, ... $T_M$ in the capacitance circuits may be sized for both the RF1 and RF2 synthesizers to have W/L dimensions of 13/0.35. Because the frequency range of the IF synthesizer may be large, the IF synthesizer transistors $T_0$, $T_1$, ... $T_M$ may be selectable depending upon the frequency that the IF synthesizer is operating within. For frequencies 75 MHz or less the IF transistors may be sized 1.625/0.35. For other frequency ranges the values may be:

75–150 MHz: 3.25/0.35 (2×)
150–300 MHz: 6.5/0.35 (4×)
300–600 MHz: 13/0.35 (4×).

In the exemplary embodiment, the individual circuit elements of the phase detector/sample hold circuit may have values of R1=500 Ω, R2=500 Ω, R3=1000 Ω, R4=2000 Ω, $C_{RAMP}$=40 pF, and $C_{HOLD}$=20 pF.

The techniques described herein for the fine tuning analog control of the PLL thus provide a system in which the frequency generation may be accomplished through the use of a variation in a VCO capacitance. Furthermore, the techniques shown herein may be integrated into a single integrated circuit since capacitors of excessive size or traditional varactors are not required. Moreover, the transfer function of the PLL is relatively linear over the desired frequency range and relatively large capacitance changes within the VCO may be accomplished without large phase noise. In this manner a linear circuit behavior may be obtained without degrading phase noise performance.

Figure 32:
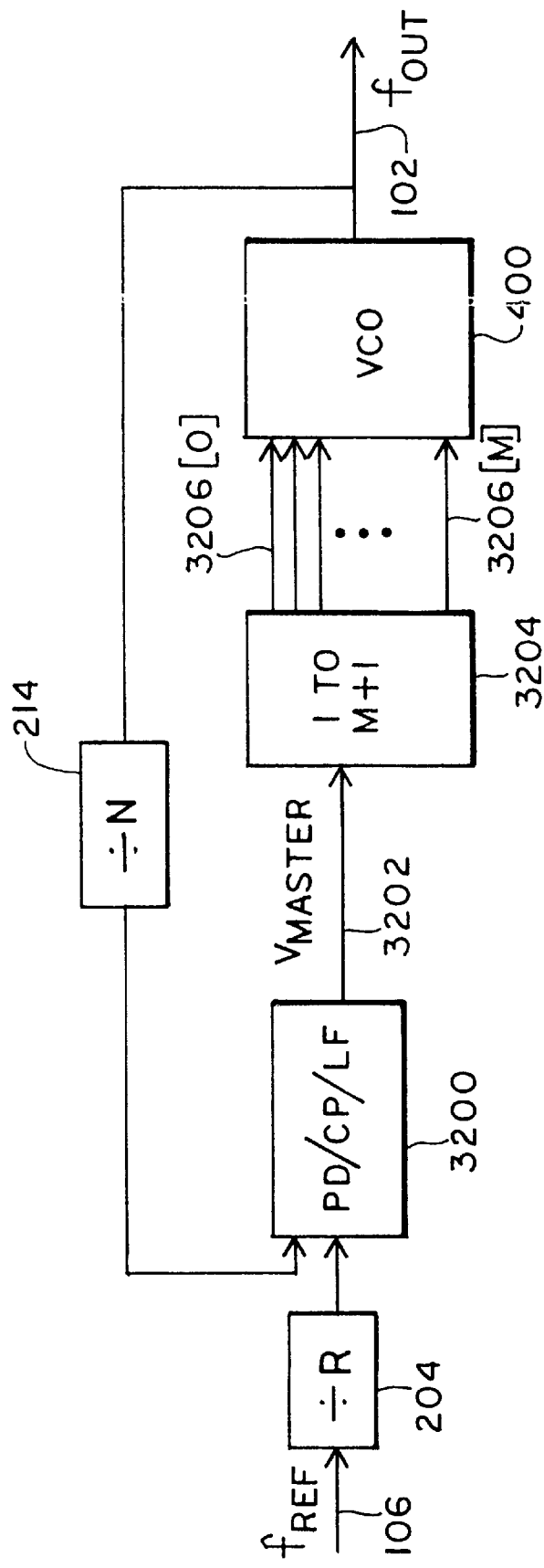
FIG. 32 is a circuit diagram for an alternative method of generating a plurality of VCO control voltages.

The benefits of the techniques disclosed herein may be obtained while utilizing variations of the various circuits shown herein. For example, the use of multiple capacitive elements in the VCO under control of a plurality of control voltages may be accomplished with more traditional PLL designs. Thus, for example a circuit such as shown in FIG. 32 may be utilized. As shown in FIG. 32, phase detector/charge pump/loop filter circuitry 3200 may be utilized to generate a voltage $V_{MASTER}$ indicative of the phase difference. The $V_{MASTER}$ voltage may then be converted to a plurality of voltage signals 3206[0], 3206[1] ... 3206[M] by a 1 to M+1 converter 3204. Each voltage signal 3206 may include an incremental additional voltage so that 3206[0]=$V_{MASTER}$, 3206[1]=$V_{MASTER}$+Δv, 3206[0]=$V_{MASTER}$+Δ2v ... In this manner, multiple voltage control signals may be provided to control a VCO having variable capacitive circuits similar to that shown in FIG. 22.

Though shown herein with respect to a voltage controlled oscillator, it will be recognized that the concepts of the present invention may be utilized with other controlled oscillators. Thus, for example, the present invention may be utilized with a current controlled oscillator. Further, various circuits and techniques shown herein may be utilized separately or in combination without requiring the use of all circuits and techniques shown herein. Thus, aspects or the digital control may be utilized independent of aspects of the analog control and vice-versa. Further, some concepts shown herein may be utilized in applications different from the wireless communications embodiments discussed.

In addition, further modifications and alternative embodiments of this invention will be apparent to those skilled in the art in view of this description. For example, the use of n-channel and p-channel devices and associated logic levels are shown as example arrangements of device types, and it will be recognized that the present invention is not limited by these example arrangements. Accordingly, this description is to be construed as illustrative only and is for the purpose of teaching those skilled in the art the manner of carrying out the invention. It is to be understood that the forms of the invention herein shown and described are to be taken as the presently preferred embodiments. Various changes may be made in the shape, size and arrangement of parts. For example, equivalent elements may be substituted for those illustrated and described herein, and certain features of the invention may be utilized independently of the use of other features, all as would be apparent to one skilled in the art after having the benefit of this description of the invention.

I claim:

1. A wireless communication frequency synthesizer for generating multiple band high-frequency signals, comprising:

a phase locked loop (PLL) having an output frequency dependent upon a voltage controlled oscillator (VCO);

a VCO within the PLL, the VCO having an output frequency dependent upon LC tank resonant structure and being selectably operable at a plurality of different frequencies within a plurality different frequency bands;

inductance circuitry coupled to the VCO as part of the LC tank resonant structure, the inductance circuitry configured to provide a selectable inductance amount that determines the frequency band of operation;

capacitance circuitry integrated within the VCO as part of the LC tank resonant structure, the capacitance circuitry configured to provide a controllable capacitance amount that determines the frequency of operation within the selected frequency band, the capacitance circuitry comprising:

a plurality of discretely variable capacitor circuits that together provide at least part of the capacitance amount, each discretely variable capacitor circuit having at least one control node configured to receive a digital control signal that determines whether an individual capacitance amount associated with the discretely variable capacitor circuit is contributed to the capacitance amount;

a plurality of different digital signals coupled to the VCO to provide the digital control signals to the discretely variable capacitor circuits;

a plurality of continuously variable capacitor circuits that together provide at least part of the capacitance amount, each continuously variable capacitor circuit having at least one control node configured to receive an analog control signal that determines at least in part an amount of capacitance contributed by that continuously variable capacitor circuit to the capacitance amount; and a plurality of different analog signals coupled to the VCO to provide the analog control signals to the plurality of continuously variable capacitor circuits, the different analog signals being adjusted based upon a phase difference between a first signal that is related to the output frequency and a second signal that is related to a reference frequency.

2. A method of operating a wireless communication frequency synthesizer, comprising:

providing a phase locked loop (PLL) having an output frequency dependent upon a voltage controlled oscillator (VCO);

providing a VCO having an output frequency dependent upon an LC tank resonant structure and being selectably operable at a plurality of different frequencies within a plurality different frequency bands;

selecting an inductance amount for inductance circuitry coupled to the VCO as part of the LC tank resonant structure, the inductance amount determining the frequency band of operation;

controlling a capacitance amount within capacitance circuitry integrated within the VCO as part of the LC tank resonant structure, the capacitance amount determining the frequency of operation within the selected frequency band, the controlling step comprising:

adjusting a plurality of different digital signals coupled to the VCO to provide digital control signals to a plurality of discretely variable capacitor circuits, the discretely variable capacitor circuits together providing at least part of the capacitance amount, and each discretely variable capacitor circuit having at least one control node configured to receive at least one of the digital control signals to determine whether an individual capacitance amount associated with the discretely variable capacitor circuit is contributed to the capacitance amount; and adjusting a plurality of different analog signals coupled to the VCO to provide analog control signals to a plurality of continuously variable capacitor circuits based upon a phase difference between a first signal that is related to the output frequency and a second signal that is related to a reference frequency, the continuously variable capacitor circuits together providing at least part of the capacitance amount, and each continuously variable capacitor circuit having at least one control node configured to receive at least one analog control signal to determine at least in part an amount of capacitance contributed by that continuously variable capacitor circuit to the capacitance amount.

3. The wireless communication frequency synthesizer of claim 1, wherein the inductance circuitry comprises a plurality of selectable inductors.

4. The wireless communication frequency synthesizer of claim 3, wherein the plurality of selectable inductors comprises an inductance circuit and a switch coupled to selectively include or exclude the inductance circuit as part of the LC tank resonant structure.

5. The wireless communication frequency synthesizer of claim 3, wherein the plurality of selectable inductors comprises a first and a second inductance circuits and a switch coupled to selectively choose to include or exclude the second inductance circuit within an overall inductance for the LC tank resonant structure.

6. The wireless communication frequency synthesizer of claim 1, wherein the plurality of different digital signals are configured to provide coarse adjustment of the output frequency and wherein the plurality of different analog signals are configured to provide fine adjustment of the output frequency.

7. The wireless communication frequency synthesizer of claim 6, wherein the capacitance circuitry comprises differential capacitance circuitry, the plurality of different digital and analog signals being coupled to control capacitor circuits on both positive and negative sides of the differential circuitry.

8. The wireless communication frequency synthesizer of claim 1, wherein each discretely variable capacitor circuit comprises a capacitor connected in series with a switch, the switch having a control node coupled to receive one of the different digital control signals.

9. The wireless communication frequency synthesizer of claim 1, wherein each continuously variable capacitor circuit comprises a first capacitor coupled in series with a second capacitor and a switch coupled in parallel with the second capacitor, the switch having a control node coupled to receive one of the different analog control signals.

10. The wireless communication frequency synthesizer of claim 9, wherein the number of continuously variable capacitor circuits and the number of different analog control signals comprises at least 5.

11. The wireless communication frequency synthesizer of claim 9, wherein the number of continuously variable capacitor circuits and the number of different analog control signals comprises at least 20.

12. The method of claim 2, wherein the inductance circuitry comprises a plurality of selectable inductors.

13. The method of claim 12, wherein the plurality of selectable inductors comprises an inductance circuit and a switch coupled to selectively include or exclude the inductance circuit as part of the LC tank resonant structure.

14. The method claim 12, wherein the plurality of selectable inductors comprises a first and a second inductance circuits and a switch coupled to selectively include or exclude the second inductance circuit within an overall inductance for the LC tank resonant structure.

15. The method claim 2, wherein the plurality of different digital signals are adjusted to provide coarse adjustment of the output frequency and wherein the plurality of different analog signals are adjusted to provide fine adjustment of the output frequency.

16. The method claim 15, wherein the capacitance circuitry comprises differential capacitance circuitry, the plurality of different digital and analog signals being coupled to control capacitor circuits on both positive and negative sides of the differential circuitry.

17. The method of claim 2, wherein each discretely variable capacitor circuit comprises a capacitor connected in series with a switch, the switch having a control node coupled to receive one of the different digital control signals.

18. The method of claim 2, wherein each continuously variable capacitor circuit comprises a first capacitor coupled in series with a second capacitor and a switch coupled in parallel with the second capacitor, the switch having a control node coupled to receive one of the different analog control signals.

19. The method of claim 18, wherein the number of continuously variable capacitor circuits and the number of different analog control signals comprises at least 5.

20. The method of claim 18, wherein the number of continuously variable capacitor circuits and the number of different analog control signals comprises at least 20.

* * * * *

UNITED STATES PATENT AND TRADEMARK OFFICE
CERTIFICATE OF CORRECTION

PATENT NO. : 6,483,390 B2
DATED : November 19, 2002
INVENTOR(S) : David R. Welland It is certified that error appears in the above-identified patent and that said Letters Patent is hereby corrected as shown below:

Column 31,
Line 21, please change "upon LC tank" to -- upon an LC tank --.
Line 23, please change "a plurality different" to -- a plurality of different --.

Column 32,
Line 2, please change "a plurality different:" to -- a plurality of different --.

Signed and Sealed this

Twenty-fifth Day of February, 2003

JAMES E. ROGAN
*Director of the United States Patent and Trademark Office*